(12) United States Patent
Sakakibara et al.

(10) Patent No.: US 10,916,556 B1
(45) Date of Patent: Feb. 9, 2021

(54) THREE-DIMENSIONAL MEMORY DEVICE USING A BURIED SOURCE LINE WITH A THIN SEMICONDUCTOR OXIDE TUNNELING LAYER

(71) Applicant: SANDISK TECHNOLOGIES LLC, Addison, TX (US)

(72) Inventors: Kiyohiko Sakakibara, Yokkaichi (JP); Takumi Moriyama, Yokkaichi (JP); Yu-Hsien Hsu, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 128 days.

(21) Appl. No.: 16/199,885

(22) Filed: Nov. 26, 2018

Related U.S. Application Data

(60) Provisional application No. 62/597,466, filed on Dec. 12, 2017.

(51) Int. Cl.
| | |
|---|---|
| *H01L 27/1157* | (2017.01) |
| *H01L 27/11582* | (2017.01) |
| *H01L 27/11556* | (2017.01) |
| *H01L 29/22* | (2006.01) |

(Continued)

(52) U.S. Cl.
CPC .... *H01L 27/1157* (2013.01); *H01L 27/11556* (2013.01); *H01L 27/11582* (2013.01); *H01L 29/22* (2013.01); *H01L 29/4234* (2013.01); *H01L 29/42328* (2013.01); *H01L 29/66825* (2013.01); *H01L 29/66833* (2013.01)

(58) Field of Classification Search
CPC .............................. H01L 21/31; H01L 27/115
See application file for complete search history.

(56) References Cited

U.S. PATENT DOCUMENTS

| | | | |
|---|---|---|---|
| 5,899,735 A | * | 5/1999 | Tseng ................ H01L 27/10873 257/E21.165 |
| 5,915,167 A | | 6/1999 | Leedy |
| 9,799,670 B2 | | 10/2017 | Nishikawa et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Sheng-Bai Zhu
(74) *Attorney, Agent, or Firm* — The Marbury Law Group, PLLC

(57) ABSTRACT

A three-dimensional memory device includes a source-level material layer stack located over a substrate that includes, from bottom to top, a lower source-level semiconductor layer, a semiconductor oxide tunneling layer, a source contact layer including a doped semiconductor material, and an upper source-level semiconductor layer, an alternating stack of electrically conductive layers and insulating layers located over the source-level material layer stack, and memory stack structures that extend through the alternating stack and into an upper portion of the lower source-level semiconductor layer, in which each memory stack structure includes a vertical semiconductor channel and a memory film laterally surrounding the vertical semiconductor channel, and each of the vertical semiconductor channels vertically extends through, and is electrically connected to, the source contact layer.

10 Claims, 42 Drawing Sheets

(51) Int. Cl.
*H01L 29/423* (2006.01)
*H01L 29/66* (2006.01)

(56) References Cited

U.S. PATENT DOCUMENTS

| | | | |
|---|---|---|---|
| 9,824,966 B1 | 11/2017 | Kanakamedala et al. | |
| 9,831,266 B2 | 11/2017 | Kai et al. | |
| 9,917,100 B2 | 3/2018 | Zhang et al. | |
| 9,985,098 B2 | 5/2018 | Matsumoto et al. | |
| 10,008,570 B2 | 6/2018 | Yu et al. | |
| 10,020,363 B2 | 7/2018 | Ogawa et al. | |
| 2015/0380418 A1* | 12/2015 | Zhang | H01L 27/11529 257/326 |
| 2016/0093524 A1* | 3/2016 | Izumi | H01L 21/7688 438/637 |
| 2016/0126248 A1* | 5/2016 | Rabkin | H01L 27/1157 257/321 |
| 2017/0148800 A1 | 5/2017 | Nishikawa et al. | |
| 2017/0148810 A1 | 5/2017 | Kai et al. | |
| 2017/0148811 A1 | 5/2017 | Zhang et al. | |
| 2017/0162594 A1* | 6/2017 | Ahn | H01L 27/11582 |
| 2017/0207226 A1* | 7/2017 | Lee | H01L 27/11582 |
| 2018/0122904 A1 | 5/2018 | Matsumoto et al. | |
| 2018/0122905 A1 | 5/2018 | Ogawa et al. | |
| 2018/0122906 A1 | 5/2018 | Yu et al. | |

OTHER PUBLICATIONS

H. Sayama et al., "Low Voltage Operation of Sub-Quarter Micron W-Polycide Dual Gate CMOS with Non-Uniformly Doped Channel," IEDM Proceedings, 1996, pp. 583-586.
U.S. Appl. No. 15/626,444, filed Jun. 19, 2017, SanDisk Technologies LLC.
U.S. Appl. No. 15/633,131, filed Jun. 26, 2017, SanDisk Technologies LLC.
U.S. Appl. No. 15/997,194, filed Jun. 4, 2018, SanDisk Technologies LLC.
U.S. Appl. No. 16/023,035, filed Jun. 29, 2018, SanDisk Technologies LLC.
U.S. Appl. No. 16/146,156, filed Sep. 28, 2018, SanDisk Technologies LLC.

* cited by examiner

THREE-DIMENSIONAL MEMORY DEVICE USING A BURIED SOURCE LINE WITH A THIN SEMICONDUCTOR OXIDE TUNNELING LAYER

RELATED APPLICATIONS

The present application claims the benefit of priority of U.S. Provisional Application Ser. No. 62/597,466 filed on Dec. 12, 2017, the entire contents of which are incorporated herein by reference.

FIELD

The present disclosure relates generally to the field of semiconductor devices and specifically to a three-dimensional memory structure using direct source contact and a thin semiconductor oxide tunneling layer as an etch stop layer and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a source-level material layer stack located over a substrate and comprising, from bottom to top, a lower source-level semiconductor layer, a semiconductor oxide tunneling layer, a source contact layer comprising a doped semiconductor material, and an upper source-level semiconductor layer; an alternating stack of electrically conductive layers and insulating layers located over the source-level material layer stack; and memory stack structures that extend through the alternating stack and into an upper portion of the lower source-level semiconductor layer, wherein: each memory stack structure includes a vertical semiconductor channel and a memory film laterally surrounding the vertical semiconductor channel; and each of the vertical semiconductor channels vertically extends through, and is electrically connected to, the source contact layer.

According to another aspect of the present disclosure, a method of forming a three-dimensional memory device is provided, which comprises: forming an in-process source-level material layer stack comprising, from bottom to top, a lower source-level semiconductor layer, a source-level sacrificial layer, and an upper source-level semiconductor layer over a substrate; forming an alternating stack of insulating layers and spacer material layers over the semiconductor layer stack, wherein the spacer material layers are formed as, or are subsequently replaced with, electrically conductive layers; forming an array of memory stack structures through the alternating stack and into an upper portion of the lower source-level semiconductor layer, wherein each memory stack structure includes a respective vertical semiconductor channel and a respective memory film laterally surrounding the respective vertical semiconductor channel; forming a source cavity by removing the source-level sacrificial layer; physically exposing outer sidewalls of the vertical semiconductor channels by removing portions of the memory films at a level of the source cavity; and forming a source contact layer in the source cavity by performing at least two semiconductor material deposition processes and at least one semiconductor material etch back process that employs a semiconductor oxide tunneling layer as an etch stop layer, wherein the semiconductor oxide tunneling layer is formed on a top surface of the lower source-level semiconductor layer during formation of the in-process source-level material layer stack or after physically exposing the outer sidewalls of the vertical semiconductor channels.

DETAILED DESCRIPTION

Figure 1:
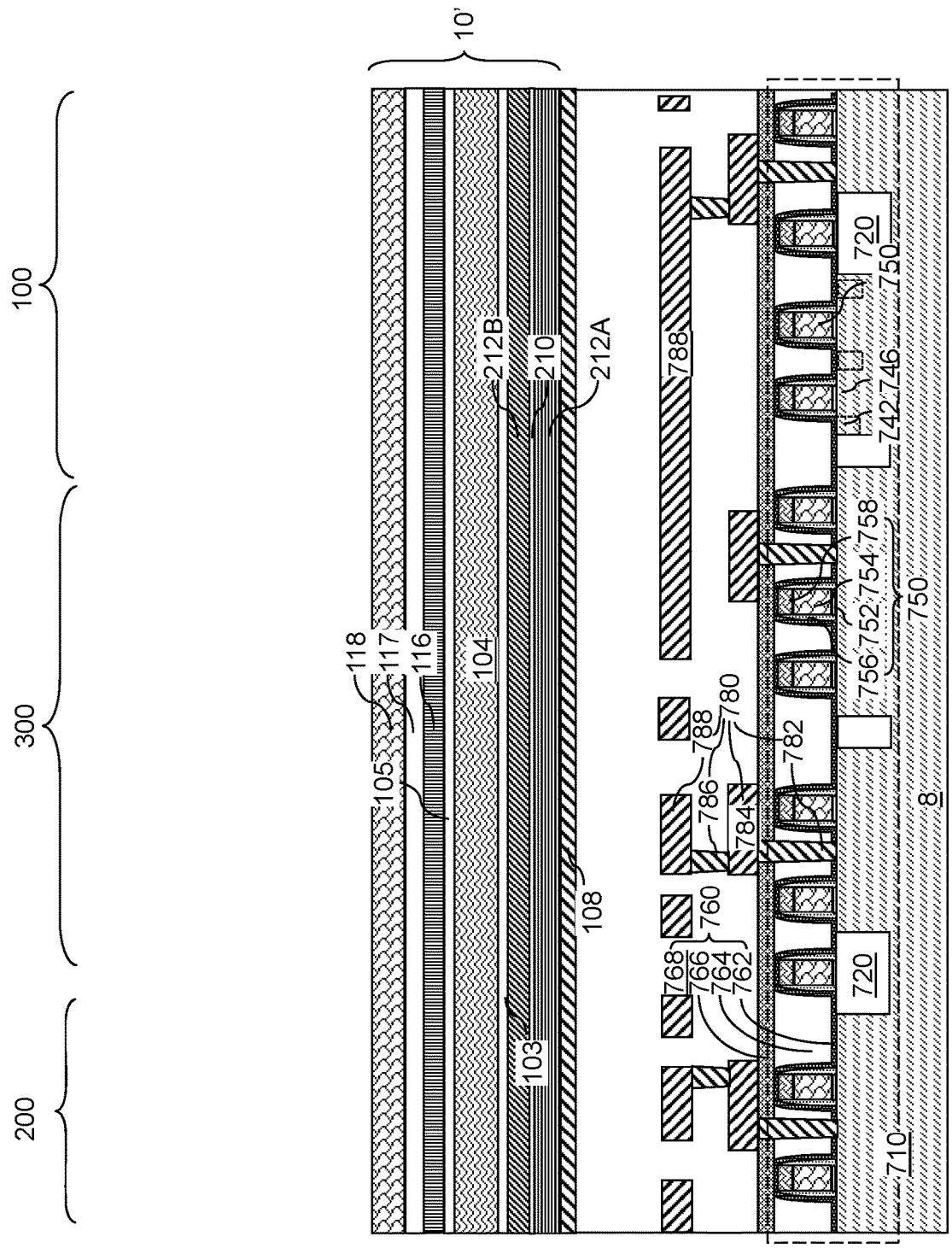
FIG. 1 is a vertical cross-sectional view of a first exemplary structure after formation of semiconductor devices, lower level dielectric layers, lower metal interconnect structures, and in-process source-level material layer stack on a semiconductor substrate according to a first embodiment of the present disclosure.

As discussed above, the present disclosure is directed to a three-dimensional memory structure using direct source contact and a thin semiconductor oxide tunneling layer as an etch stop layer and methods of manufacturing the same, the various aspects of which are described herein in detail.

The embodiments of the disclosure can be used to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated using the various embodiments described herein.

Referring to FIG. 1, a first exemplary structure according to a first embodiment of the present disclosure is illustrated. The first exemplary structure includes a semiconductor substrate 8 and a complementary metal oxide semiconductor (CMOS) circuitry 710 formed thereupon. The first exemplary structure includes a memory array region 100 in which a three-dimensional memory array is to be subsequently formed, a staircase region 300 in which stepped surfaces of electrically conductive layers and contact via structures are to be subsequently formed, and a peripheral region 200 in which peripheral contact via structures are to be subsequently formed.

The semiconductor substrate 8 includes a substrate semiconductor layer 9 at least at an upper portion thereof. Various doped wells can be formed in upper portions of the substrate semiconductor layer 9. Shallow trench isolation structures 720 can be formed in an upper portion of the substrate semiconductor layer 9 to provide electrical isolation among the semiconductor devices. The CMOS circuitry 710 includes field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758.

The CMOS circuitry 710 can include additional semiconductor devices in addition to p-type field effect transistors and n-type field effect transistors, which can be used to support operation of a memory structure to be subsequently formed. The CMOS circuitry 710 includes a driver circuitry, which is also referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are embedded within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be embedded within the first dielectric material layers 764. The first dielectric material layers 764 may be a plurality of dielectric material layers in which various elements of the lower-level metal interconnect structures 780 are sequentially embedded. Each of the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 can be formed within a topmost dielectric material layer of the first dielectric material layers 764 (which can be a plurality of dielectric material layers). The landing-pad-level metal line structures 788 can be used as landing pads for metal via structures to be subsequently formed thereabove. Each of the lower-level metal interconnect structures 780 can include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 can be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each of the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

The CMOS circuitry 710 can include peripheral devices for the memory-level assembly to be subsequently formed. The lower-level metal interconnect structures 780 are embedded in the lower-level dielectric layers 760. The combination of the lower-level dielectric layers 760 and the lower-level metal interconnect structures 780 overlie the CMOS circuitry 710.

The lower-level metal interconnect structures 780 can be electrically connected to active nodes (e.g., transistor active regions 742 or gate electrodes 754) of the CMOS circuitry 710 (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed. In one embodiment, the pattern of the lower-level metal interconnect structures 780 can be selected such that the landing-pad-level metal line structures 788 (which are a subset of the lower-level metal interconnect structures 780 located at the topmost portion of the lower-level metal interconnect structures 780) can provide landing pad structures for the through-memory-level contact via structures to be subsequently formed.

A conductive plate layer 108 and in-process source-level material layer stack 10' are formed over the at least one second dielectric layer. The conductive plate layer 6 can include a metallic compound material such as a conductive metallic nitride (e.g., TiN), a metal alloy (e.g., tungsten silicide) and/or a metal (e.g., W). The conductive plate layer 6 provides a high conductivity conduction path for electrical current that flows into, or out of, the in-process source-level material layer stack 10'. The conductive plate layer 108 may include, for example, a tungsten or tungsten silicide layer having a thickness in a range from 3 nm to 100 nm, although lesser and greater thicknesses can also be used. The conductive plate layer 6 may function as a component of a source layer in the completed device. In addition, the conductive plate layer 6 may function as an etch stop layer. The thickness of the conductive plate layer 108 may be in a range from 5 nm to 100 nm, although lesser and greater thicknesses can also be used.

The in-process source-level material layer stack 10' can include components layers that are subsequently modified to form source-level material layer stack. The in-process source-level material layer stack 10' subsequently modified to provide a source-level material layer stack that includes a source contact layer. The source contact layer functions as a common source region for vertical field effect transistors of a three-dimensional memory device to be subsequently formed. In one embodiment, the in-process source-level material layer 10' can include, from bottom to top, a first lower source-level semiconductor layer 212A, a semiconductor oxide tunneling layer 210, a second lower source-level semiconductor layer 212B, a lower sacrificial liner 103, a source-level sacrificial layer 104, an upper sacrificial liner 105, an upper source-level semiconductor layer 116, a source-level insulating layer 117, and an optional source-select-level conductive layer 118.

The first lower source-level semiconductor layer 212A, the second lower source-level semiconductor layer 212B, and the upper source-level semiconductor layer 116 can include a respective doped semiconductor material such as doped polysilicon or doped amorphous silicon. The conductivity type of the first lower source-level semiconductor layer 212A, the second lower source-level semiconductor layer 212B, and the upper source-level semiconductor layer 116 can be the opposite of the conductivity of vertical semiconductor channels to be subsequently formed. For example, if the vertical semiconductor channels to be subsequently formed have a doping of a first conductivity type, the first lower source-level semiconductor layer 212A, the second lower source-level semiconductor layer 212B, and the upper source-level semiconductor layer 116 have a doping of a second conductivity type that is the opposite of the first conductivity type. For example, if the first conductivity type is p-type, the second conductivity type is n-type, and vice versa. The thickness of each of the first lower source-level semiconductor layer 212A, the second lower source-level semiconductor layer 212B, and the upper source-level semiconductor layer 116 can be in a range from 10 nm to 300 nm, such as from 20 nm to 150 nm, although lesser and greater thicknesses can also be used.

The first lower source-level semiconductor layer 212A is a semiconductor material layer that can be formed directly on the top surface of the conductive plate layer 108. In case the conductive plate layer 108 is omitted, the first lower source-level semiconductor layer 212A can be formed directly on a top surface of the at least one second dielectric material layer 768. The first lower source-level semiconductor layer 212A can include amorphous silicon, polysilicon, an alloy of at least two Group 14 elements (such as silicon, germanium, carbon, etc.), or a compound semiconductor material. The first lower source-level semiconductor layer 212A can be formed by chemical vapor deposition.

The semiconductor oxide tunneling layer 210 is formed on a top surface of the first lower source-level semiconductor layer 212A during formation of the in-process source-level material layer stack 10' as a component layer of the in-process source-level material layer stack 10'. In one embodiment, the semiconductor oxide tunneling layer 210 can be formed by oxidation of a surface portion of the first lower source-level semiconductor layer 212A. Thermal oxidation or plasma oxidation can be used. The semiconductor oxide tunneling layer 210 can have a thickness that allows charge carrier tunneling (e.g., electron tunneling) therethrough so that the first lower source-level semiconductor layer 212A and the second lower source-level semiconductor layer 212B are electrically connected and remain at a same electric potential during operation of the semiconductor device. In one embodiment, the semiconductor oxide tunneling layer 210 can be a thermal silicon oxide layer including dopants of the second conductivity type and free of carbon. The semiconductor oxide tunneling layer 210 can have a thickness in a range from 0.5 nm to 3 nm, such as from 0.7 nm to 1.5 nm.

The second lower source-level semiconductor layer 212A is a semiconductor material layer that is formed directly on the top surface of the semiconductor oxide tunneling layer 210. The second lower source-level semiconductor layer 212B can include amorphous silicon, polysilicon, an alloy of at least two Group 14 elements (such as silicon, germanium, carbon, etc.), or a compound semiconductor material. The second lower source-level semiconductor layer 212A can be formed by chemical vapor deposition.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be used.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be used.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be used. The optional source-select-level conductive layer 118 can include a conductive material that can be used as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be used.

The in-process source-level material layer stack 10' includes a source-level sacrificial layer 104. The source-level sacrificial layer 104 is formed above, and is vertically spaced from, the top surface of the conductive plate layer 108. Further, the in-process source-level material layer stack 10' comprises a first lower source-level semiconductor layer 212A, a semiconductor oxide tunneling layer 210, and a second lower source-level semiconductor layer 212B that underlie the source-level sacrificial layer 104. The in-process lower source-level semiconductor layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The conductive plate layer 108 and the lower in-process source-level material layer stack 10' can be patterned, for example, by application and patterning of a photoresist layer over the in-process source-level material layer stack 10' and by an anisotropic etch process that etches unmasked portions of the conductive plate layer 108 and the lower in-process source-level material layer stack 10'. Remaining portions of the conductive plate layer 108 and the lower in-process source-level material layer stack 10' can be present in the memory array region 100, the staircase region 300, and optionally within areas of the peripheral region 200. A dielectric material can be deposited between patterned portions of the conductive plate layer 108 and the lower in-process source-level material layer stack 10', and can be incorporated into the at least one second dielectric layer 768.

Figure 2:
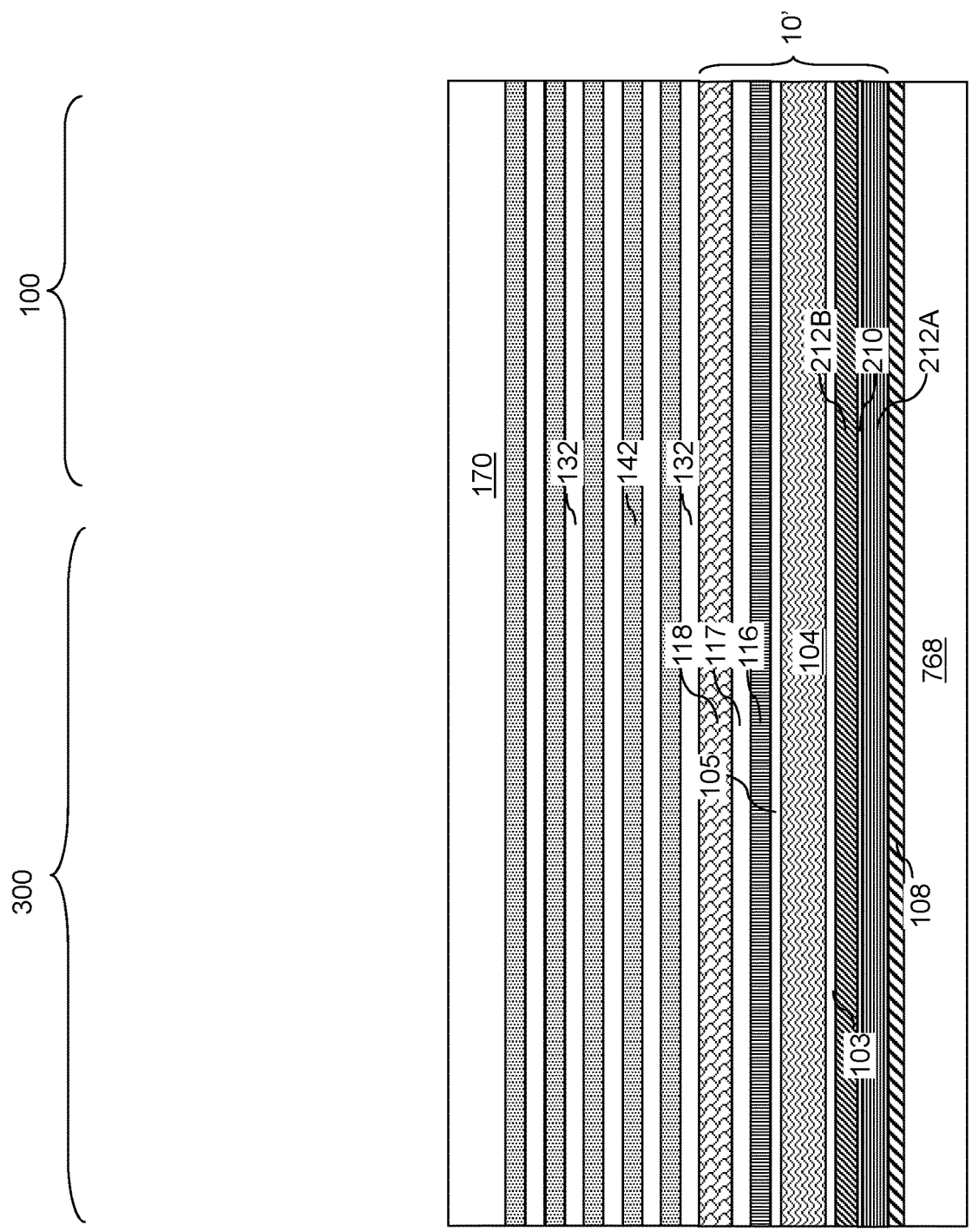
FIG. 2 is a vertical cross-sectional view of the first exemplary structure after formation of a first-tier alternating stack of first insulating layers and first spacer material layers according to the first embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While various embodiments are described in the present disclosure using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the in-process source-level material layer stack. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is used for the first insulating layers 132, tetraethylorthosilicate (TEOS) can be used as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be used for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be used. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be used for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be used.

Figure 3:
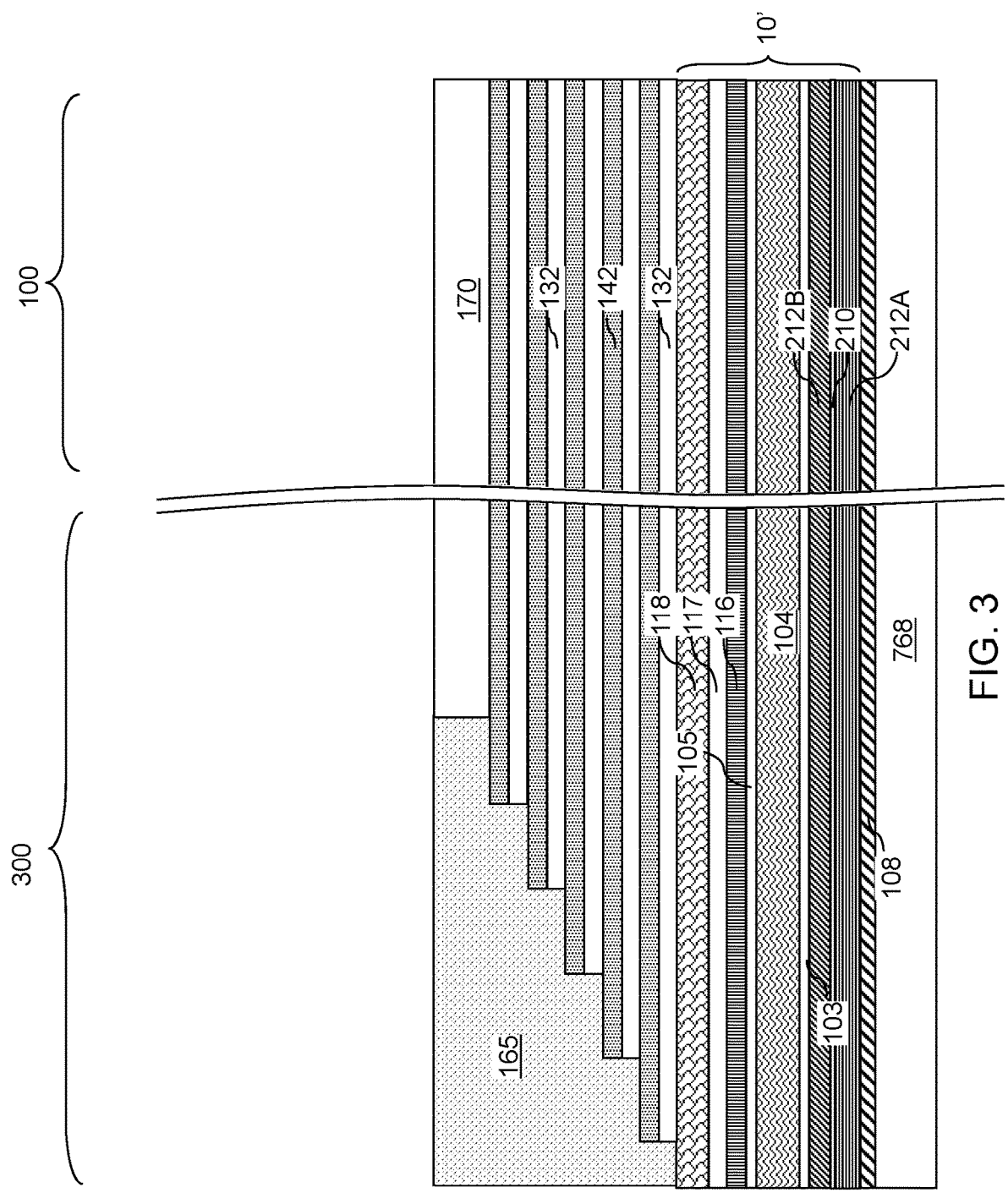
FIG. 3 is a vertical cross-sectional view of the first exemplary structure after formation of first stepped surfaces and a first retro-stepped dielectric material portion according to the first embodiment of the present disclosure.

Referring to FIG. 3, the first insulating cap layer 170 and the first-tier alternating stack (132, 142) can be patterned to form first stepped surfaces in the staircase region 300. The staircase region 300 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitutes a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

Figure 4A:
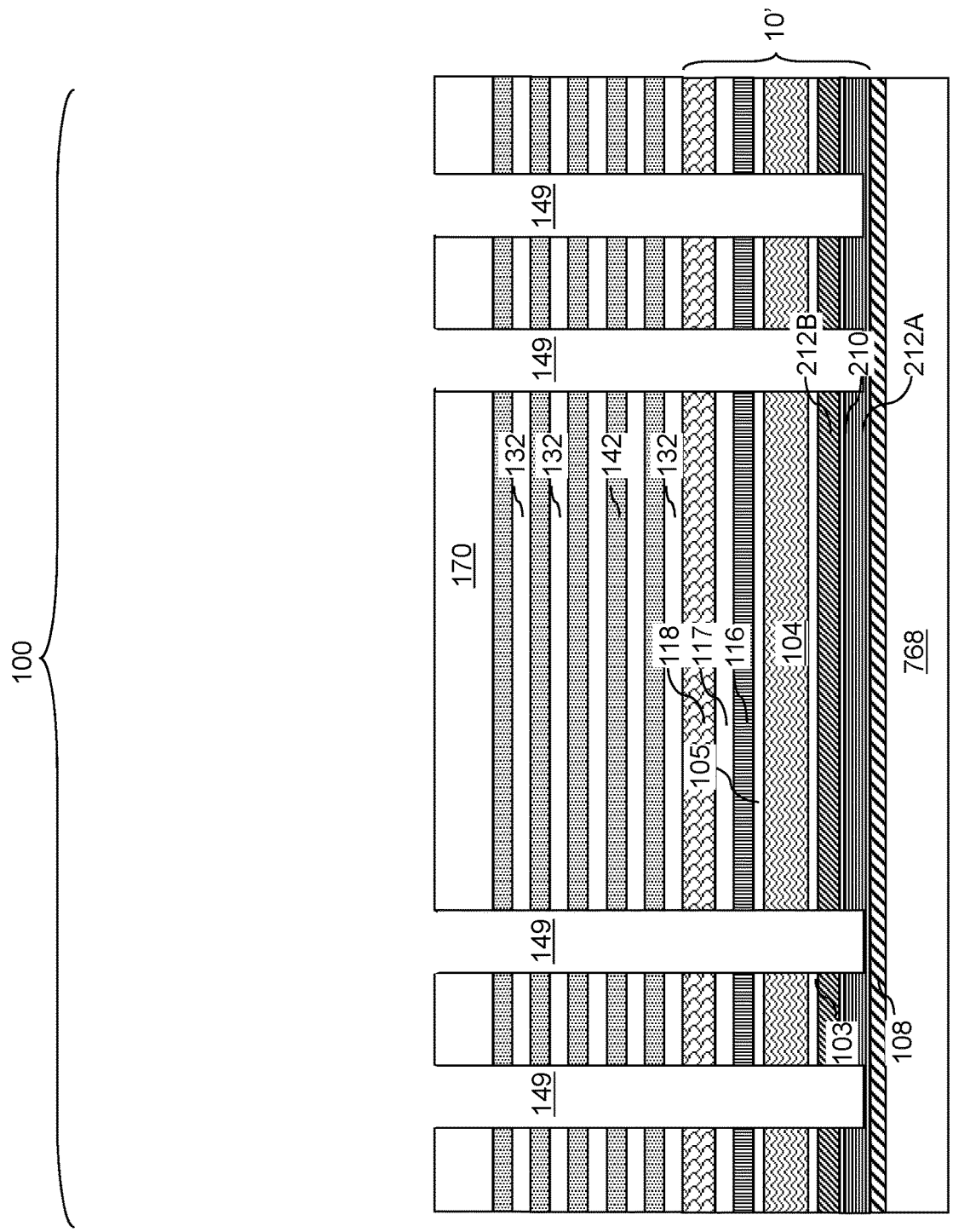
FIG. 4A is a vertical cross-sectional view of a memory array region of the first exemplary structure after formation of first memory openings first support openings according to the first embodiment of the present disclosure.
Figure 4B:
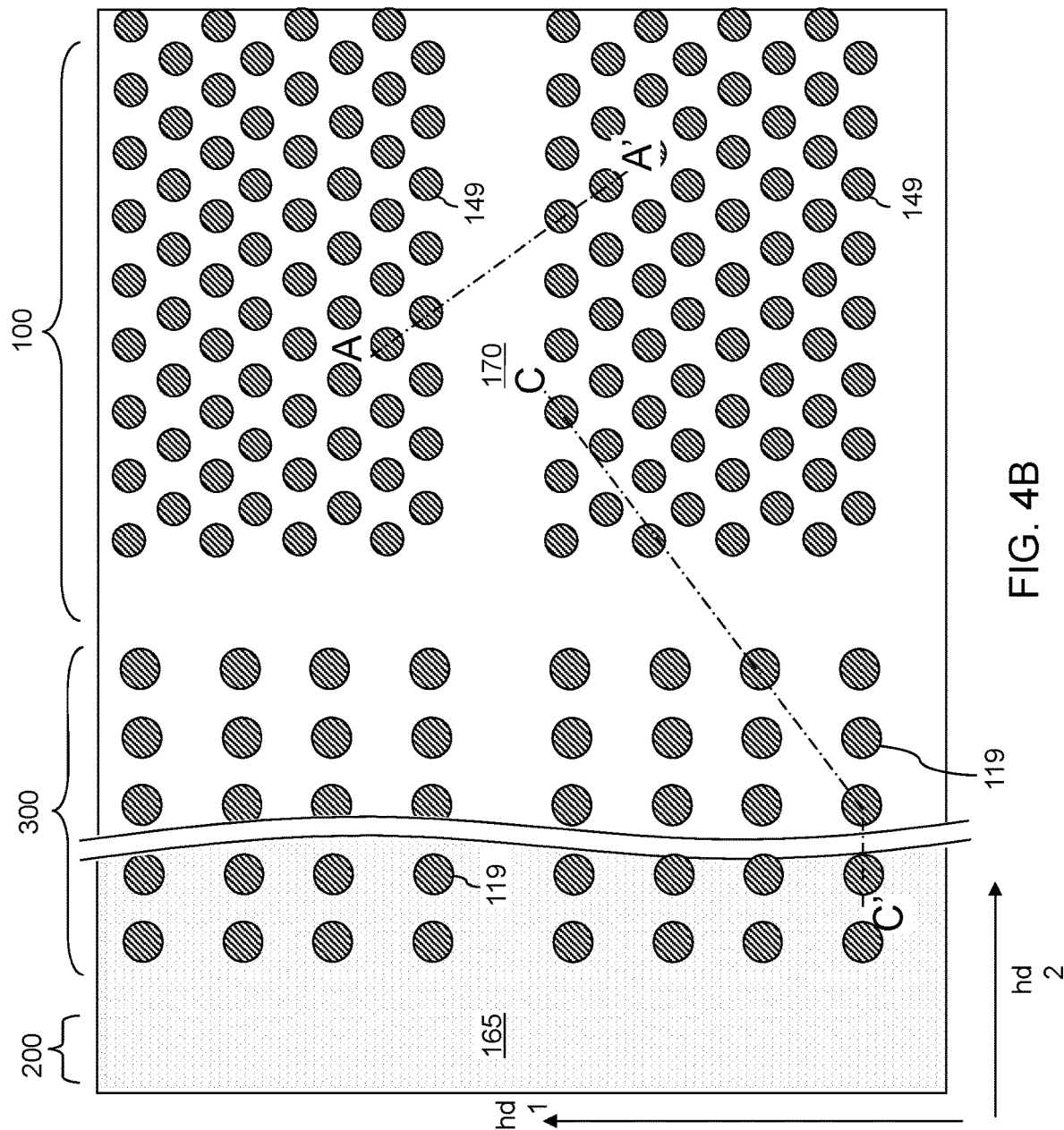
FIG. 4B is a top-down view of the first exemplary structure of FIG. 4A. The plane A-A' is the plane of the vertical cross-section of FIG. 4A.
Figure 4C:
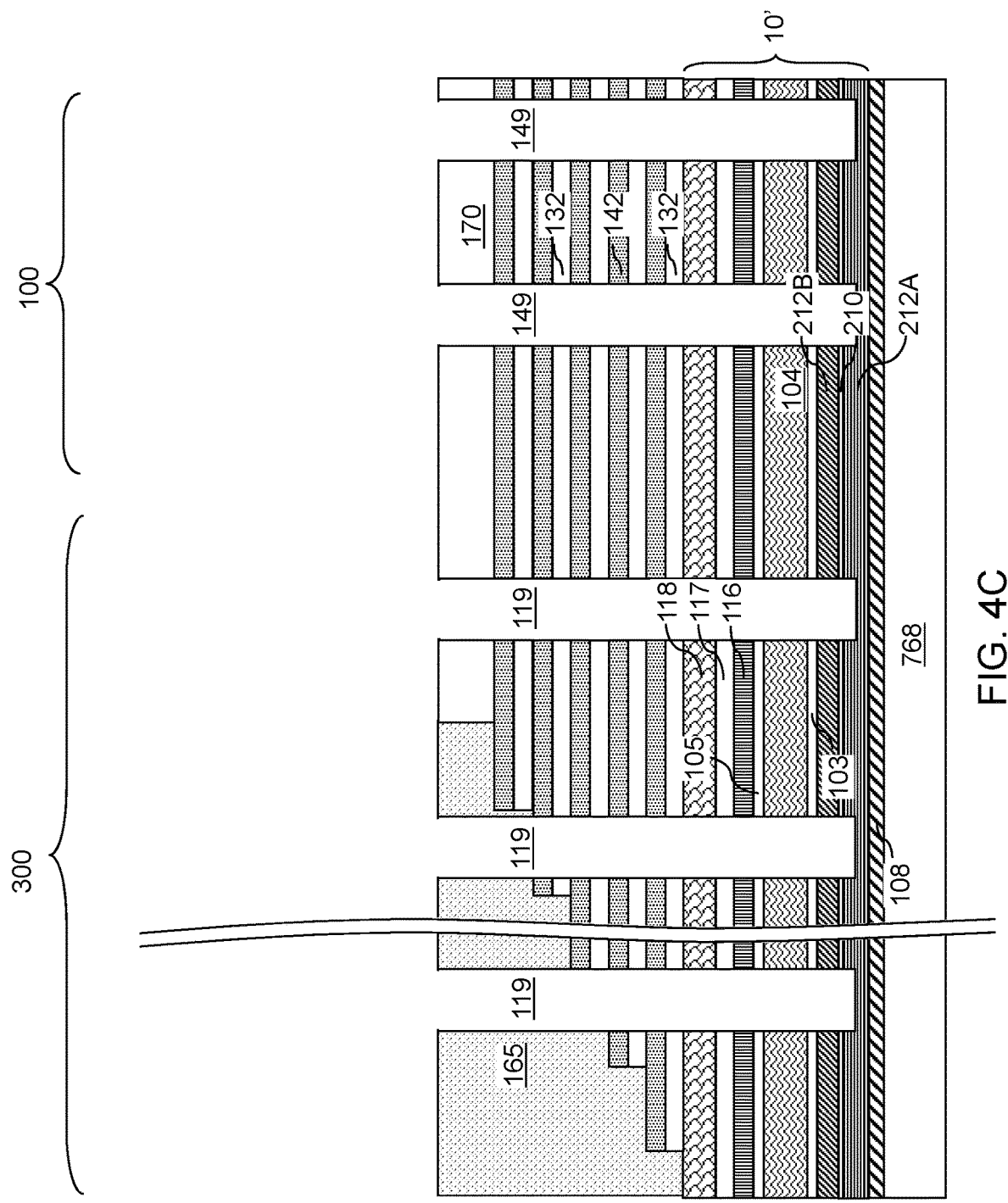
FIG. 4C is another vertical cross-sectional view of the first exemplary structure along the vertical plane C-C' of FIG. 4B.

Referring to FIGS. 4A-4C, first-tier openings (149, 119) can be formed through the first-tier structure (132, 142, 170, 165) and partly through the in-process source-level material layer stack 10'. For example, a photoresist layer (not shown) can be applied over the first-tier structure (132, 142, 170, 165), and can be lithographically patterned to form various openings therethrough. The pattern of openings in the photoresist layer can be transferred through the first-tier structure (132, 142, 170, 165) and partly through the in-process source-level material layer stack 10' by a first anisotropic etch process to form the first-tier openings (149, 119) concurrently, i.e., during the first anisotropic etch process.

The first-tier openings (149, 119) can include first-tier memory openings 149 and first-tier support openings 119. The first-tier memory openings 149 are openings that are formed in the memory array region 100 through each layer within the first alternating stack (132, 142) and are subsequently used to form memory stack structures therein. The bottom surfaces of the first-tier openings (149, 119) can be a recessed surface of the source-level sacrificial layer 104. Thus, each first-tier opening (149, 119) can have a bottom surface between a horizontal plane including the bottom surface of the source-level sacrificial layer 104 and a horizontal plane including the top surface of the source-level sacrificial layer 104.

The first-tier support openings 119 are openings that are formed in the staircase region 300 and are subsequently used to form support structures that are subsequently used to provide structural support to the second exemplary structure during replacement of sacrificial material layers with electrically conductive layers. In case the first spacer materials are formed as first electrically conductive layers, the first-tier support openings 119 can be omitted. A subset of the first-tier support openings 119 can be formed through horizontal surfaces of the first stepped surfaces of the first alternating stack (132, 142).

In one embodiment, the first-tier memory openings 149 can be formed as clusters that are laterally spaced one from another along the second horizontal direction hd2. Each cluster of first-tier memory openings 149 can include a respective two-dimensional array of first-tier memory openings 149 having a first pitch along one horizontal direction and a second pitch along another horizontal direction. In one embodiment, the direction of the first memory structure pitch can be the first horizontal direction (e.g., word line direction) hd1 and the direction of the second memory structure pitch can be the second horizontal direction (e.g., bit line direction) hd2, or vice versa.

Figure 5A:
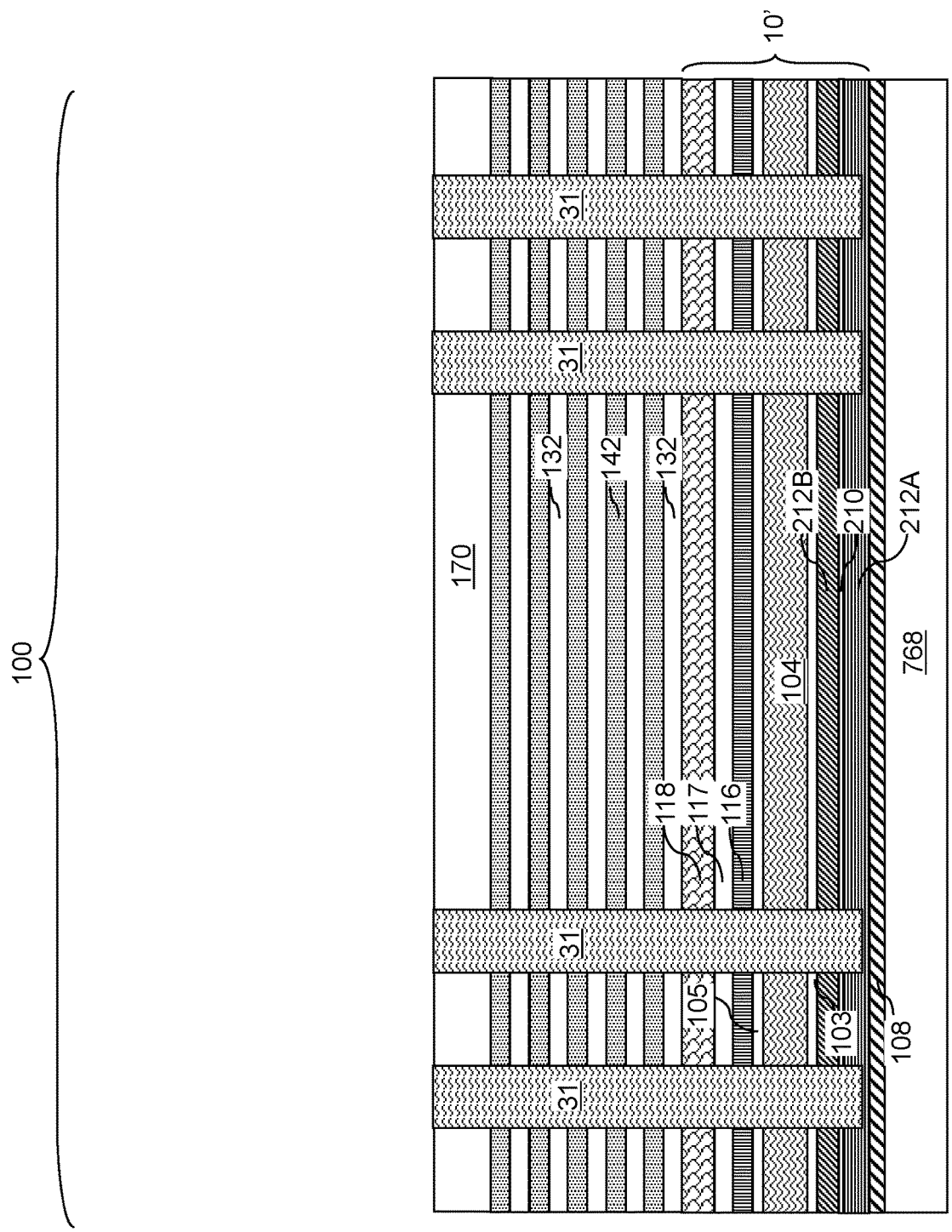
FIG. 5A is a vertical cross-sectional view of a memory array region of the first exemplary structure after sacrificial memory opening fill structures according to the first embodiment of the present disclosure.
Figure 5B:
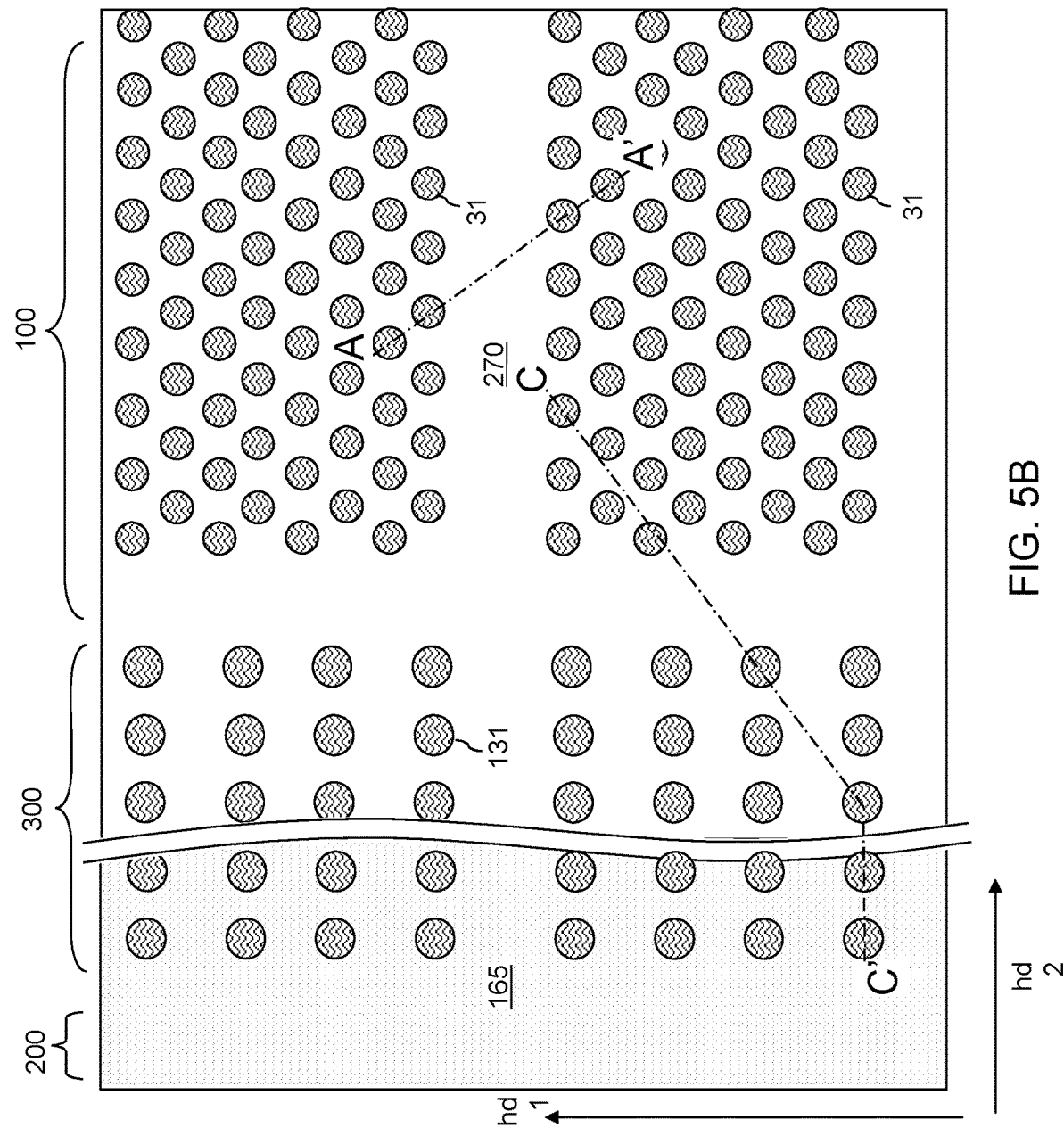
FIG. 5B is a top-down view of the first exemplary structure of FIG. 5A. The plane A A' is the plane of the vertical cross-section of FIG. 5A.
Figure 5C:
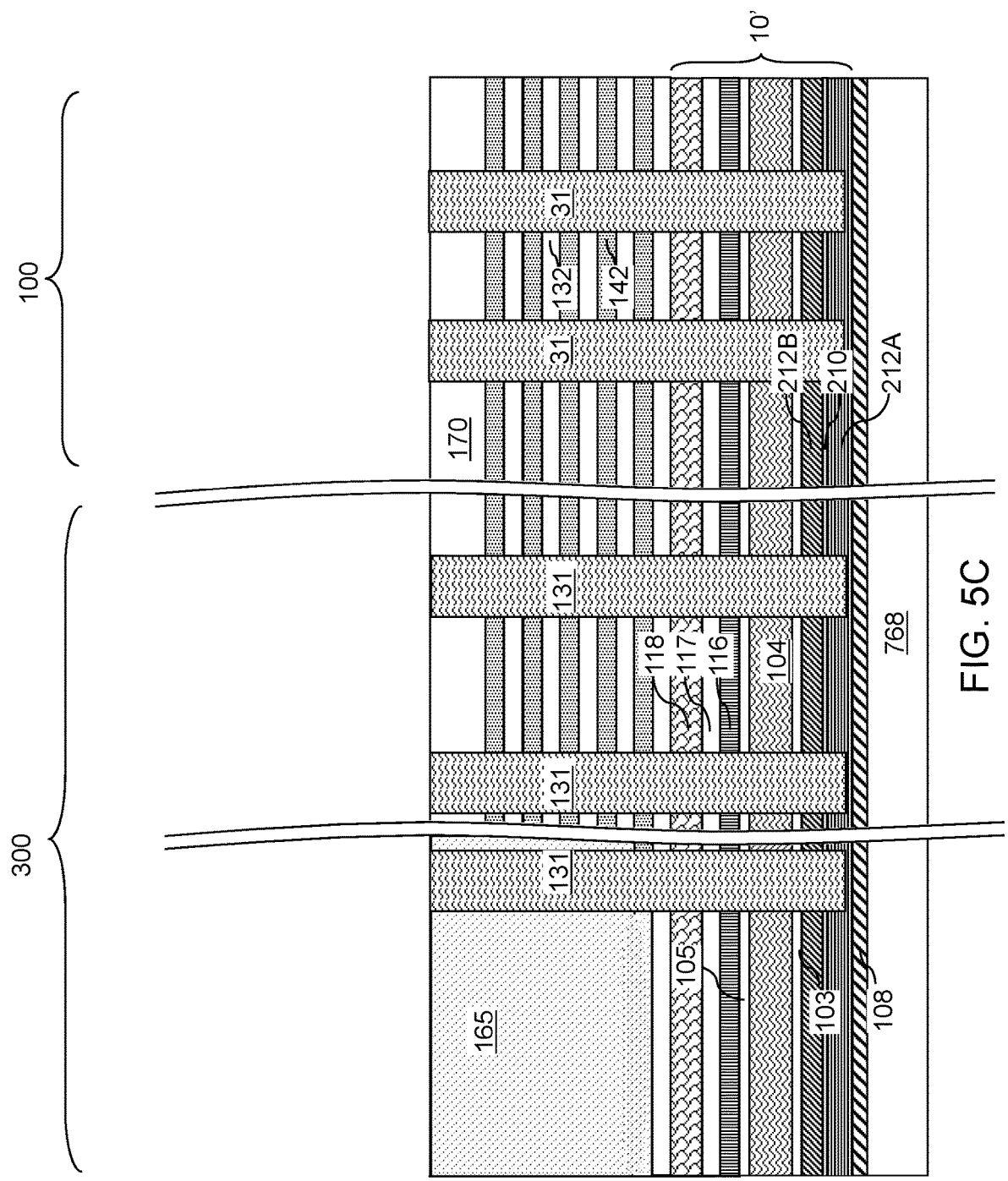
FIG. 5C is another vertical cross-sectional view of the first exemplary structure along the vertical plane C-C' of FIG. 5B.

Referring to FIGS. 5A-5C, sacrificial first-tier opening fill portions (31, 131) can be formed in the first-tier openings (149, 119). For example, a sacrificial fill material is deposited concurrently deposited in each of the first-tier openings (149, 119). The sacrificial fill material includes a material that can be subsequently removed selective to the materials of the first insulating layers 132 and the first sacrificial material layers 142.

In one embodiment, the sacrificial fill material can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be used prior to depositing the sacrificial first-tier fill material. The sacrificial fill material may be formed by a non-conformal deposition or a conformal deposition method.

In another embodiment, the sacrificial fill material can include a silicon oxide material having a higher etch rate than the materials of the first insulating layers 132, and the first insulating cap layer 170. For example, the sacrificial fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop layer (such as a silicon nitride layer having a thickness in a range from 1 nm to 3 nm) may be used prior to depositing the sacrificial first-tier fill material. The sacrificial fill material may be formed by a non-conformal deposition or a conformal deposition method.

In yet another embodiment, the sacrificial fill material can include a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial fill material can be removed from above the first-tier structure (132, 142, 170, 165). For example, the sacrificial fill material can be recessed to a top surface of the first-tier structure (132, 142, 170, 165) using a planarization process. The planarization process can include a recess etch, chemical mechanical planarization (CMP), or a combination thereof. The top surface of the first-tier structure (132, 142, 170, 165) can be used as an etch stop surface or a planarization stop surface.

Remaining portions of the sacrificial fill material comprise sacrificial first-tier opening fill portions (31, 131). Specifically, each remaining portion of the sacrificial material in a first-tier memory opening 149 constitutes a sacrificial first-tier memory opening fill portion 31. Each remaining portion of the sacrificial material in a first-tier support opening 119 constitutes a sacrificial first-tier support opening fill portion 131. The top surfaces of the sacrificial first-tier opening fill portions (31, 131) can be coplanar with the top surfaces of the first insulating cap layer 170 and the first retro-stepped dielectric material portion 165. Each of the sacrificial first-tier opening fill portions (31, 131) may, or may not, include cavities therein.

Figure 7:
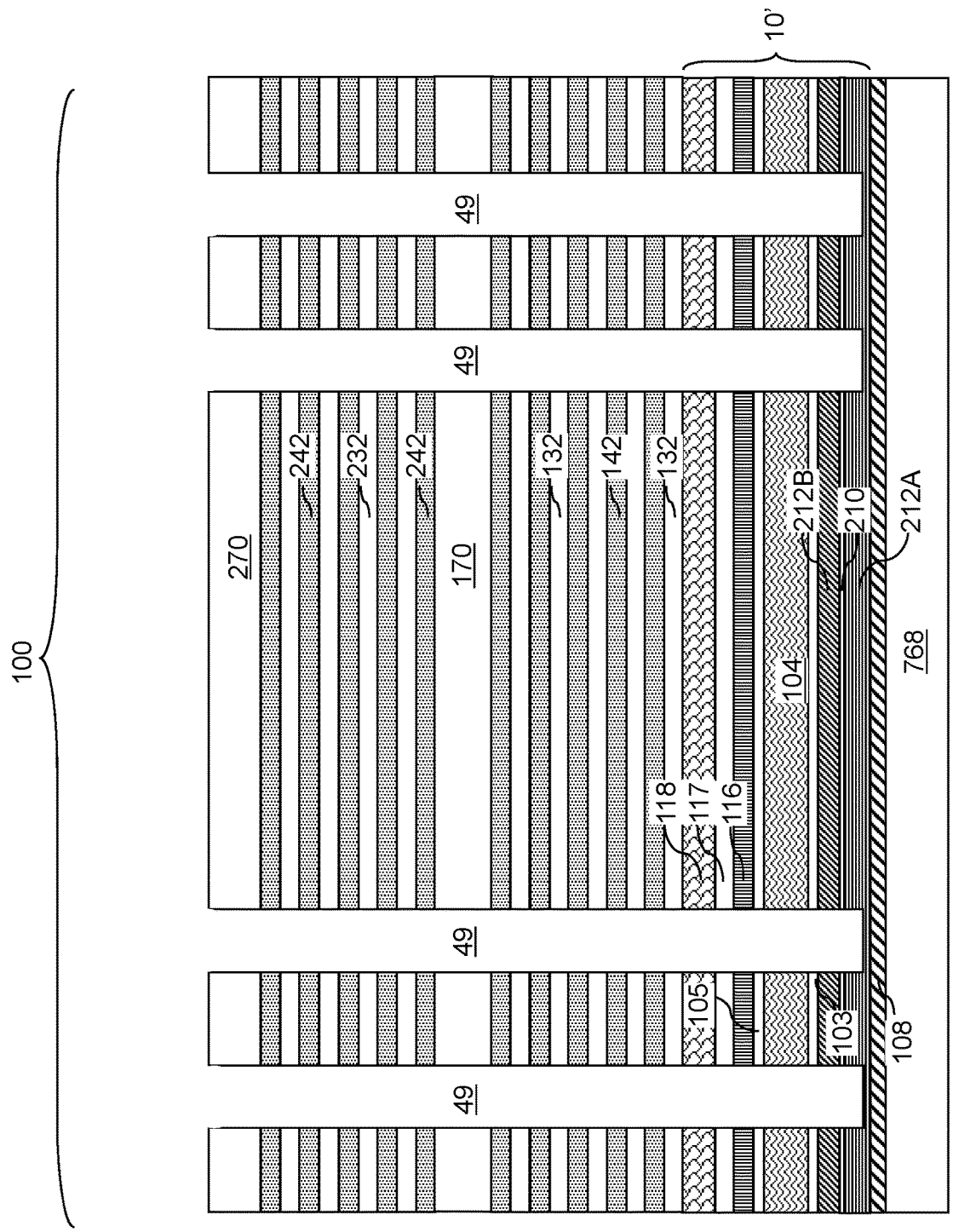
FIG. 7 is a vertical cross-sectional view of a memory array region of the first exemplary structure after formation of inter-tier memory openings according to the first embodiment of the present disclosure.

Referring to FIG. 7, a second-tier structure can be formed over the first-tier structure (132, 142, 170, 165, 31, 131). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be used for the second insulating layers 232 can be any material that can be used for the first insulating layers 132. The fourth material of the second sacrificial material layers 242 is a sacrificial material that can be removed selective to the third material of the second insulating layers 232.

4Sacrificial materials that can be used for the second sacrificial material layers 242 can be any material that can be used for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be used for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be used. In one embodiment, each second sacrificial material layer 242 in the second stack (232, 242) can have a uniform thickness that is substantially invariant within each respective second sacrificial material layer 242.

Second stepped surfaces can be formed in the second stepped area of the staircase region 300 using a same set of processing steps as the processing steps used to form the first stepped surfaces in the first stepped area with suitable adjustment to the pattern of at least one masking layer. A second retro-stepped dielectric material portion 265 can be formed over the second stepped surfaces in the staircase region 300.

A second insulating cap layer 270 can be subsequently formed over the second alternating stack (232, 242) and the second retro-stepped dielectric material portion 265. The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Optionally, drain-select-level isolation structures 72 can be formed through the second insulating cap layer 270 and through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1.

Generally speaking, at least one alternating stack of insulating layers (132, 232) and spacer material layers (such as sacrificial material layers (142, 242)) can be formed over the in-process source-level material layer stack 10', and at least one retro-stepped dielectric material portion (165, 265) can be formed over the staircase regions on the at least one alternating stack (132, 142, 232, 242).

Figure 6A:
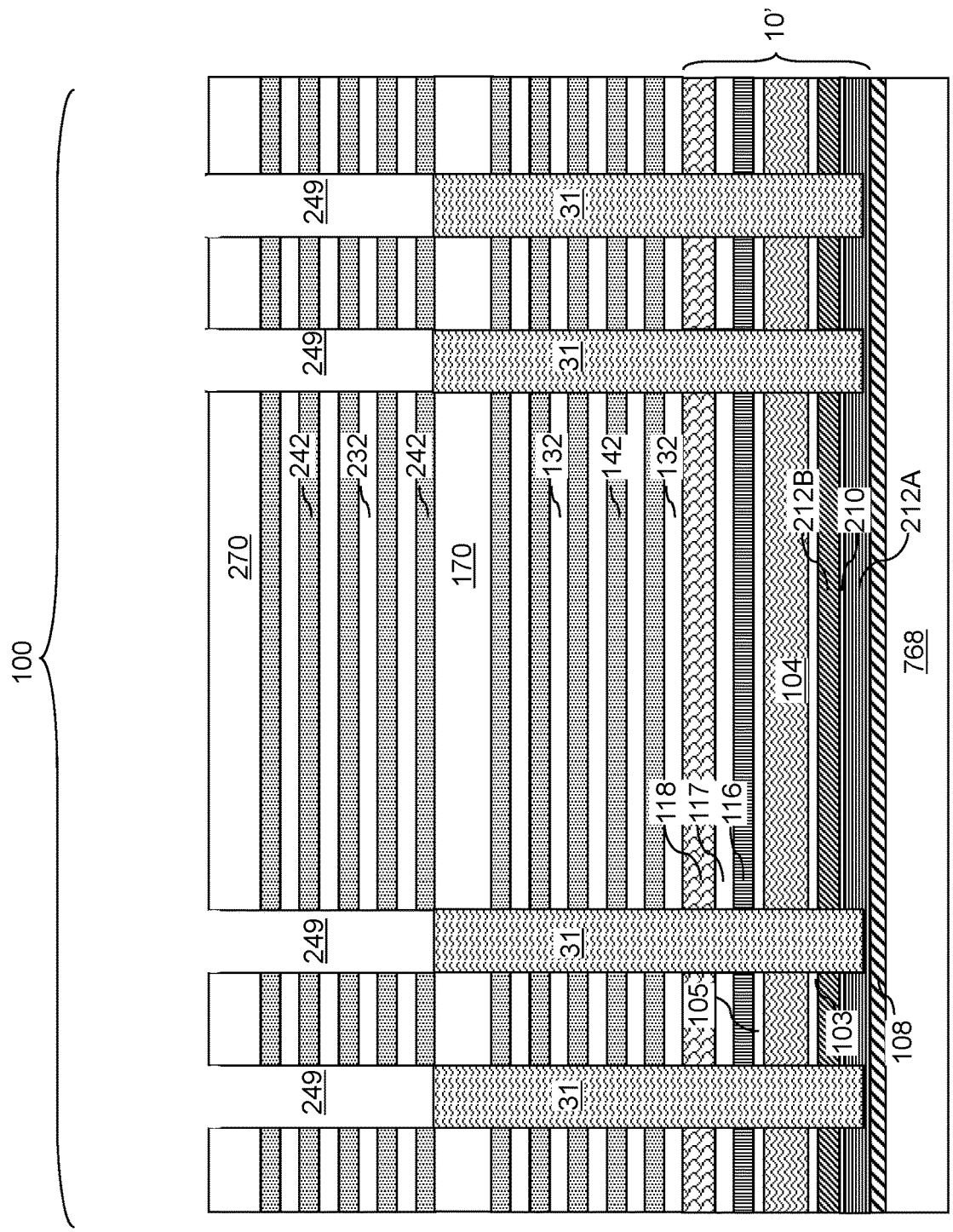
FIG. 6A is a vertical cross-sectional view of the first exemplary structure after formation of a second alternating stack of second insulating layers and second sacrificial material layers, second stepped surfaces, a second retro-stepped dielectric material portion, second memory openings, and second support openings according to the first embodiment of the present disclosure.
Figure 6B:
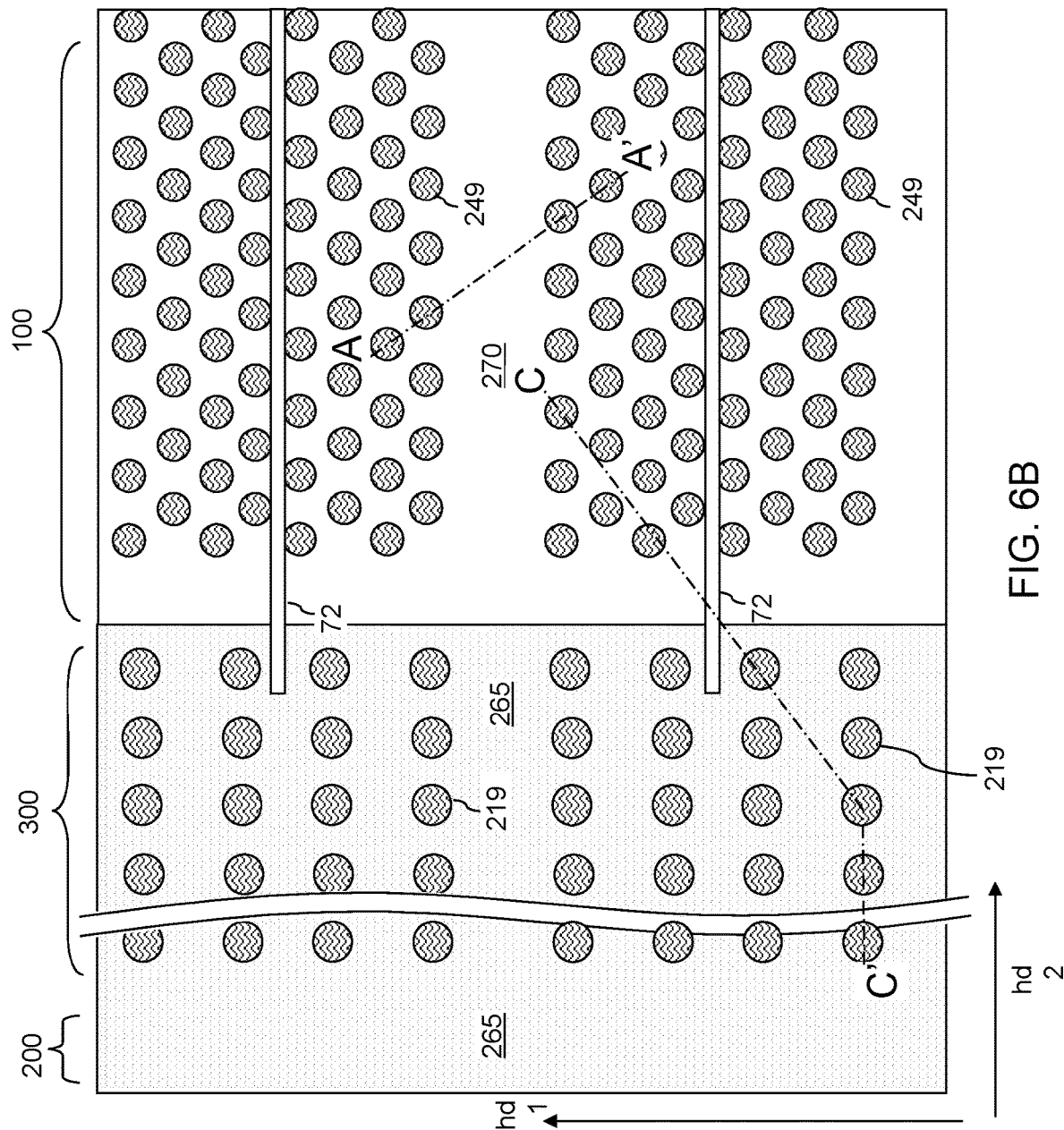
FIG. 6B is a top-down view of the first exemplary structure of FIG. 6A. The plane A-A' is the plane of the vertical cross-section of FIG. 6A.
Figure 6C:
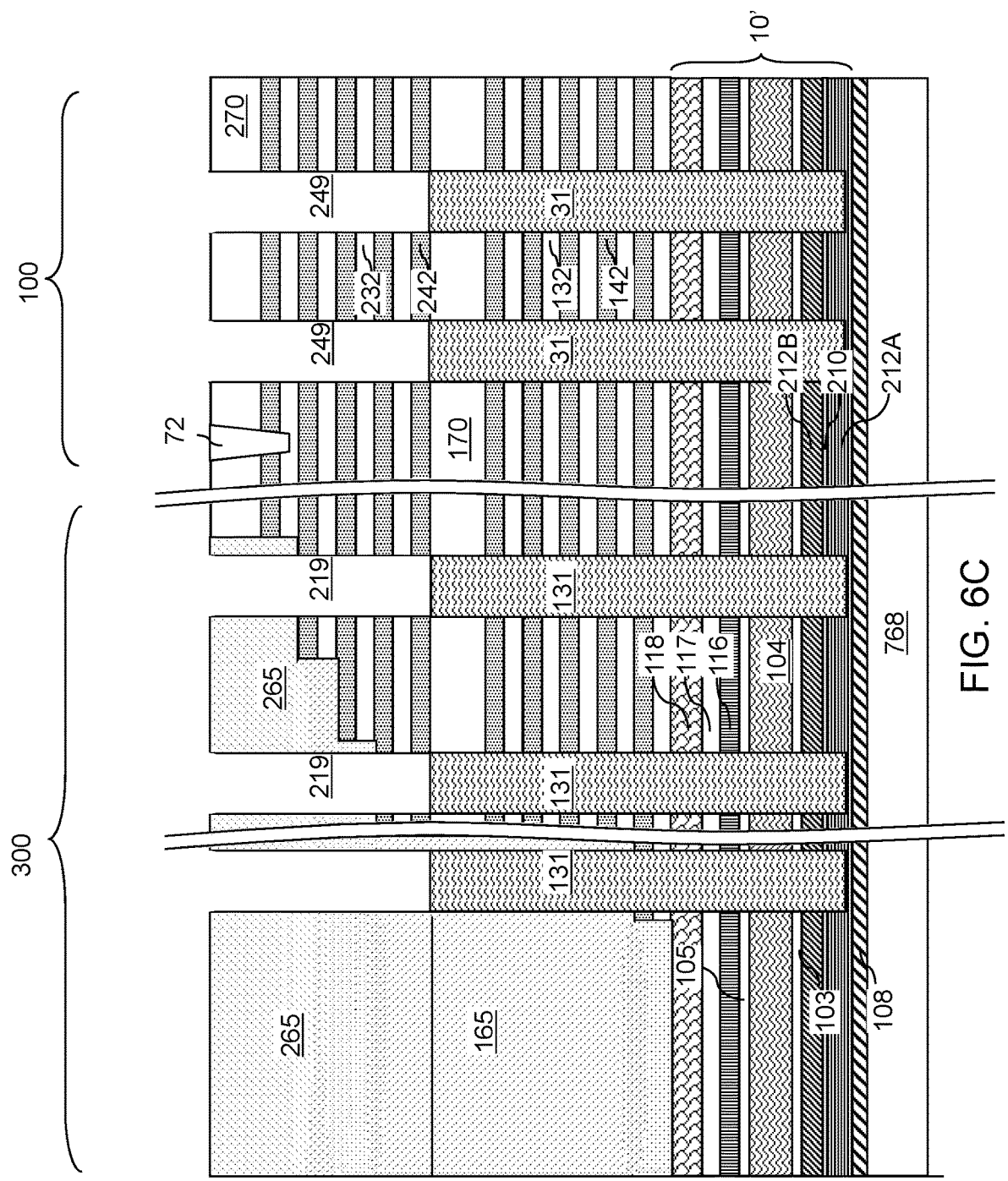
FIG. 6C is another vertical cross-sectional view of the first exemplary structure along the vertical plane C-C' of FIG. 6B.

Referring to FIGS. 6A-6C, second-tier openings (249, 219) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 119), which is the same as the sacrificial first-tier opening fill portions (31, 131). Thus, the lithographic mask used to pattern the first-tier openings (149, 119) can be used to pattern the photoresist layer.

The pattern of openings in the photoresist layer can be transferred through the second-tier structure (232, 242, 265, 270, 72) by a second anisotropic etch process to form second-tier openings (249, 219) concurrently, i.e., during the second anisotropic etch process. The second-tier openings (249, 219) can include second-tier memory openings 249 and second-tier support openings 219.

The second-tier memory openings 249 are formed directly on a top surface of a respective one of the sacrificial first-tier memory opening fill portions 31. The second-tier support openings 219 are formed directly on a top surface of a respective one of the sacrificial first-tier support opening fill portions 131.

Referring to FIG. 7, the sacrificial fill material can be removed from underneath the second-tier memory openings 249 and the second-tier support openings 219 using an etch process that etches the sacrificial fill material selective to the materials of the first and second insulating layers (132, 232), the first and second sacrificial material layers (142, 242), and the first and second insulating cap layers (170, 270). A memory opening 49, which is also referred to as an inter-tier memory opening 49, is formed in each combination of a volume of a second-tier memory opening 249 and an underlying volume from which a sacrificial first-tier memory opening fill portion 31 is removed. A support opening, which is also referred to as an inter-tier support opening, is formed in each combination of a second-tier support opening 210 and a volume from which an underlying sacrificial first-tier support opening fill portion 131 is removed.

Figure 8A:
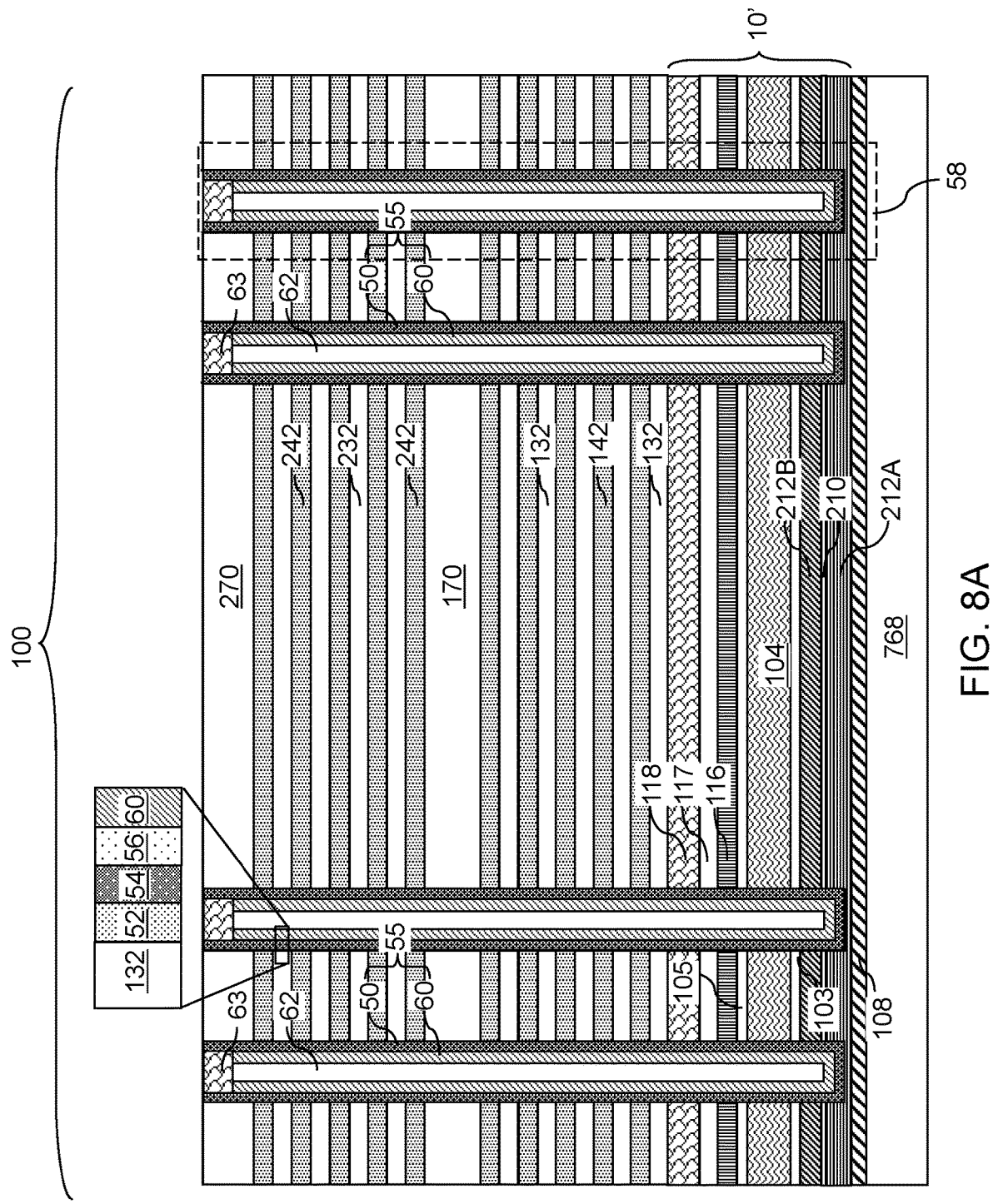
FIG. 8A is a vertical cross-sectional view of the first exemplary structure after formation of a memory stack structure, a dielectric core, and a drain region within each inter-tier memory opening according to the first embodiment of the present disclosure.
Figure 8B:
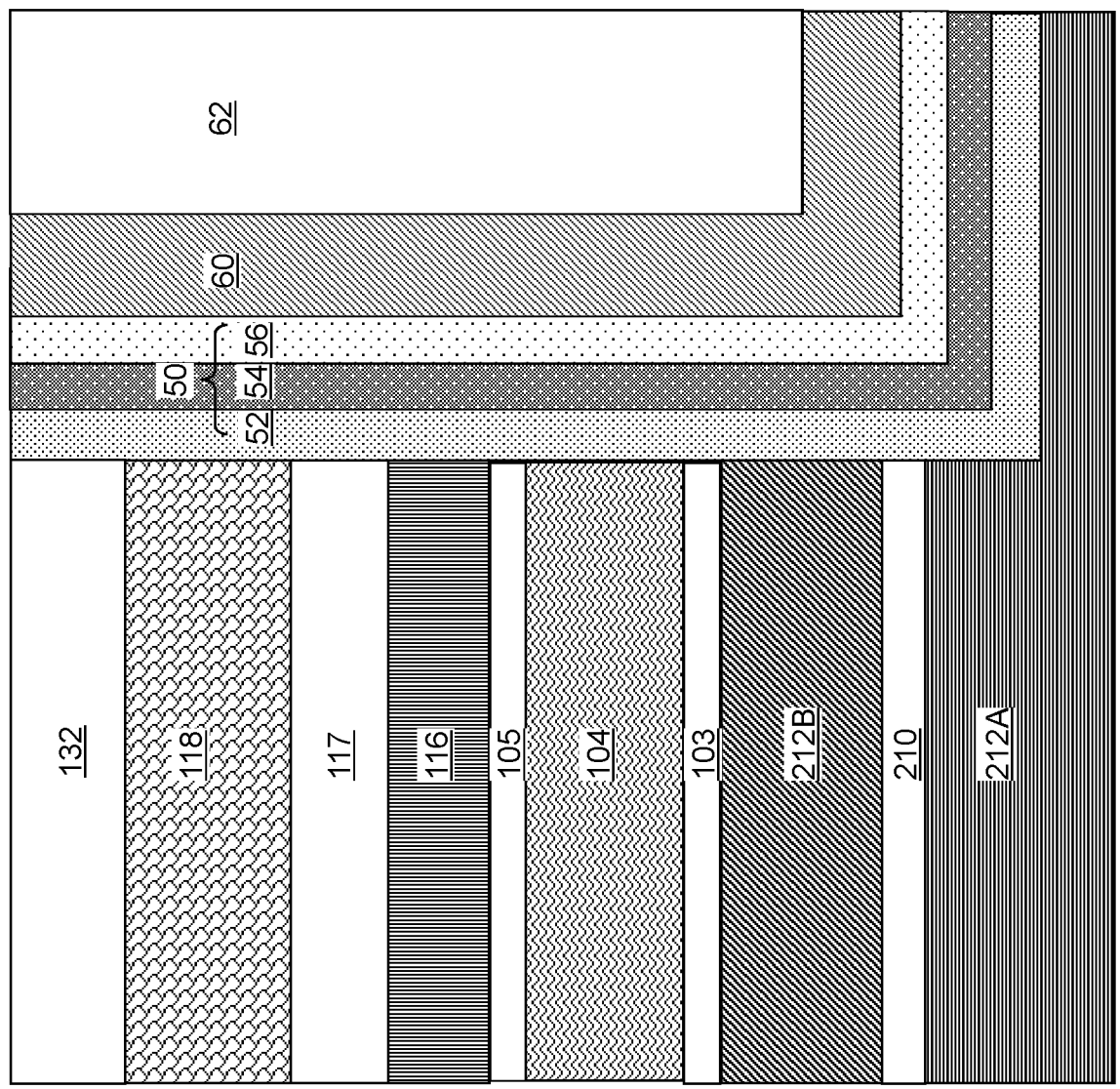
FIG. 8B is a vertical cross-sectional view of a bottom corner of a memory opening fill structure at the processing step of FIG. 8A.

Referring to FIGS. 8A and 8B, a stack of layers including a blocking dielectric layer 52, a charge storage layer 54, a tunneling dielectric layer 56, and a semiconductor channel material layer can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. As used herein, a first surface and a second surface are "vertically coincident" if there exists the second surface overlies or underlies the first surface and if there exists a vertical plane including the first surface and the second surface. Alternatively, the sacrificial material layers (142, 242) can be laterally recessed with respect to the sidewalls of the insulating layers (132, 232), and a combination of a deposition process and an anisotropic etch process can be used to form the charge storage layer 54 as a plurality of memory material portions that are vertically spaced apart. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used. The stack of the blocking dielectric layer 52, the charge storage layer 54, and the tunneling dielectric layer 56 constitutes a memory film 50 that stores memory bits.

The semiconductor channel material layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer includes amorphous silicon or polysilicon. The semiconductor channel material layer can be formed by a conformal deposition method such as low pressure chemical vapor deposition (LPCVD). The thickness of the semiconductor channel material layer can be in a range from 2 nm to 10 nm, although lesser and greater thicknesses can also be used. A cavity is formed in the volume of each memory opening 49 that is not filled with the deposited material layers (52, 54, 56,).

In case the cavity in each memory opening is not completely filled by the semiconductor channel material layer, a dielectric core layer can be deposited in the cavity to fill any remaining portion of the cavity within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

A doped semiconductor material can be deposited in cavities overlying the dielectric cores 62. The doped semiconductor material has a doping of the opposite conductivity type of the doping of the semiconductor channel material layer. Thus, the doped semiconductor material has a doping of the second conductivity type. Portions of the deposited doped semiconductor material, the semiconductor channel material layer, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon.

Each remaining portion of the semiconductor channel material layer constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements that comprise portions of the charge storage layer 54, and an optional blocking dielectric layer 52. Each combination of a memory stack structure 55, a dielectric core 62, and a drain region 63 within a memory opening 49 constitutes a memory opening fill structure 58.

The in-process source-level material layer stack 10', the first-tier structure (132, 142, 170, 165), the second-tier structure (232, 242, 270, 265, 72), the memory opening fill structures 58 collectively constitute a memory-level assembly.

Each of the support openings is filled with a respective support pillar structure concurrently with formation of the memory opening fill structures 58. Each support pillar structure can have the same structural elements as a memory opening fill structure 58. Each support pillar structure is a dummy structure, i.e., an electrically inactive structure, and as such, is not subsequently contacted by any contact via structure.

Figure 9A:
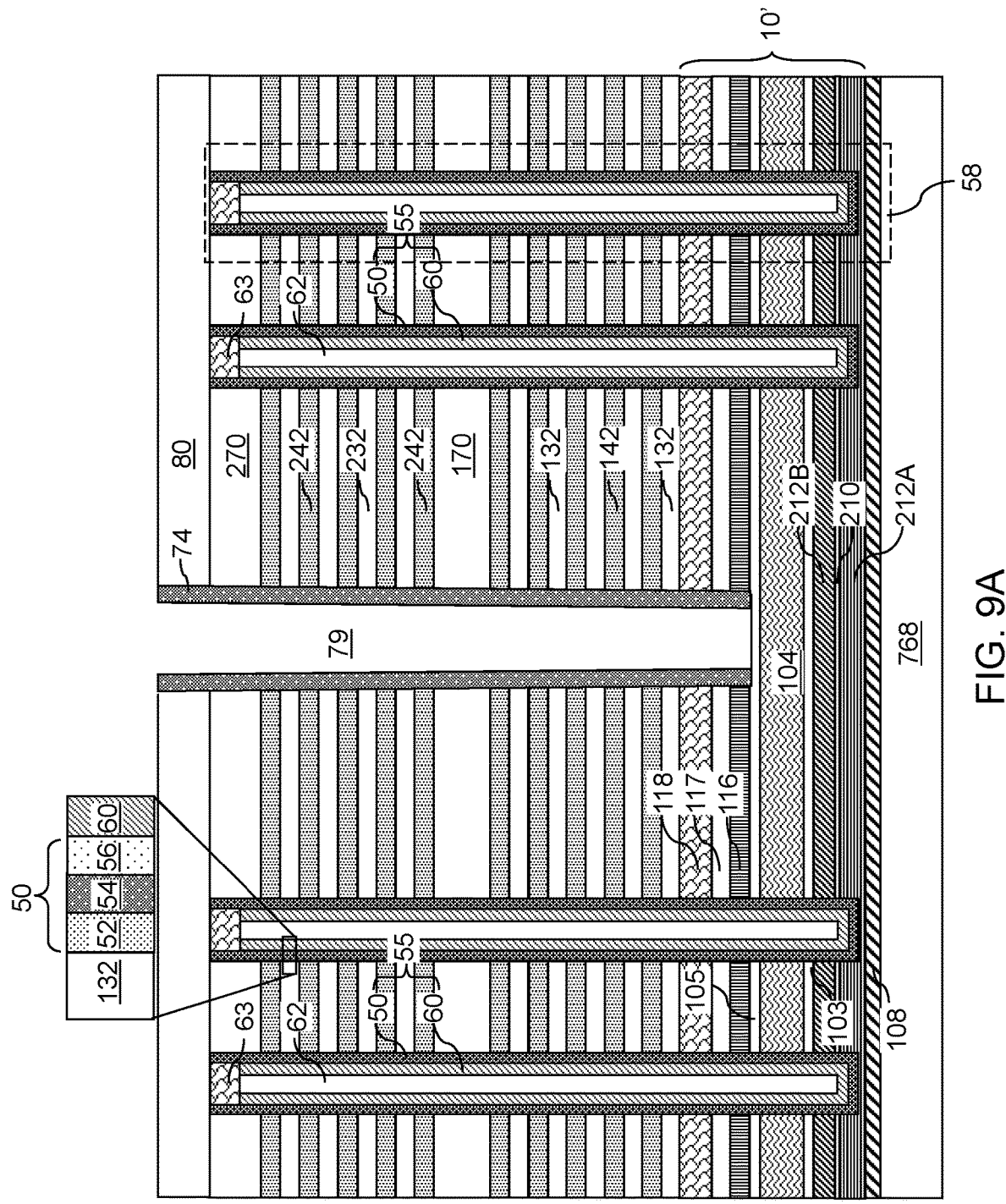
FIG. 9A is vertical cross-sectional view of the first exemplary structure after formation of backside trenches and trench spacers according to the first embodiment of the present disclosure.
Figure 9B:
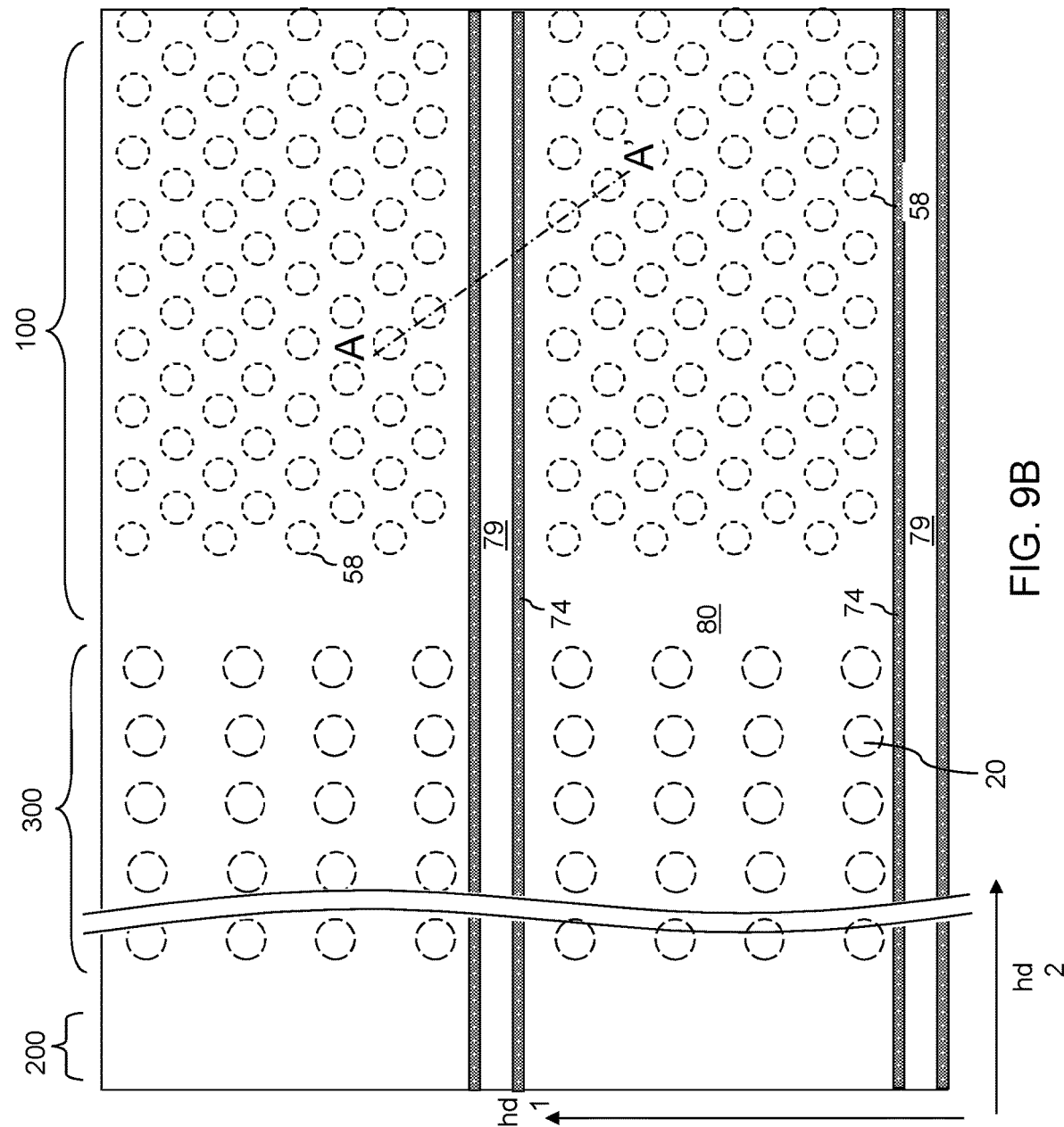
FIG. 9B is a top-down view of the first exemplary structure of FIG. 9A. The plane A-A' is the plane of the vertical cross-section of FIG. 9A.

Referring to FIGS. 9A and 9B, a contact level dielectric layer 80 can be formed over the second-tier structure (232, 242, 270, 265, 72). The contact level dielectric layer 80 includes a dielectric material such as silicon oxide, and can be formed by a conformal or non-conformal deposition process. For example, the contact level dielectric layer 80 can include undoped silicate glass and can have a thickness in a range from 100 nm to 600 nm, although lesser and greater thicknesses can also be used.

A photoresist layer can be applied over the contact level dielectric layer 80 and can be lithographically patterned to form openings within areas extending across the memory array region 100 and the staircase region 300. The openings in the photoresist layer can laterally extend along the first horizontal direction hd1 between each neighboring cluster of memory stack structures 55. Backside trenches 79 can be formed by transferring the pattern in the photoresist layer through the contact level dielectric layer 80, the second alternating stack (232, 242, 270, 265, 72), the first alternating stack (132, 142, 170, 165), and the in-process source-level material layer stack 10'. Portions of the contact level dielectric layer 80, the second alternating stack (232, 242, 270, 265, 72), the first alternating stack (132, 142, 170, 165), and the in-process source-level material layer stack 10' that underlie the openings in the photoresist layer can be removed to form backside trenches 79. In one embodiment, the upper sacrificial liner 105 can be used as an etch stop layer. In this case, the backside trenches 79 can stop on the upper sacrificial liner 105. In one embodiment, the backside trenches 79 can be formed between clusters of memory stack structures 55. The clusters of the memory stack structures 58 can be laterally spaced apart along the second horizontal direction hd2 by the backside trenches 79. Clusters of support pillar structures 20 can be laterally spaced apart among one another along the second horizontal direction by the backside trenches 79.

A backside trench spacer 74 can be formed on sidewalls of each backside trench 79. For example, a conformal spacer material layer can be deposited in the backside trenches 79 and over the contact level dielectric layer 80, and can be anisotropically etched to form the backside trench spacers 74. The backside trench spacers 74 include a material that is different from the material of the source-level sacrificial layer 104. For example, the backside trench spacers 74 can include silicon nitride.

Figure 10:
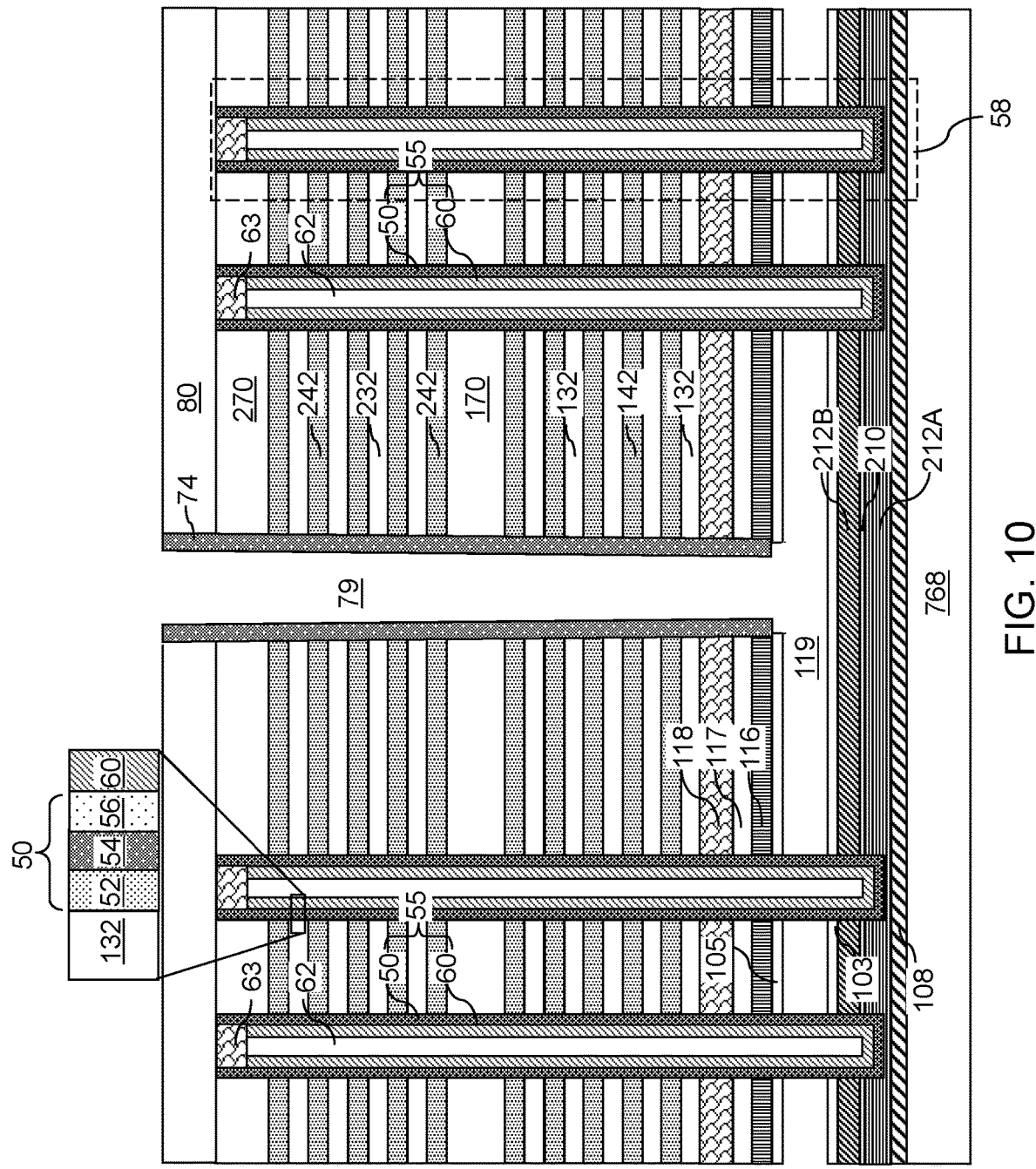
FIG. 10 is a vertical cross-sectional view of the first exemplary structure after formation of a source cavity according to the first embodiment of the present disclosure.

Referring to FIG. 10, an isotropic etch or an anisotropic etch can be performed to remove portions of the upper sacrificial liner 105. A top surface of the source-level sacrificial layer 104 is physically exposed at the bottom of each backside trench 79. An etchant that etches the material of the source-level sacrificial layer 104 selective to the materials of the backside trench spacer 74, the contact level dielectric layer 80, the upper sacrificial liner 105, and the lower sacrificial liner 103 can be introduced into the backside trenches in an isotropic etch process. The etchant can be introduced through the backside trenches 79. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) can be used to remove the source-level sacrificial layer 104 selective to the backside trench spacers 74 and the upper and lower sacrificial liners (105, 103). A source cavity 119 is formed in the volume from which the source-level sacrificial layer 104 is removed. Sidewall surfaces of the memory opening fill structures 58 are physically exposed to the source cavity 119.

Figure 11A:
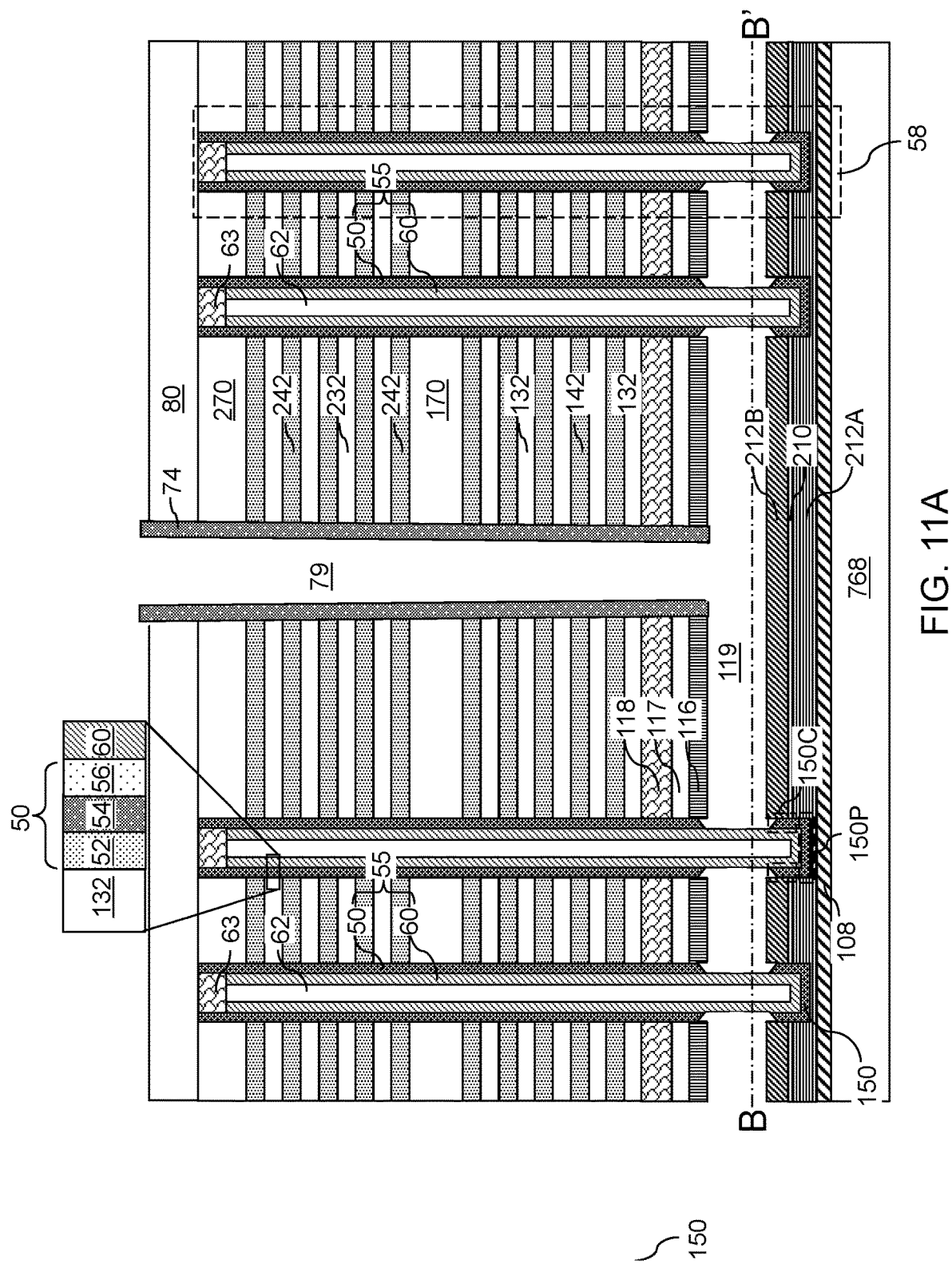
FIG. 11A is a vertical cross-sectional view of the first exemplary structure after expansion of the source cavity by removal of the lower and upper sacrificial liners and portions of the memory films located at the level of the source cavity according to the first embodiment of the present disclosure.
Figure 11B:
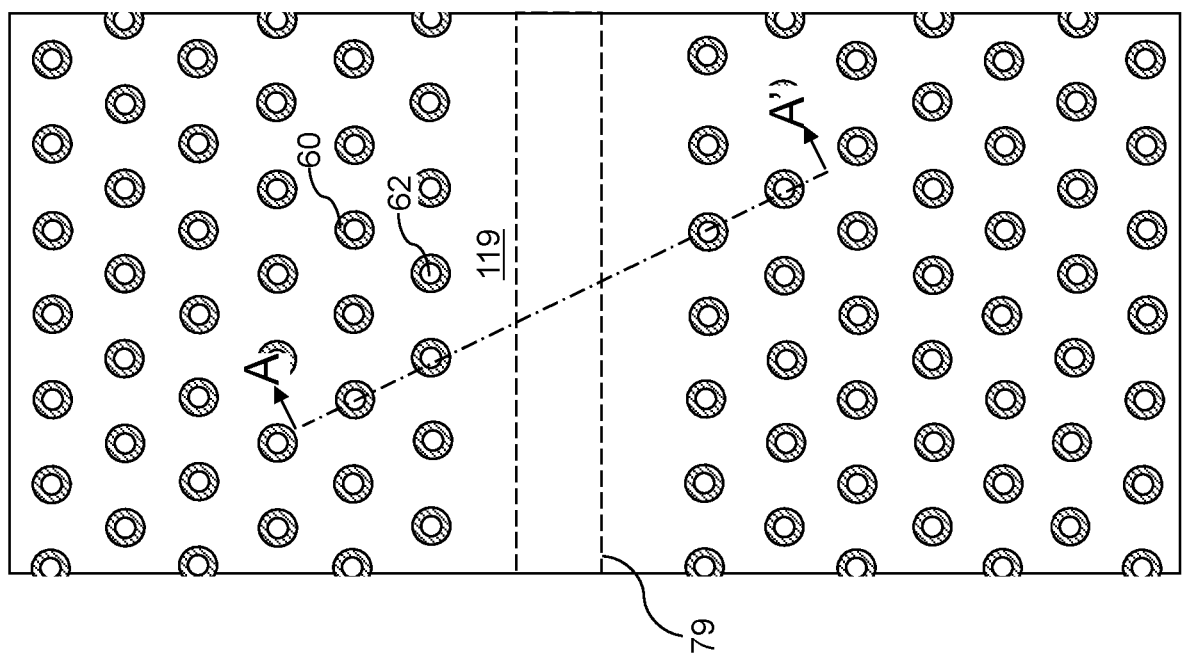
FIG. 11B is a top-down view of the first exemplary structure of FIG. 11A. The plane A-A' is the plane of the vertical cross-section of FIG. 11A.

Referring to FIGS. 11A and 11B, a sequence of isotropic etchants, such as wet etchants, can be applied through the backside trenches 79 and the source cavity 119 to the physically exposed portions of the memory films 50 to sequentially etch the various component layers of the memory films 50 from outside to inside, and to physically expose bottom surfaces and cylindrical side surfaces of the vertical semiconductor channels 60 at the level of the source cavity 119. The upper and lower sacrificial liners (105, 103) can be collaterally etched during removal of the portions of the memory films 50 located at the level of the source cavity 119. The source cavity 119 can be expanded in volume by removal of the portions of the memory films 50 at the level of the source cavity 119 and the upper and lower sacrificial liners (105, 103). A top surface of the second lower source-level semiconductor layer 212A and a bottom surface of the upper source-level semiconductor layer 116 can be physically exposed to the source cavity 119. An outer sidewall of each vertical semiconductor channel 60 is physically exposed to the source cavity 119 after removing the physically exposed portions of the memory films 50. Thus, outer sidewalls of the vertical semiconductor channels 60 are physically exposed by removing portions of the memory films 50 at the level of the source cavity 119.

A memory material cap 150 is formed underneath each physically exposed cylindrical surface of the vertical semiconductor channels 60. Each memory material cap 150 is a remaining portion of the memory films 50, and includes the same memory material cap as the memory films 50. The memory material caps 150 are within the first lower source-level semiconductor layer 212A. Each of the memory material caps 150 includes a planar cap portion 150P underlying a bottommost surface of a respective one of the vertical semiconductor channels 60, and a cylindrical cap portion 150C laterally surrounding a bottom portion of the respective one of the vertical semiconductor channels 60. The semiconductor oxide tunneling layer 210 directly contacts each of the memory material caps 150. Specifically, the semiconductor oxide tunneling layer 210 directly contacts an outer sidewall of each of the memory material caps 150, and is located below an upper periphery of the outer sidewall of each of the memory material caps 150.

Figure 12:
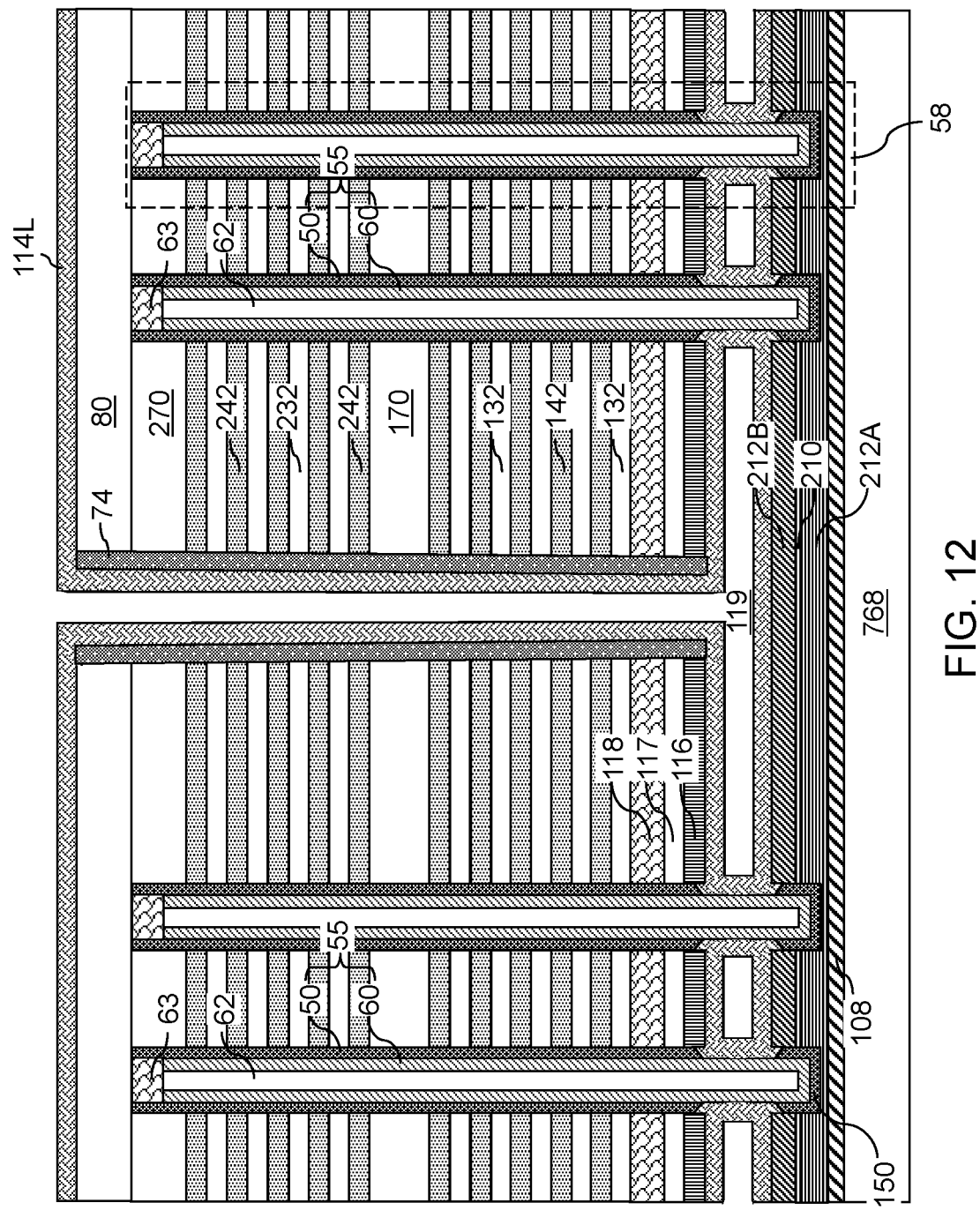
FIG. 12 is a vertical cross-sectional view of the first exemplary structure after formation of a continuous source contact semiconductor layer according to the first embodiment of the present disclosure.

Referring to FIG. 12, a continuous source contact semiconductor layer 114L can be deposited in the source cavity 119 using a first conformal semiconductor deposition process. The continuous source contact semiconductor layer 114L includes a first doped semiconductor material having a doping of the second conductivity type in the source cavity and over the semiconductor oxide tunneling layer 210. In one embodiment, the continuous source contact semiconductor layer 114L can be formed by a non-selective doped semiconductor deposition process that deposits an amorphous doped semiconductor material on all physically exposed surfaces in the source cavity 119 and in the backside trench 79. An amorphous doped semiconductor material having a doping of the second conductivity type can be deposited by the non-selective doped semiconductor deposition process. A semiconductor precursor gas and a dopant precursor gas can be flowed concurrently into a process chamber including the first exemplary structure during the selective semiconductor deposition process. For example, if the second conductivity type is n-type, a semiconductor precursor gas (such as silane, disilane, or dichlorosilane) and a dopant precursor gas (such as phosphine, arsine, or stibine) can be simultaneously or alternately flowed into a process chamber containing the first exemplary structure.

The temperature of the deposition process is selected such that crystallization of the deposited doped semiconductor material does not occur in-situ, and the deposited doped semiconductor material remains amorphous. The non-selective doped semiconductor deposition process deposits the amorphous doped semiconductor material on all physically exposed surfaces of the first exemplary structure. Thus, the continuous source contact semiconductor layer 114L is formed as a continuous material layer directly on the physically exposed surfaces of the vertical semiconductor channels 60, the second lower source-level semiconductor layer 212B, and the upper source-level semiconductor layer 116 in each source cavity 119, directly on the physically exposed surfaces of the backside trench spacer 74 within each backside trench 79, and directly on the top surface of the contact level dielectric layer 80. In one embodiment, an etchant gas is not used in the non-selective doped semiconductor deposition process.

The non-selective semiconductor deposition process can be performed by a conformal deposition process operated in a temperature-limited process regime. For example, the non-selective semiconductor deposition process can comprise a low pressure chemical vapor deposition (LPCVD) process in which a sufficient amount of the semiconductor precursor gas and the dopant precursor gas is provided into a process chamber at a temperature that is not high enough to induce decomposition of a predominant (i.e., over 50%) of the semiconductor precursor gas. In other words, the supply of the semiconductor precursor gas is sufficiently abundant to affect the deposition rate, while the temperature of the deposition is low enough to limit the deposition rate, thereby providing the temperature-limited process region. For example, in case the continuous source contact semiconductor layer 114L includes amorphous silicon, the deposition temperature may be in a range from 500 degrees Celsius to 575 degree Celsius. Performing the non-selective semiconductor deposition process in the temperature-limited process regime provides the benefit of a stable and reliable deposition process in which the thickness of the continuous source contact semiconductor layer 114L is uniform across the entire first exemplary structure. Further, the thickness of the continuous source contact semiconductor layer 114L can be stable over multiple runs such that multiple batches of first exemplary structures can be manufactured with minimal process variations.

The duration of the non-selective semiconductor deposition process can be selected such that the source cavity 119 is not filled with the continuous source contact semiconductor layer 114L. Thus, an unfilled cavity is present within the source contact layer 119. Further, an unfilled cavity, which is herein referred to as a backside cavity, is present within each backside trench 79. The continuous source contact semiconductor layer 114L can be formed as a conformal material layer. In this case, the thickness of the continuous source contact semiconductor layer 114L can be less than one half of the height of the source cavity 119 prior to performing the non-selective semiconductor deposition process. In one embodiment, the thickness of the continuous source contact semiconductor layer 114L can be in a range from 10 nm to 160 nm, such as from 25 nm to 80 nm, although lesser and greater thicknesses can also be used. The average atomic concentration of dopants of the second conductivity type in the continuous source contact semiconductor layer 114L can be in a range from $5.0 \times 10^{19}/cm^3$ to $2.0 \times 10^{21}/cm^3$, although lesser and greater dopant concentrations can also be used.

Figure 13:
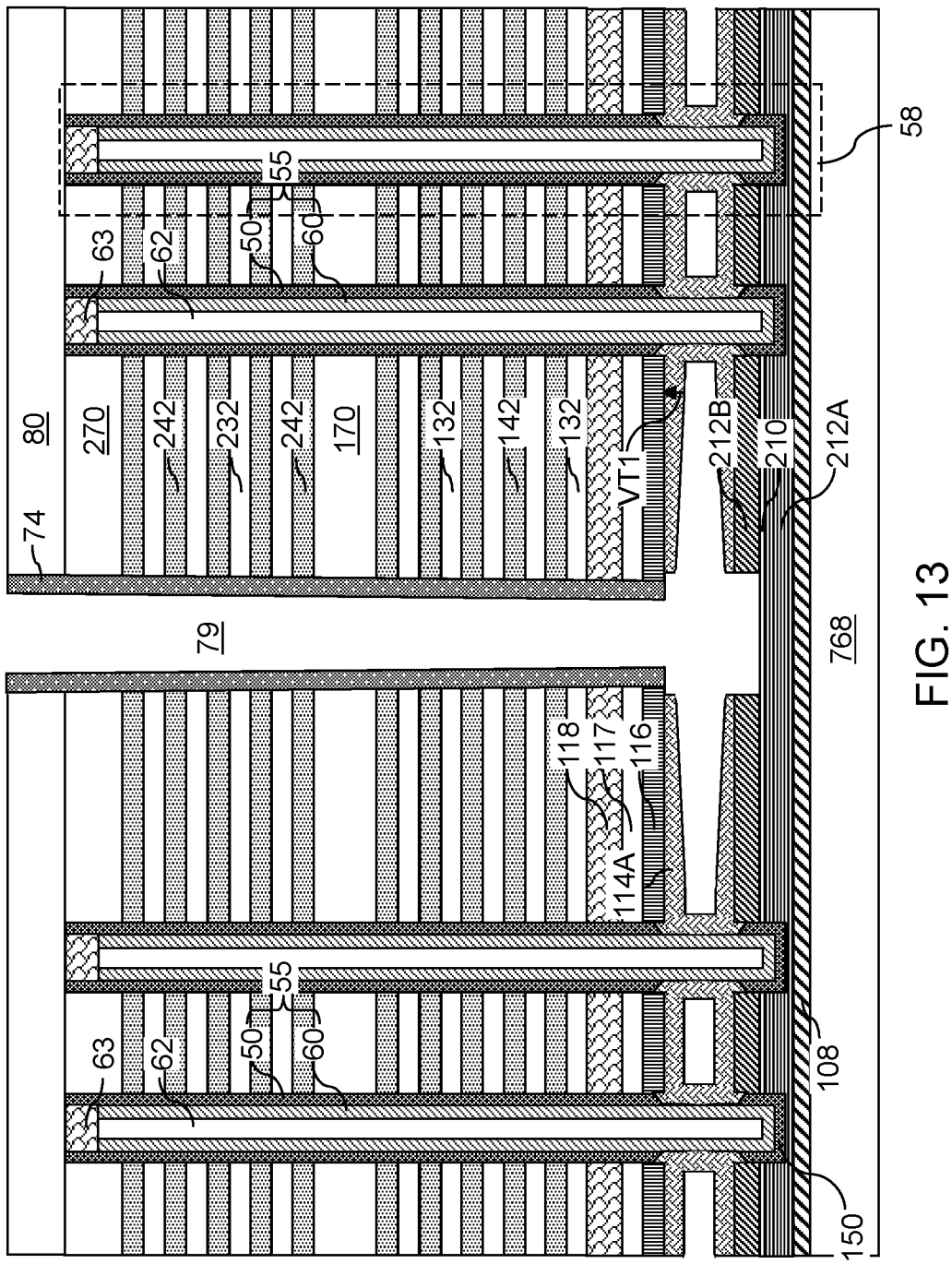
FIG. 13 is a vertical cross-sectional view of the first exemplary structure after formation of a first source contact semiconductor layer according to the first embodiment of the present disclosure.

Referring to FIG. 13, a semiconductor material etch back process is performed on the continuous source contact semiconductor layer 114L. The semiconductor material etch back process can include an anisotropic etch process using chlorine chemistry. An etch process using chlorine chemistry is selective to semiconductor oxide such as silicon oxide. Thus, portions of the continuous source contact semiconductor layer 114L overlying the contact level dielectric layer 80, portions of the continuous source contact semiconductor layer 114L located within the backside trenches 79, and portions of the continuous source contact semiconductor layer 114L underlying the backside trenches 79 and overlying the semiconductor oxide tunneling layer 210 can be removed by the semiconductor material etch back process. In this case, the semiconductor oxide tunneling layer 210 can be used as an etch stop layer.

In an illustrative example, the semiconductor material etch back process can include an anisotropic etch process using about 5 standard cubit centimeters per second (sccm) of $Cl_2$, 25 sccm of HBr, about 30 mTorr of chamber pressure, and about 100 Watts of RF power. The anisotropic etch process can provide an etch rate of about 5 nm per second. The anisotropic etch process is highly selective to semiconductor oxide materials, and thus, the semiconductor oxide tunneling layer 210 having a thickness in a range from 0.5 nm to 3 nm can function as a suitable etch stop layer. The selectivity of the anisotropic etch process can be further enhanced by reducing the RF power and reducing the etch rate.

Surface portions of the continuous source contact semiconductor layer 114L located within the source cavity 119 and laterally spaced from, i.e., laterally offset from, the backside trenches 79 are collaterally etched during the semiconductor material etch back process. Thus, tapered surfaces are formed in remaining portion of the continuous source contact semiconductor layer 114L. The remaining portion of the continuous source contact semiconductor layer 114L after the semiconductor material etch back process constitutes a first source contact semiconductor layer 114A. The first source contact semiconductor layer 114A comprises regions having a first variable thickness VT1 that increases with a lateral distance from the backside trenches 79.

Figure 14:
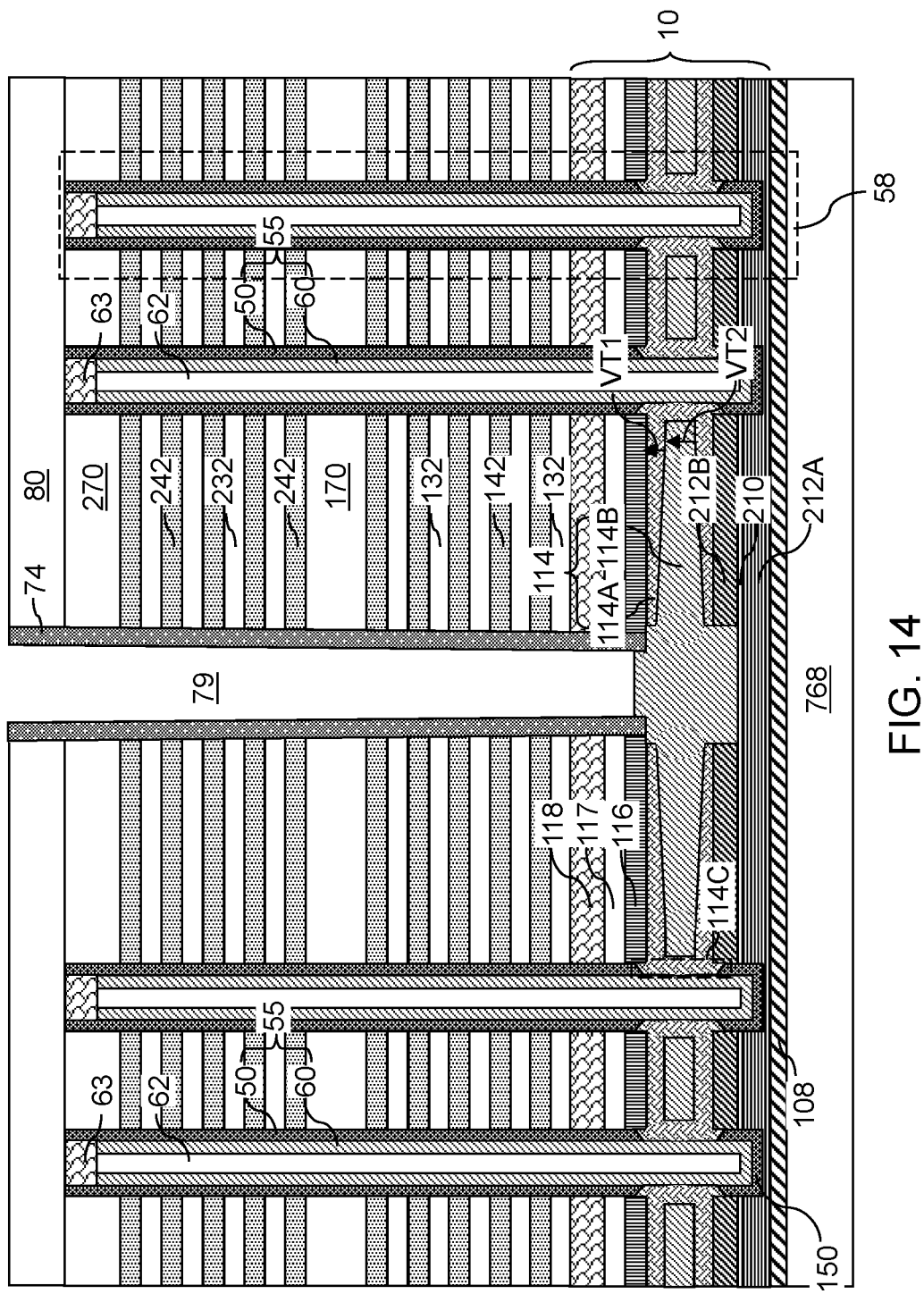
FIG. 14 is a vertical cross-sectional view of the first exemplary structure after formation of a second source contact semiconductor layer according to the first embodiment of the present disclosure.

Referring to FIG. 14, a second conformal semiconductor deposition process can be performed, which deposits a second source contact semiconductor layer 114B comprising a second doped semiconductor material on the first source contact semiconductor layer 114A in the remaining volume of the source cavity 119. The tapered surfaces and the first variable thickness VT1 of the first source contact semiconductor layer 114A facilitates seamless filling of the remaining volume of the source cavity 119 by the second doped semiconductor material. The second doped semiconductor material has a doping of the second conductivity type, and may be the same as the first doped semiconductor material in composition. Further, the second conformal semiconductor deposition can use any of the conformal semiconductor deposition methods that can be used for the first conformal semiconductor deposition. In one embodiment, the duration of the second conformal semiconductor deposition can be selected such that the entirety of the remaining volume of the source cavity 119 is filled by the second source contact semiconductor layer 114B.

The first source contact semiconductor layer 114A and the second source contact semiconductor layer 114B collectively constitute a source contact layer 114. The second source contact semiconductor layer 114B is laterally surrounded by the first source contact semiconductor layer 114A, contacts a bottom surface of an upper portion of the first source contact semiconductor layer 114A, and contacts a top surface of a lower portion of the first source contact semiconductor layer 114A. The second source contact semiconductor layer 114B is laterally spaced from each of the vertical semiconductor channels 60 by the first source contact semiconductor layer 114A. The first source contact semiconductor layer 114A comprises regions having a first variable thickness VT1 that decreases with the lateral distance from a most proximal one of the vertical semiconductor channels 60 and increases with a lateral distance from the backside trenches 79, i.e., the lateral distance from a most proximal one of the backside trenches 79. The second source contact semiconductor layer 114B comprises regions having a second variable thickness that increases with the lateral distance from the most proximal one of the vertical semiconductor channels 60, and decreases with the lateral distance from the backside trenches 79, i.e., the least lateral distance from the most proximal one of the backside trenches 79.

The source contact layer 114 is formed directly on the second lower source-level semiconductor layer 212B. Each of the vertical semiconductor channels 60 vertically extends through, and is electrically connected to, the source contact layer 114 such that the electrical potential of the bottom ends of the vertical semiconductor channels 60 are the same as the electrical potential of the source contact layer 114. In other words, the bottom ends of the vertical semiconductor channels 60 are electrically connected to the source contact layer 114. The source contact layer 114 comprises cylindrical source contact material portions 114C. Each of the cylindrical source contact material portions 114C is more proximal to a respective one of the vertical semiconductor channels 60 than an outer sidewall of a memory film 50 that laterally surrounds the respective one of the vertical semiconductor channels 60 is to the respective one of the vertical semiconductor channels 60. In one embodiment, the number of the cylindrical source contact material portions 114C can be the same as the number of the vertical semiconductor channels 60.

While various embodiments are described in the present disclosure using an embodiment in which two semiconductor material deposition processes and one semiconductor material etch back process are used, the methods of various embodiments can use more than two semiconductor material deposition processes and more than one semiconductor material etch back process. Generally, the source contact layer 114 of various embodiments can be formed by performing at least two semiconductor material deposition processes and at least one semiconductor material etch back process that employs the semiconductor oxide tunneling layer 210 as an etch stop layer.

The layer stack including the first lower source-level semiconductor layer 212A, the semiconductor oxide tunneling layer 210, the second lower source-level semiconductor layer 212B, the source contact layer 114, and the upper source-level semiconductor layer 116 constitutes a buried source layer (212A, 210, 212B, 114, 116), which function as a common source region that is connected each of the vertical semiconductor channels 60 and has a doping of the second conductivity type. The average dopant concentration in the semiconductor materials of the buried source layer (212A, 210, 212B, 114, 116) can be in a range from $5.0 \times 10^{19}/cm^3$ to $2.0 \times 10^{21}/cm^3$, although lesser and greater dopant concentrations can also be used. The set of layers including the buried source layer (212A, 210, 212B, 114, 116), the source-level insulating layer 117, and the optional source-select-level conductive layer 118 constitutes a source-level material layer stack 10, which replaces the in-process source-level material layer stack 10'.

Figure 15A:
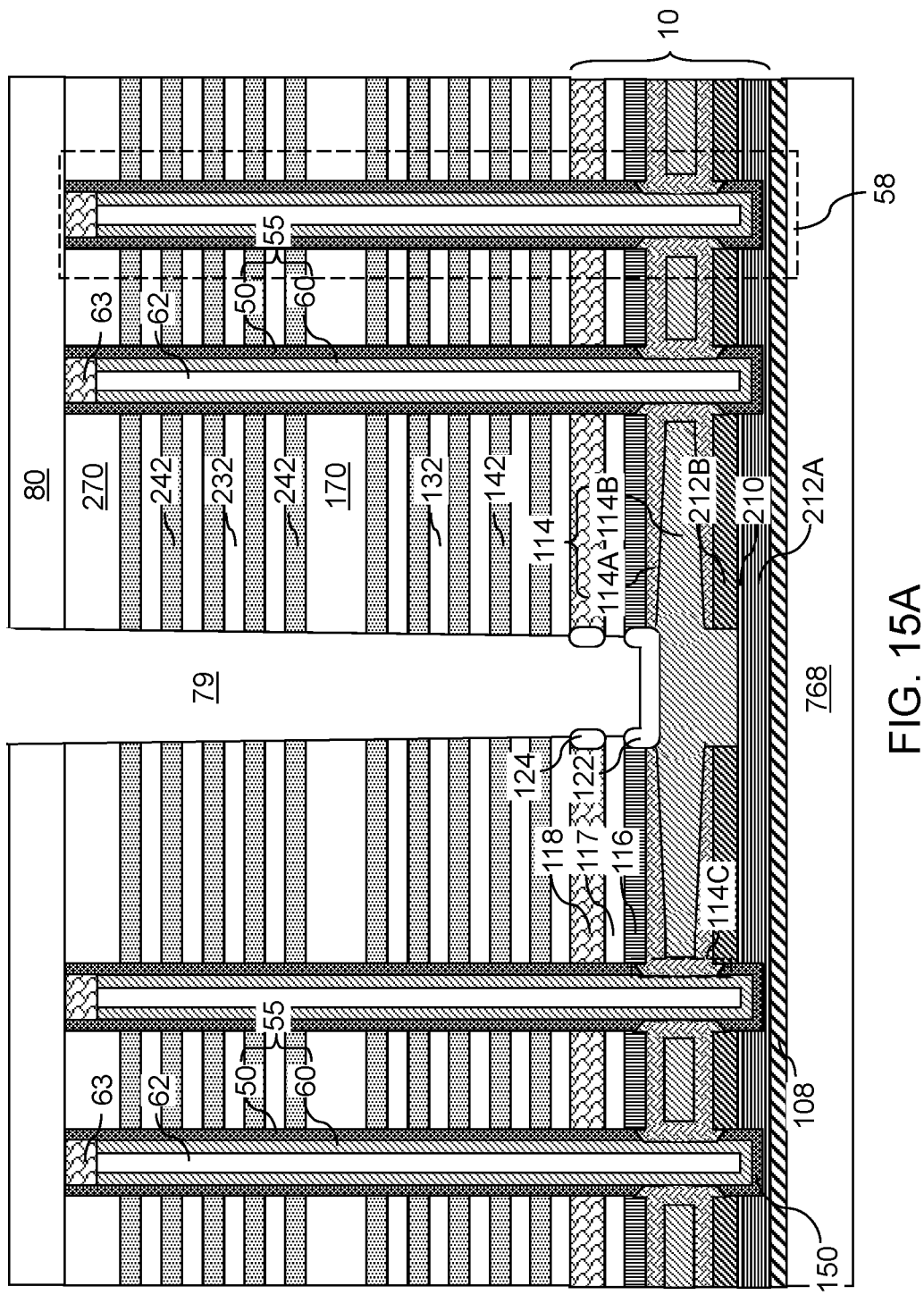
FIG. 15A is a vertical cross-sectional view of the first exemplary structure after formation of semiconductor oxide structures according to the first embodiment of the present disclosure.
Figure 15B:
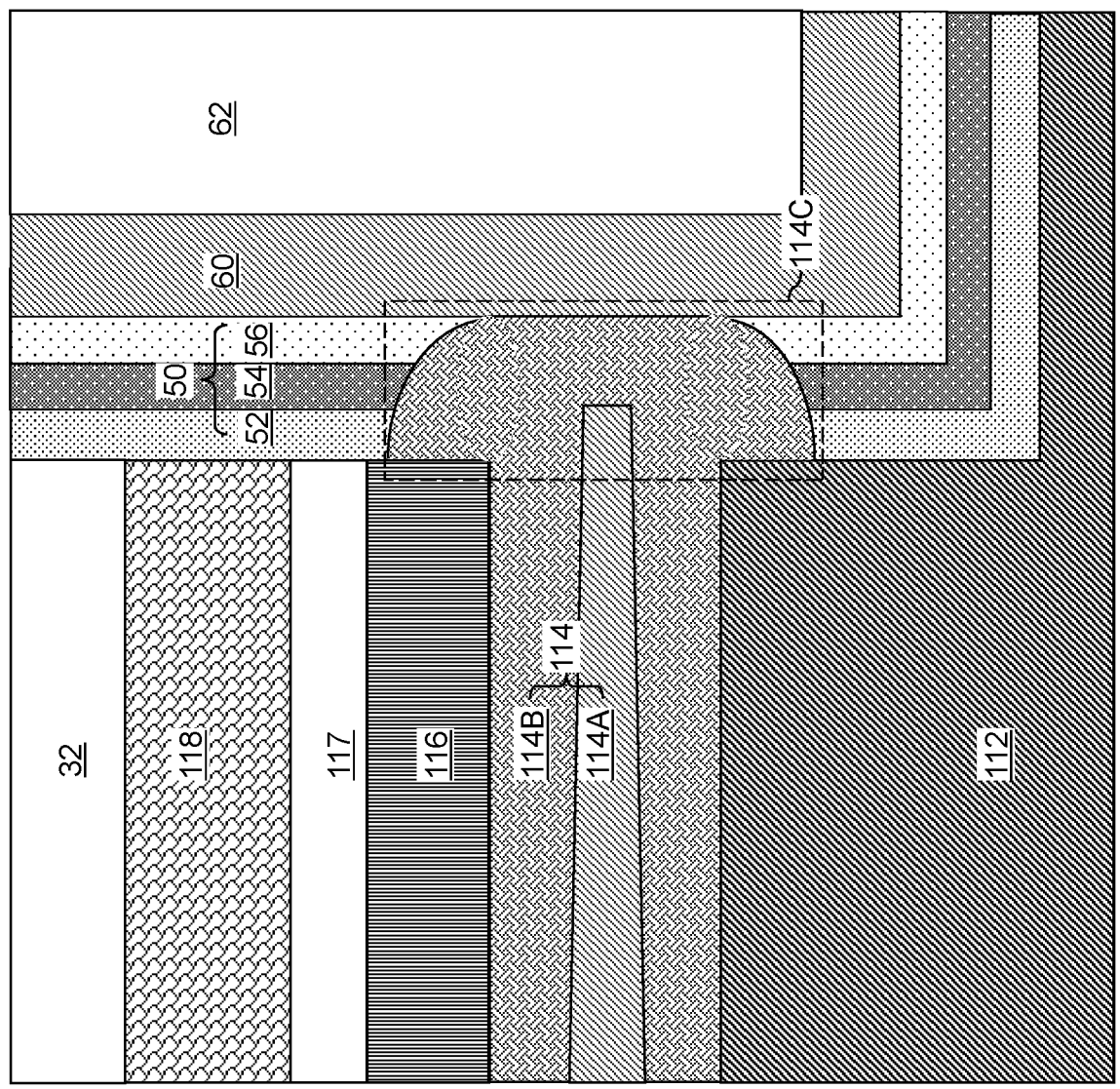
FIG. 15B is a vertical cross-sectional view of a bottom corner of a memory opening fill structure at the processing step of FIG. 15A.

Referring to FIGS. 15A and 15B, the backside trench spacers 74 can be removed selective to the materials of the source contact layer 114, the first and second insulating layers (132, 232), the first and second insulating cap layers (170, 270), and the contact level dielectric layer 80. For example, if the backside trench spacers 74 include silicon nitride, a wet etch process using hot phosphoric acid can be used to remove the backside trench spacers 74. Sidewalls of the first and second alternating stacks (132, 142, 232, 242), the upper source-level semiconductor layer 116, the source-level insulating layer 117, and the optional source-select-level conductive layer 118 can be physically exposed after removal of the backside trench spacers 74.

A thermal oxidation process can be performed to convert physically exposed surface portions of various semiconductor materials into semiconductor oxide portions. Specifically, physically exposed surface portions of the source contact layer 114, the upper source-level semiconductor layer 116, and the source-select-level conductive layer 118 (if present) are converted into thermal semiconductor oxide material portions. As used herein, a "thermal semiconductor oxide" refers to a material that is formed by thermal oxidation of a semiconductor material. Unlike a semiconductor oxide material formed by chemical vapor deposition, thermal semiconductor oxide materials do not include carbon or hydrogen above a trace level unless the semiconductor material from which the semiconductor oxide material is derived includes carbon prior to a thermal oxidation process. If the source contact layer 114, the upper source-level semiconductor layer 116, and the source-select-level conductive layer 118 are free of carbon, thermal semiconductor oxide material portions derived therefrom can be free of carbon or hydrogen.

The thermal oxidation process forms a U-shaped semiconductor oxide portion 122 at the bottom of each backside trench 79. The U-shaped semiconductor oxide portion 122 includes various thermal semiconductor oxide material portions formed by thermal conversion of surface portions of the source contact layer 114 and the upper source-level semiconductor layer 116. Further, an annular semiconductor oxide material portion 124 can be formed around each backside trench 79 by thermal oxidation of physically exposed surface portions of the source-select-level conductive layer 118. In one embodiment, the annular semiconductor oxide material portion 124 can be topologically homeomorphic to a torus.

Figure 16:
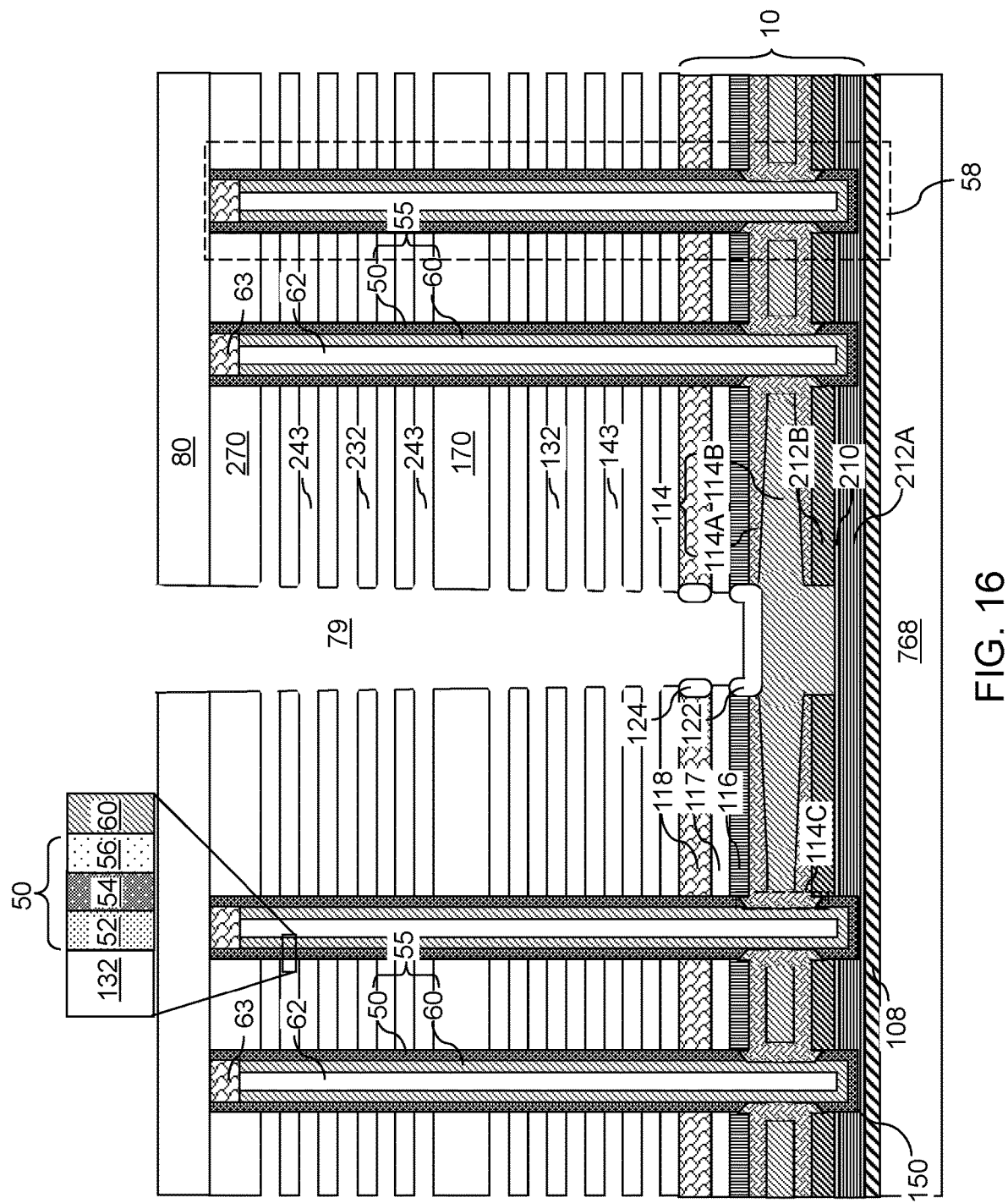
FIG. 16 is a vertical cross-sectional view of the first exemplary structure after formation of backside recesses according to the first embodiment of the present disclosure.

Referring to FIG. 16, an etchant that selectively etches the materials of the first and second sacrificial material layers (142, 242) with respect to the materials of the first and second insulating layers (132, 232), the first and second retro-stepped dielectric material portions (165, 265), and the material of the outermost layer of the memory films 50 can be introduced into the backside trenches 79, for example, using an isotropic etch process. For example, the first and second sacrificial material layers (142, 242) can include silicon nitride, the materials of the first and second insulating layers (132, 232), the first and second insulating cap layers (170, 270), the first and second retro-stepped dielectric material portions (165, 265), and the material of the outermost layer of the memory films 50 can include silicon oxide materials. First backside recesses 143 are formed in volumes from which the first sacrificial material layers 142 are removed. Second backside recesses 243 are formed in volumes from which the second sacrificial material layers 242 are removed.

The isotropic etch process can be a wet etch process using a wet etch solution, or can be a gas phase (dry) etch process in which the etchant is introduced in a vapor phase into the backside trenches 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials used in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 17:
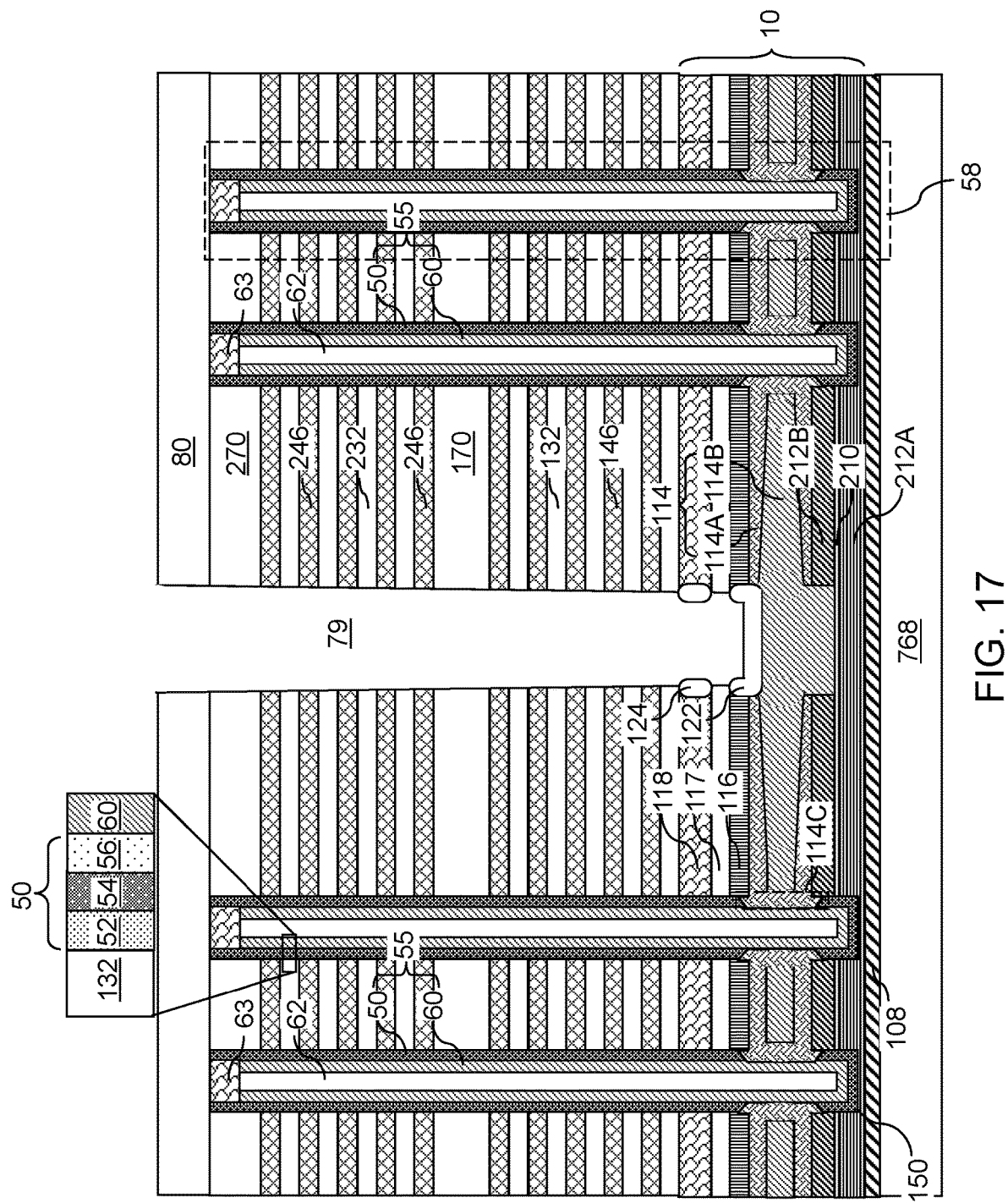
FIG. 17 is a vertical cross-sectional view of the first exemplary structure after formation of electrically conductive layers in the backside recesses according to the first embodiment of the present disclosure.

Referring to FIG. 17, a backside blocking dielectric layer (not shown) can be optionally deposited in the backside recesses and the backside trenches 79 and over the contact level dielectric layer 80. The backside blocking dielectric layer can be deposited on the physically exposed portions of the outer surfaces of the memory stack structures 55, which are portions of the memory opening fill structures 58. The backside blocking dielectric layer includes a dielectric material such as a dielectric metal oxide, silicon oxide, or a combination thereof. If used, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be used.

At least one conductive material can be deposited in the plurality of backside recesses (243, 243), on the sidewalls of the backside trench 79, and over the contact level dielectric layer 80. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the contact level dielectric layer 80. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside trenches 79. Specifically, the deposited metallic material of the continuous metallic material layer can be etched back from the sidewalls of each backside trench 79 and from above the contact level dielectric layer 80, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying CMOS circuitry 710 can comprise word line switch devices configured to control a bias voltage to respective word lines. The memory-level assembly includes all structures located above the topmost surface of the lower-level metal interconnect structures 780, and is located over, and is vertically spaced from, the substrate semiconductor layer. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Figure 18A:
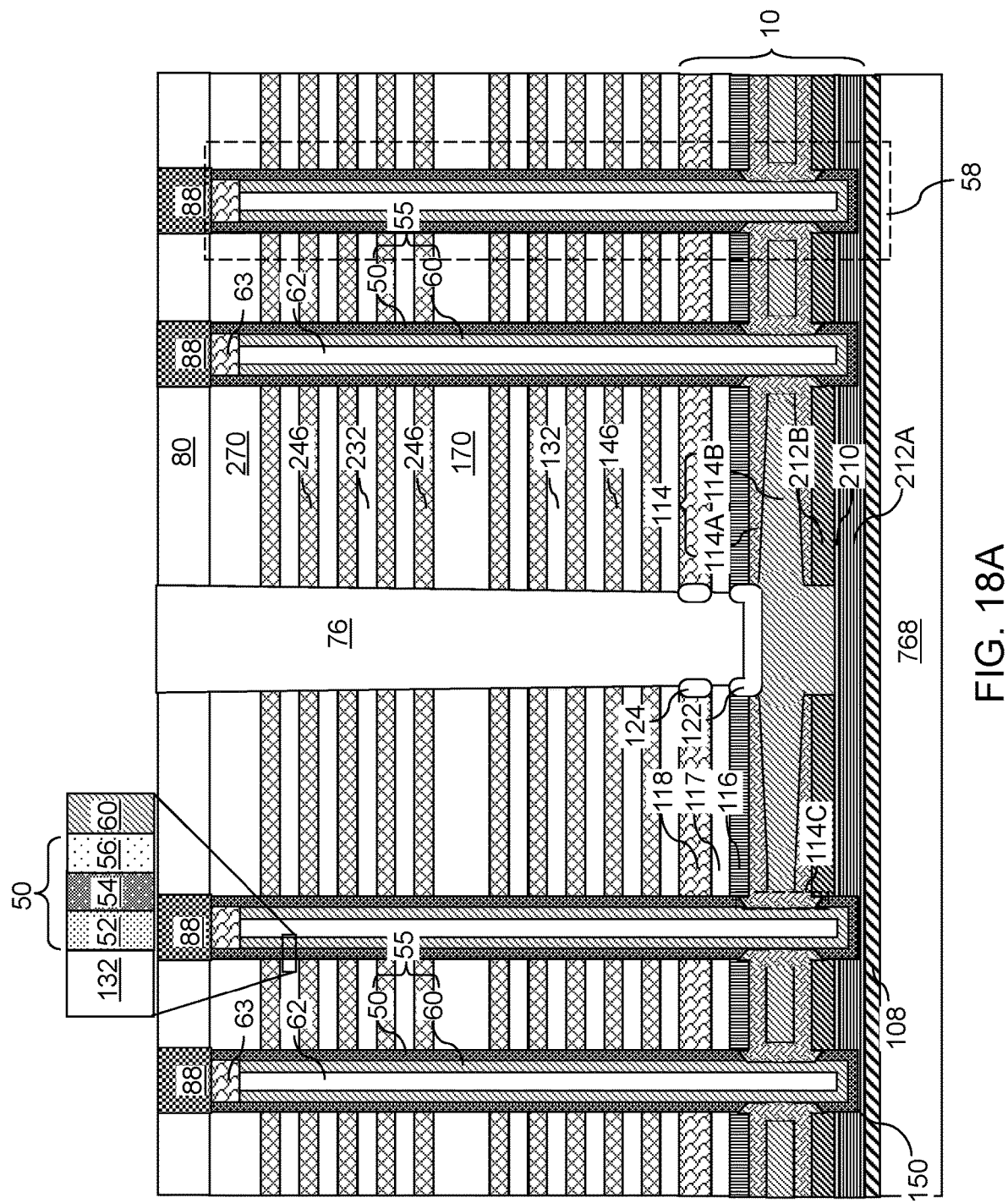
FIG. 18A is a vertical cross-sectional view of the memory region of the first exemplary structure after formation of dielectric trench fill structures and various contact via structures according to the first embodiment of the present disclosure.
Figure 18B:
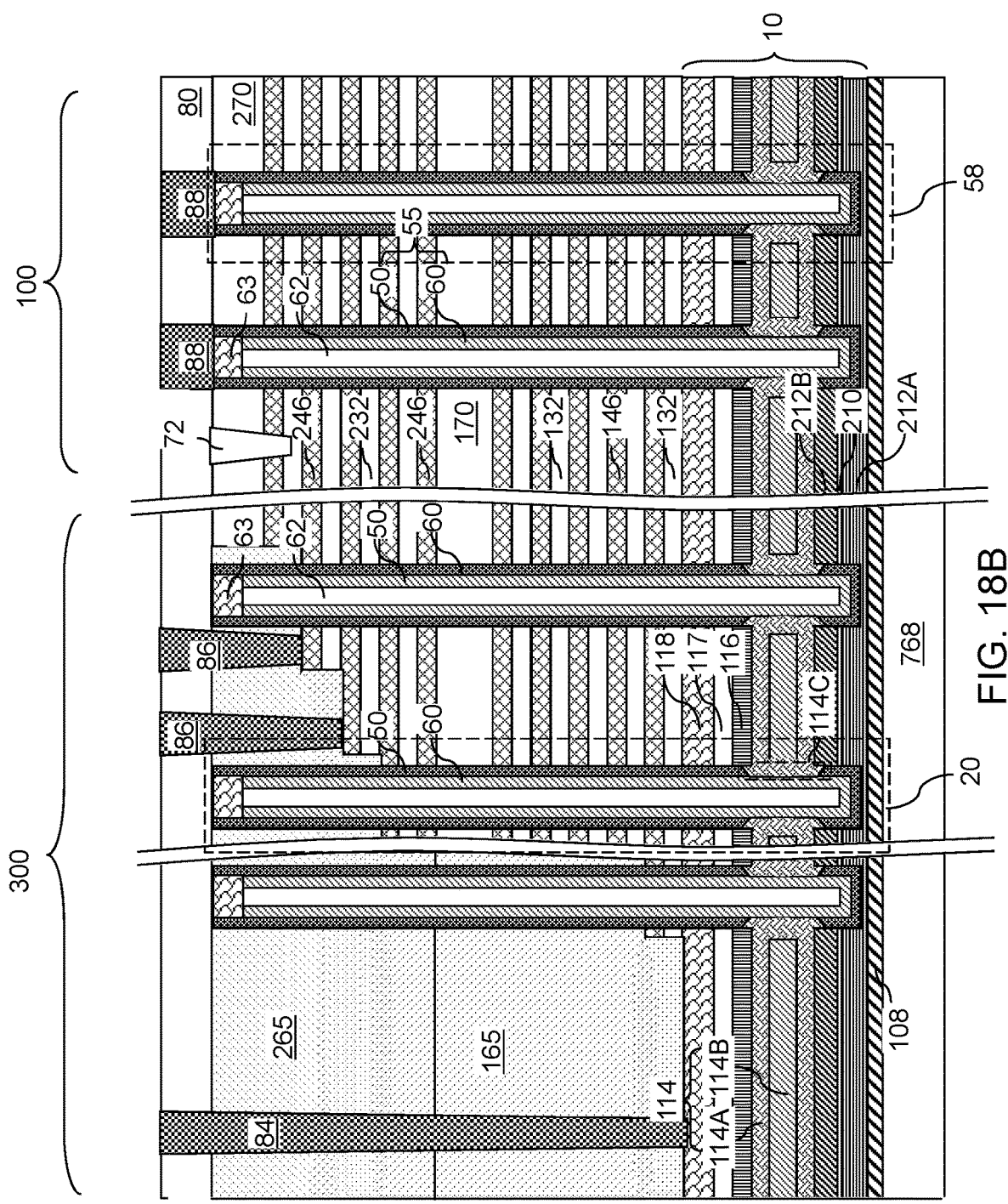
FIG. 18B is a vertical cross-sectional view of another region of the first exemplary structure after the processing step of FIG. 18A.

Referring to FIGS. 18A and 18B, an insulating material can be deposited in the backside trenches 79 by a conformal deposition process. Excess portions of the insulating material deposited over the top surface of the contact level dielectric layer 80 can be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 can vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart one from another along the second horizontal direction hd2.

A photoresist layer can be applied over the contact level dielectric layer 80, and can be lithographically patterned to form various contact via openings. For example, openings for forming drain contact via structures can be formed in the memory array region 100, and openings for forming staircase region contact via structures can be formed in the staircase region 300. An anisotropic etch process is performed to transfer the pattern in the photoresist layer through the second and contact level dielectric layers (282, 80) and underlying dielectric material portions. The drain regions 63 and the electrically conductive layers (146, 246) can be used as etch stop structures. Drain contact via cavities can be formed over each drain region 63, and staircase-region contact via cavities can be formed over each electrically conductive layer (146. 246) at the stepped surfaces underlying the first and second retro-stepped dielectric material portions (165, 265). A source-select-level via cavity extending to the source-select-level conductive layer 118 can be formed through the first and second retro-stepped dielectric material portions (165, 265). The photoresist layer can be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive strips (146, 246). The staircase-region contact via structures 86 can include drain select level contact via structures that contact a subset of the second electrically conductive strips 246 that function as drain select level gate electrodes. Further, the staircase-region contact via structures 86 can include word line contact via structures that contact electrically conductive strips (146, 246) that underlie the drain select level gate electrodes and function as word lines for the memory stack structures 55. A source-select-level via structure 84 can be formed in the source-select-level via cavity to provide electrical contact to the source-select-level conductive layer 118

Additional peripheral-region via structures (not shown) can be formed through the second and contact level dielectric layers (282, 80), the second and first retro-stepped dielectric material portions (265, 165), and the at least one second dielectric layer 768 to top surfaces of the lower metal interconnect structure 780 in the peripheral region 200.

Figure 19:
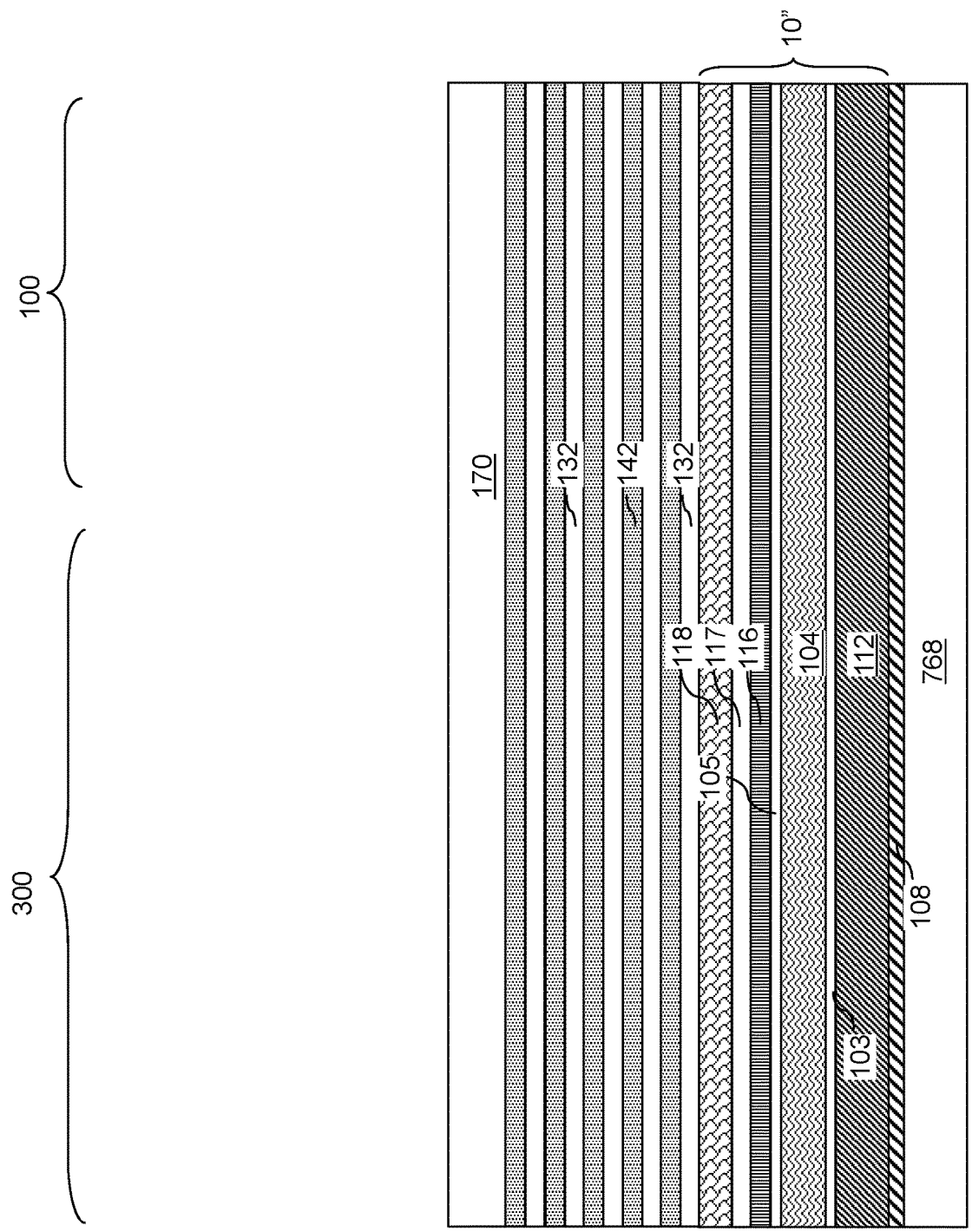
FIG. 19 is a vertical cross-sectional view of a second exemplary structure after formation of a first-tier alternating stack of first insulating layers and first spacer material layers according to a second embodiment of the present disclosure.

Referring to FIG. 19, a second exemplary structure according to a second embodiment of the present disclosure can be derived from the first exemplary structure of FIG. 1 by forming a lower source-level semiconductor layer 112 in lieu of a combination of a first lower source-level semiconductor layer 212A, a semiconductor oxide tunneling layer 210, a second lower source-level semiconductor layer 212B of the first exemplary structure. Thus, the in-process source-level material layer 10" of the second embodiment can include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118. The composition of the lower source-level semiconductor layer 112 can be the same as the composition of the second lower source-level semiconductor layer 212B of the first embodiment. The thickness of the lower source-level semiconductor layer 112 can be in a range from 20 nm to 600 nm, such as from 40 nm to 300 nm, although lesser and greater thicknesses can also be used.

Processing steps of the first embodiment from the processing steps of FIG. 2 to the processing steps of FIGS. 11A and 11B can be performed. A source cavity 119 is formed by removal of the source-level sacrificial layer 104 and portions of the memory films 50 at the level of the source cavity 119. A bottom surface of the upper source-level semiconductor layer 116 and a top surface of the lower source-level semiconductor layer 112 are physically exposed upon formation of the source cavity 119.

Figure 20A:
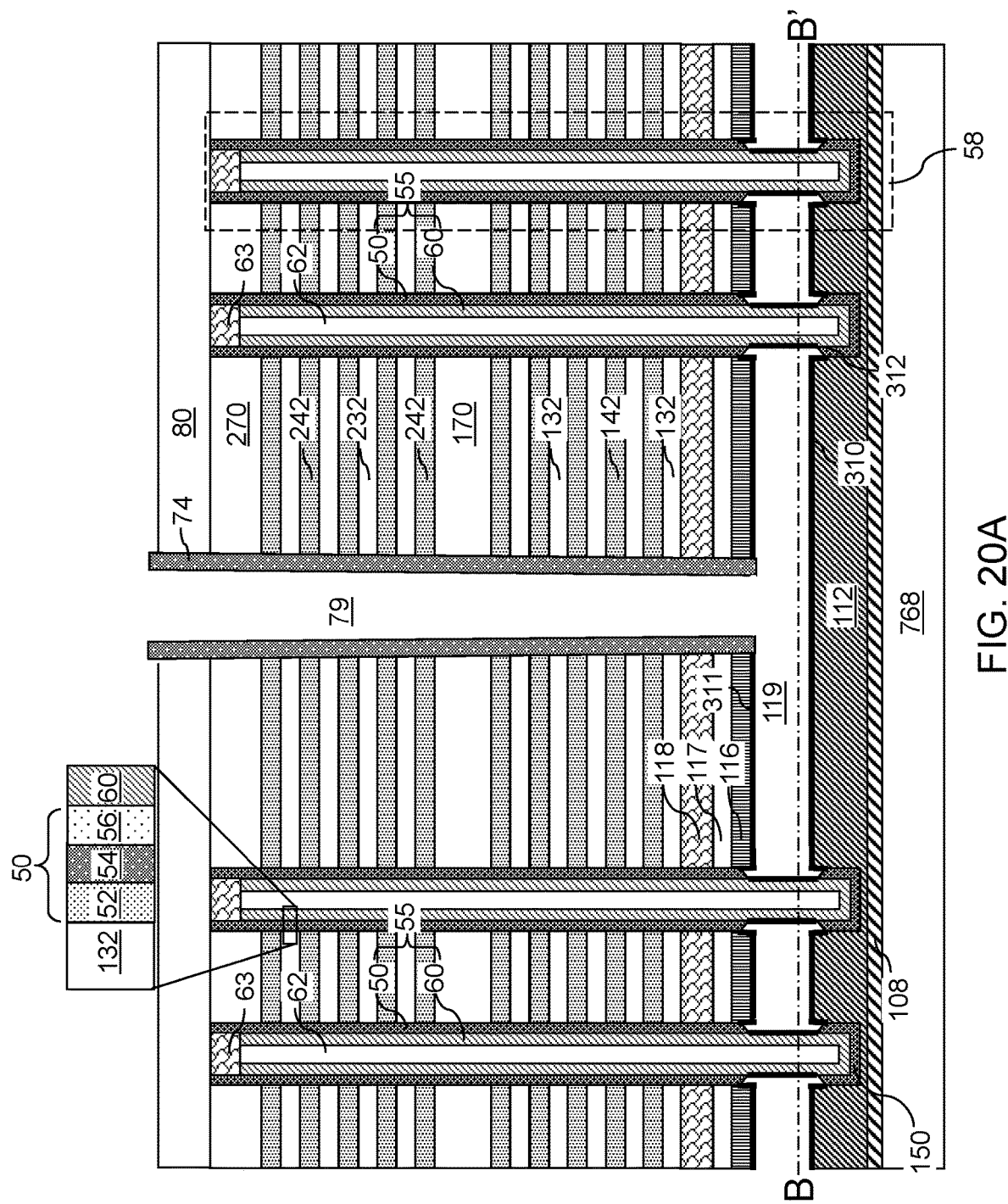
FIG. 20A is a vertical cross-sectional view of the second exemplary structure after expansion of the source cavity and formation of semiconductor oxide tunneling layers according to the second embodiment of the present disclosure.
Figure 20B:
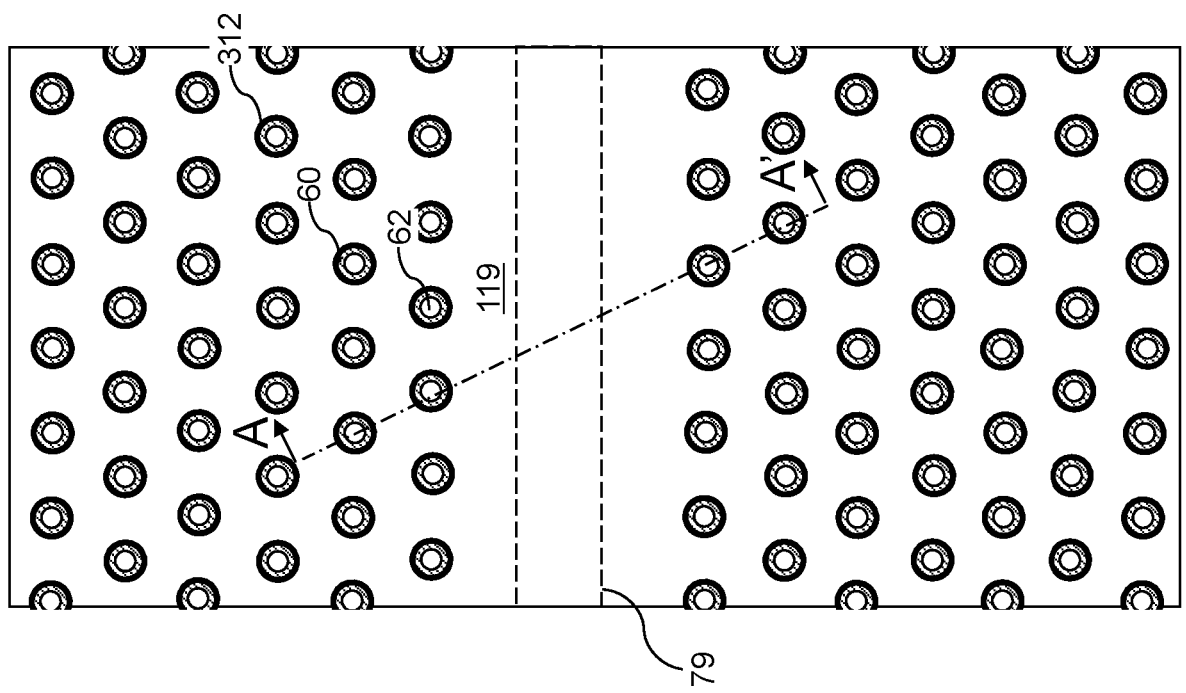
FIG. 20B is a top-down view of the second exemplary structure of FIG. 20A. The plane A-A' is the plane of the vertical cross-section of FIG. 20A.

Referring to FIGS. 20A and 20B, an outer sidewall of each vertical semiconductor channel 60 is physically exposed to the source cavity 119 after removing the physically exposed portions of the memory films 50. Thus, outer sidewalls of the vertical semiconductor channels 60 are physically exposed by removing portions of the memory films 50 at the level of the source cavity 119. A memory material cap 150 is formed underneath each physically exposed cylindrical surface of the vertical semiconductor channels 60. Each memory material cap 150 is a remaining portion of the memory films 50, and includes the same memory material cap as the memory films 50. The memory material caps 150 are within the lower source-level semiconductor layer 112. Each of the memory material caps 150 includes a planar cap portion 150P underlying a bottommost surface of a respective one of the vertical semiconductor channels 60, and a cylindrical cap portion 150C laterally surrounding a bottom portion of the respective one of the vertical semiconductor channels 60.

An oxidation process is performed to convert physically exposed surfaces portions of semiconductor materials into semiconductor oxide layers. The thicknesses of the semiconductor oxide layers to be formed are selected such that that charge carrier tunneling (such as electron tunneling) is possible across the semiconductor oxide layers, and the semiconductor oxide layers do not provide electrical insulation thereacross. As such, the semiconductor oxide layers formed by the oxidation process are referred to as semiconductor oxide tunneling layers (310, 311, 312). Thermal oxidation or plasma oxidation can be used for the oxidation process.

The semiconductor oxide tunneling layers (310, 311, 312) are formed after physically exposing the outer sidewalls of the vertical semiconductor channels 60. The semiconductor oxide tunneling layers (310, 311, 312) can include a first semiconductor oxide tunneling layer 310 that is formed by oxidation of a surface portion of the lower source-level semiconductor layer 112, a second semiconductor oxide tunneling layer 311 that is formed by oxidation of a surface portion of the upper source-level semiconductor layer 116, and cylindrical semiconductor oxide tunneling layers 312 that is formed by oxidation of surface portions of the vertical semiconductor channels 60 underneath the outer sidewalls of the vertical semiconductor channels 60 concurrently with formation of the first and second semiconductor oxide tunneling layers (310, 311). Thus, the first semiconductor oxide tunneling layer 310 is formed on a top surface of the lower source-level semiconductor layer 112, and the second semiconductor oxide tunneling layer 311 is formed on a bottom surface of the upper source-level semiconductor layer 116.

Each of the semiconductor oxide tunneling layers (310, 311, 312) can have a thickness that allows charge carrier tunneling (e.g., electron tunneling) therethrough so that the source contact layer to be subsequently formed is electrically connected to, and remain at a same electric potential as, the bottom portions of the vertical semiconductor channels 60, the lower source-level semiconductor layer 112, and the upper source-level semiconductor layer 116 during operation of the semiconductor device. Each of the semiconductor oxide tunneling layers (310, 311, 312) can have a thickness in a range from 0.5 nm to 3 nm, such as from 0.7 nm to 1.5 nm. In one embodiment, each of the first and second semiconductor oxide tunneling layers (310, 311) can be a thermal silicon oxide layer including dopants of the second conductivity type and free of carbon. The cylindrical semiconductor oxide tunneling layers 312 can be a thermal silicon oxide layer including dopants of the first conductivity type and free of carbon.

Figure 21:
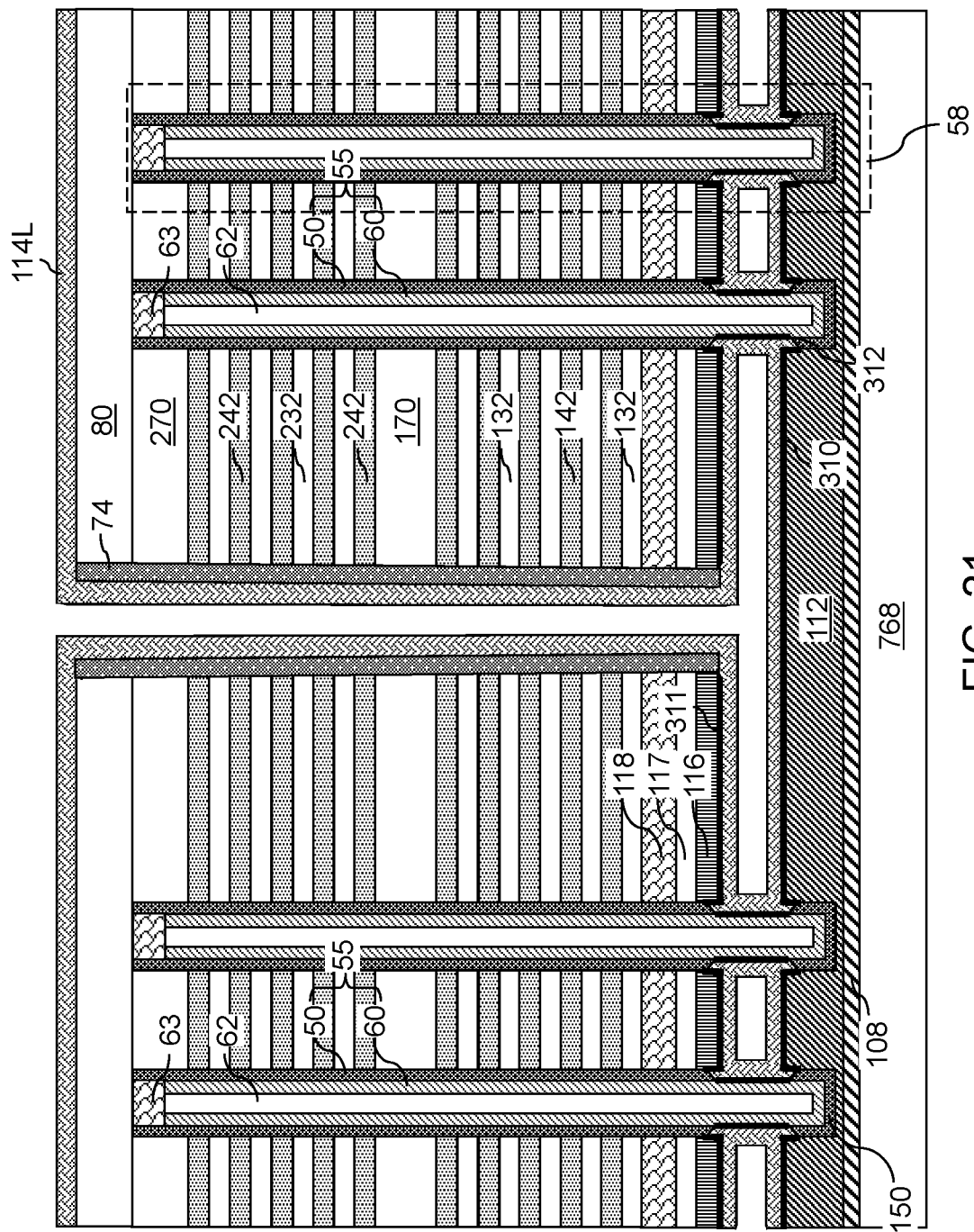
FIG. 21 is a vertical cross-sectional view of the second exemplary structure after formation of a continuous source contact semiconductor layer according to the second embodiment of the present disclosure.

Referring to FIG. 21, the processing steps of FIG. 12 can be performed to form a continuous source contact semiconductor layer 114L, which can have the same composition and thickness as in the first embodiment.

Figure 22:
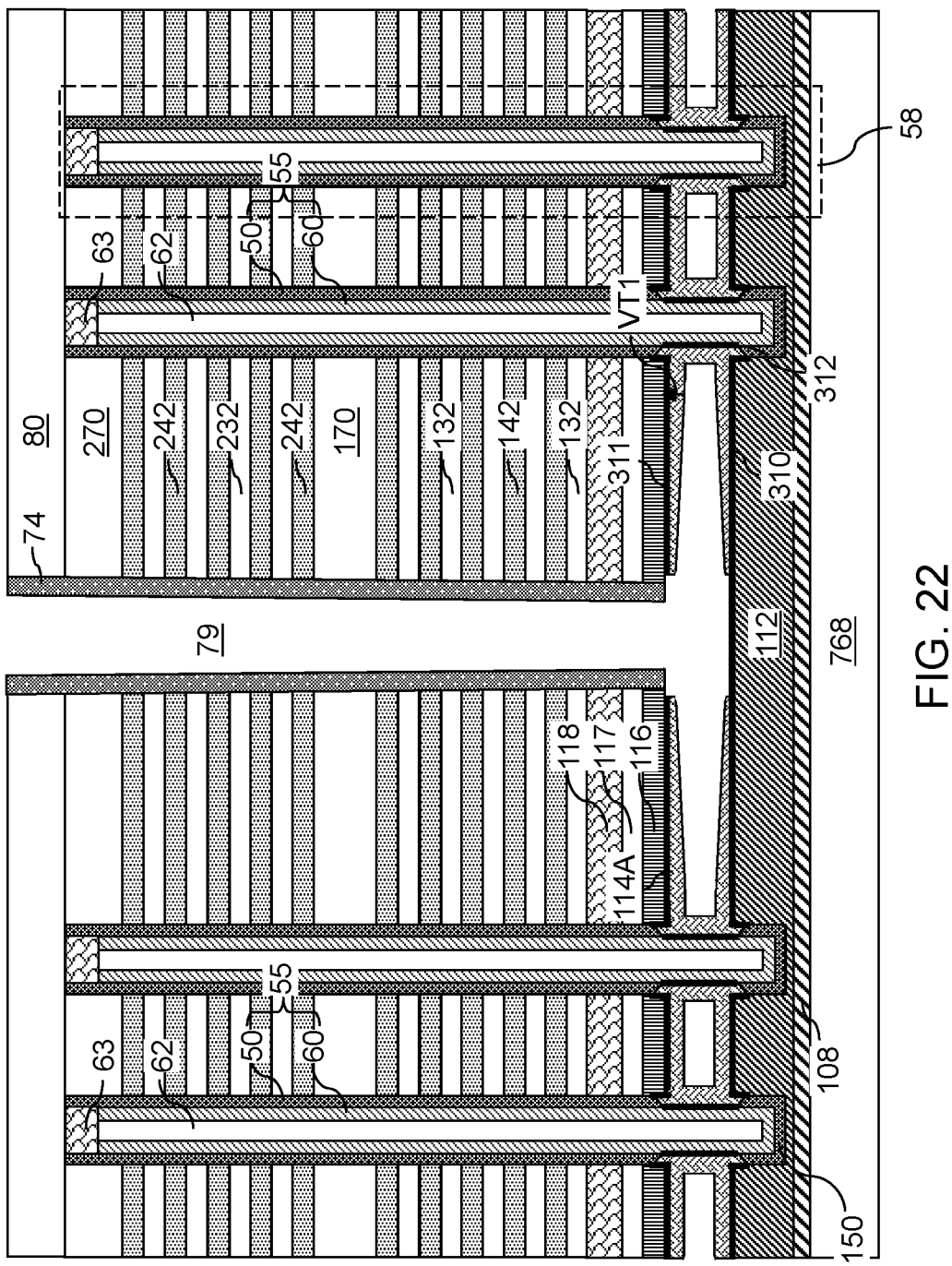
FIG. 22 is a vertical cross-sectional view of the second exemplary structure after formation of a first source contact semiconductor layer according to the second embodiment of the present disclosure.

Referring to FIG. 22, a semiconductor material etch back process is performed on the continuous source contact semiconductor layer 114L. The semiconductor material etch back process can include an anisotropic etch process using chlorine chemistry. Portions of the continuous source contact semiconductor layer 114L overlying the contact level dielectric layer 80, portions of the continuous source contact semiconductor layer 114L located within the backside trenches 79, and portions of the continuous source contact semiconductor layer 114L underlying the backside trenches 79 and overlying the first semiconductor oxide tunneling layer 310 can be removed by the semiconductor material etch back process. In this case, the first semiconductor oxide tunneling layer 310 can be used as an etch stop layer. In one embodiment, the semiconductor material etch back process can include the same anisotropic etch process as in the first embodiment. The anisotropic etch process is highly selective to semiconductor oxide materials, and thus, the semiconductor oxide tunneling layer 210 having a thickness in a range from 0.5 nm to 3 nm can function as a suitable etch stop layer. The selectivity of the anisotropic etch process can be further enhanced by reducing the RF power and reducing the etch rate.

Surface portions of the continuous source contact semiconductor layer 114L located within the source cavity 119 and laterally spaced from, i.e., laterally offset from, the backside trenches 79 are collaterally etched during the semiconductor material etch back process. Thus, tapered surfaces are formed in remaining portion of the continuous source contact semiconductor layer 114L. The remaining portion of the continuous source contact semiconductor layer 114L after the semiconductor material etch back process constitutes a first source contact semiconductor layer 114A. The first source contact semiconductor layer 114A comprises regions having a first variable thickness VT1 that increases with a lateral distance from the backside trenches 79.

Figure 23:
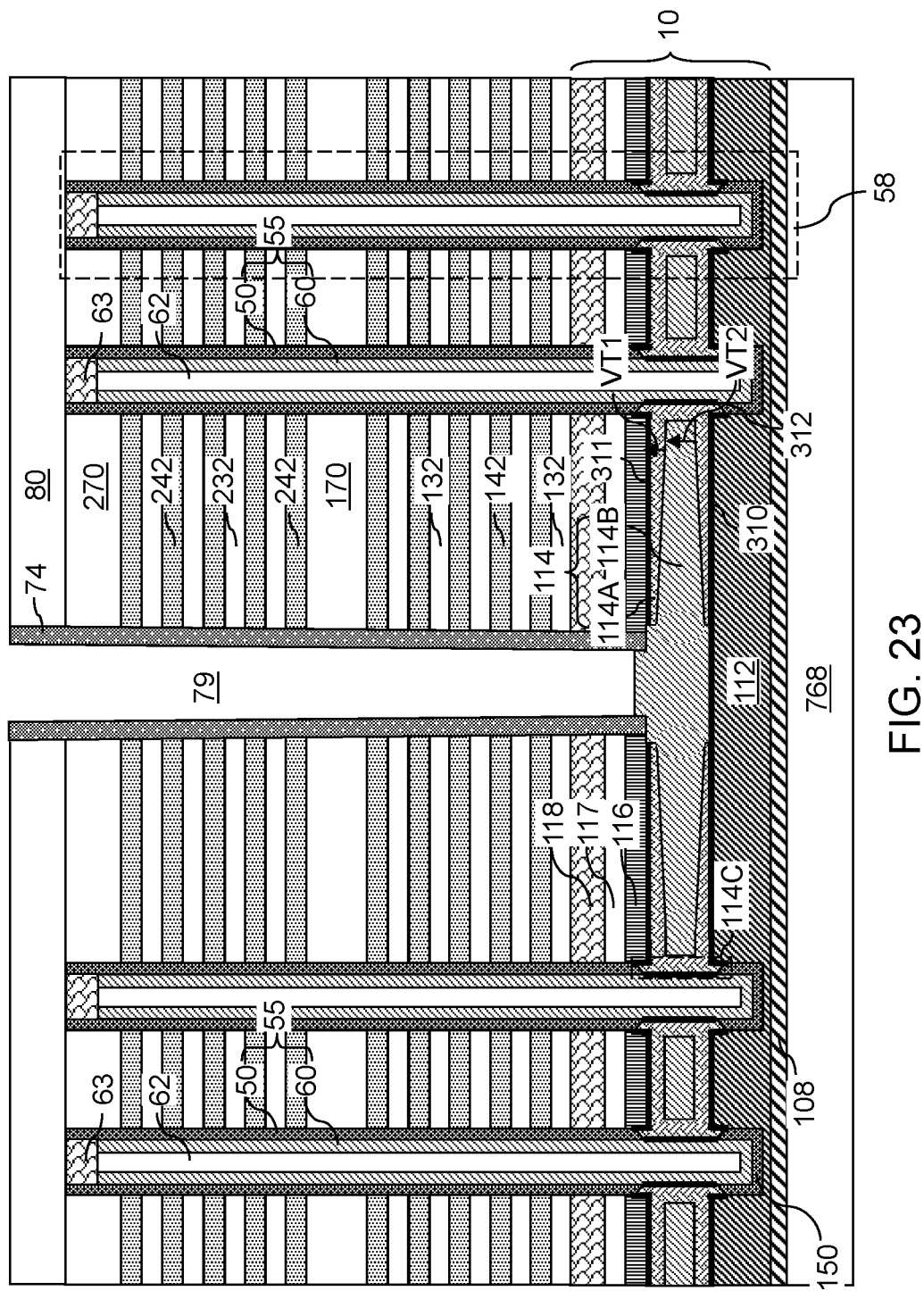
FIG. 23 is a vertical cross-sectional view of the second exemplary structure after formation of a second source contact semiconductor layer according to the second embodiment of the present disclosure.

Referring to FIG. 23, a second source contact semiconductor layer 114B can be formed by performing the same processing steps as the processing steps of FIG. 14. The combination of the first source contact semiconductor layer 114A and the second source contact semiconductor layer 114B constitutes a source contact layer 114. The source contact layer 114 is formed directly on each of the cylindrical semiconductor oxide tunneling layers 312, the first semiconductor oxide tunneling layer 310, and the second semiconductor oxide tunneling layer 311.

The tapered surfaces and the first variable thickness VT1 of the first source contact semiconductor layer 114A facilitates seamless filling of the remaining volume of the source cavity 119 by the second doped semiconductor material. The second doped semiconductor material has a doping of the second conductivity type, and may be the same as the first doped semiconductor material in composition. Further, the second conformal semiconductor deposition can use any of the conformal semiconductor deposition methods that can be used for the first conformal semiconductor deposition. In one embodiment, the duration of the second conformal semiconductor deposition can be selected such that the entirety of the remaining volume of the source cavity 119 is filled by the second source contact semiconductor layer 114B.

The second source contact semiconductor layer 114B is laterally surrounded by the first source contact semiconductor layer 114A, contacts a bottom surface of an upper portion of the first source contact semiconductor layer 114A, and contacts a top surface of a lower portion of the first source contact semiconductor layer 114A. The second source contact semiconductor layer 114B is laterally spaced from each of the vertical semiconductor channels 60 by the first source contact semiconductor layer 114A. The first source contact semiconductor layer 114A comprises regions having a first variable thickness VT1 that decreases with the lateral distance from a most proximal one of the vertical semiconductor channels 60 and increases with a lateral distance from the backside trenches 79, i.e., the lateral distance from a most proximal one of the backside trenches 79. The second source contact semiconductor layer 114B comprises regions having a second variable thickness that increases with the lateral distance from the most proximal one of the vertical semiconductor channels 60, and decreases with the lateral distance from the backside trenches 79, i.e., the least lateral distance from the most proximal one of the backside trenches 79.

The source contact layer 114 is formed directly on each of the semiconductor oxide tunneling layers (310, 311, 312). Each of the vertical semiconductor channels 60 vertically extends through, and is electrically connected to, the source contact layer 114 such that the electrical potential of the bottom ends of the vertical semiconductor channels 60 are the same as the electrical potential of the source contact layer 114. In other words, the bottom ends of the vertical semiconductor channels 60 are electrically connected to the source contact layer 114. The source contact layer 114 comprises cylindrical source contact material portions 114C. Each of the cylindrical source contact material portions 114C is more proximal to a respective one of the vertical semiconductor channels 60 than an outer sidewall of a memory film 50 that laterally surrounds the respective one of the vertical semiconductor channels 60 is to the respective one of the vertical semiconductor channels 60. In one embodiment, the number of the cylindrical source contact material portions 114C can be the same as the number of the vertical semiconductor channels 60.

While various embodiments are described in the present disclosure using an embodiment in which two semiconductor material deposition processes and one semiconductor material etch back process are used, the methods of various embodiments can use more than two semiconductor material deposition processes and more than one semiconductor material etch back process. Generally, the source contact layer 114 of various embodiments can be formed by performing at least two semiconductor material deposition processes and at least one semiconductor material etch back process that employs the semiconductor oxide tunneling layer 210 as an etch stop layer.

The layer stack including the lower source-level semiconductor layer 112, the first semiconductor oxide tunneling layer 310, the source contact layer 114, the second semiconductor oxide tunneling layer 311, and the upper source-level semiconductor layer 116, and the cylindrical semiconductor oxide tunneling layers 312 constitutes a buried source layer (112, 310, 114, 311, 116, 312), which function as a common source region that is connected each of the vertical semiconductor channels 60 and has a doping of the second conductivity type. The average dopant concentration in the semiconductor materials of the buried source layer (112, 310, 114, 311, 116, 312) can be in a range from $5.0 \times 10^{19}/cm^3$ to $2.0 \times 10^{21}/cm^3$, although lesser and greater dopant concentrations can also be used. The set of layers including the buried source layer (112, 310, 114, 311, 116, 312), the source-level insulating layer 117, and the optional source-select-level conductive layer 118 constitutes a source-level material layer stack 10, which replaces the in-process source-level material layer stack 10".

Figure 24A:
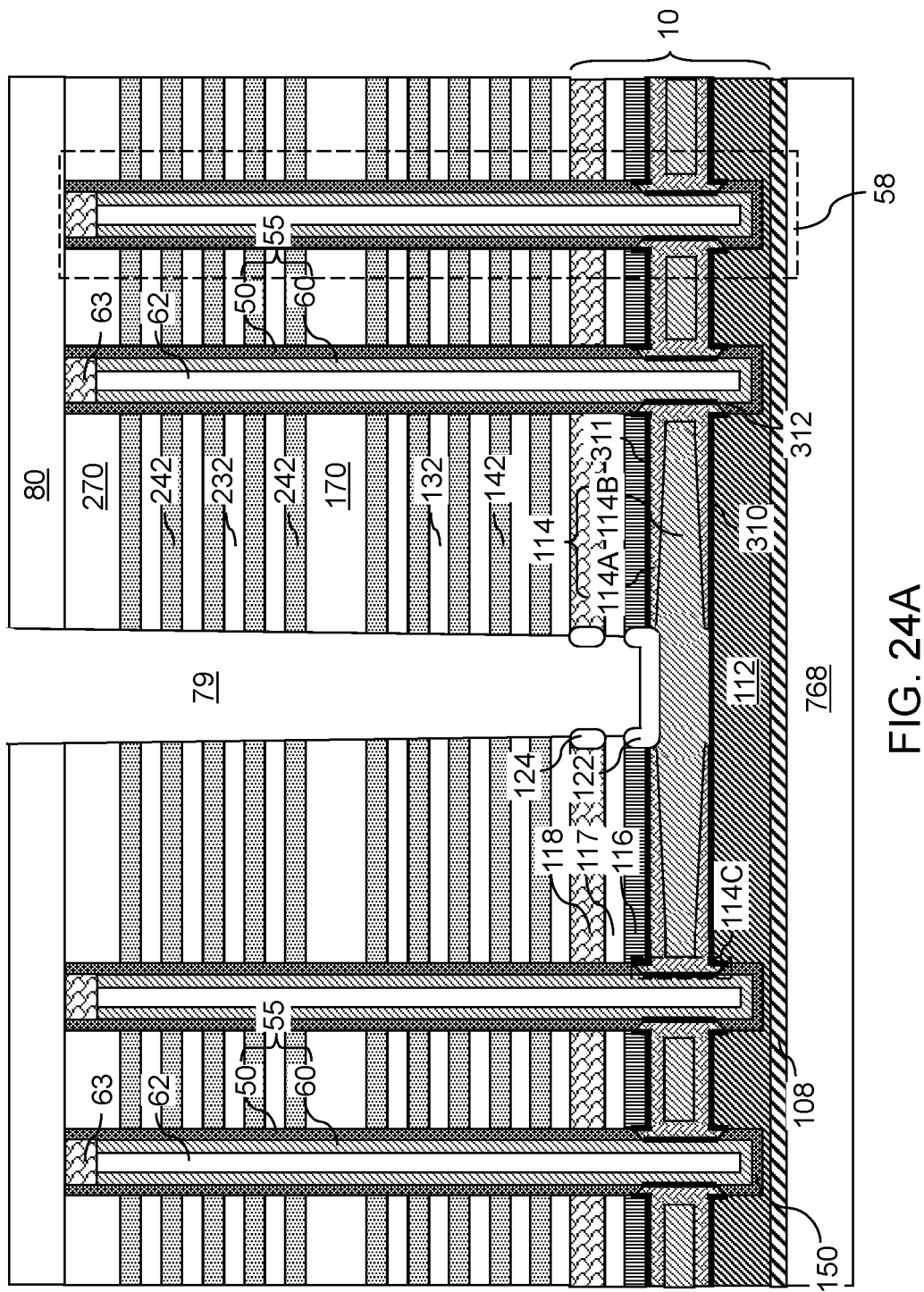
FIG. 24A is a vertical cross-sectional view of the second exemplary structure after formation of semiconductor oxide structures according to the second embodiment of the present disclosure.
Figure 24B:
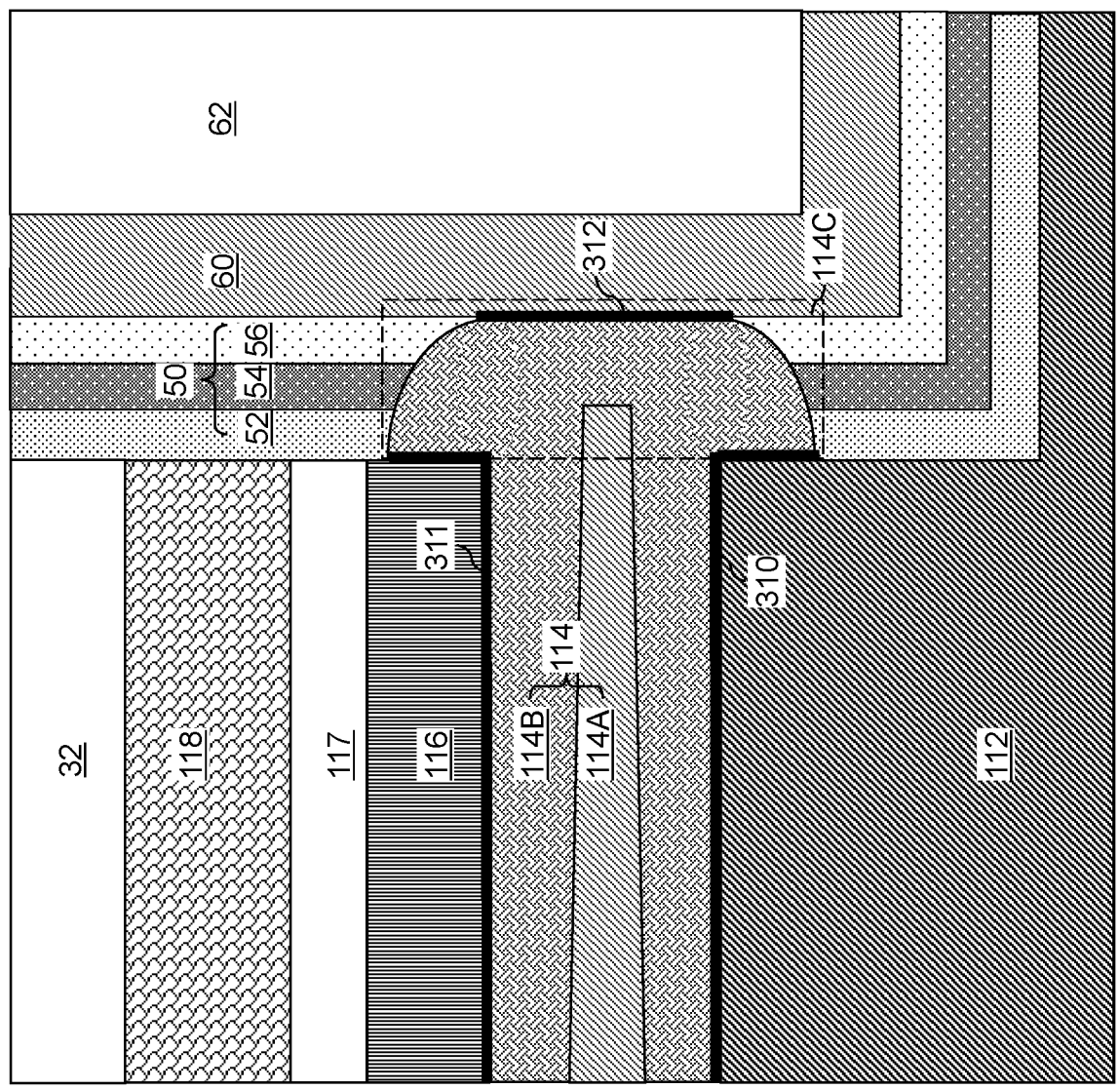
FIG. 24B is a vertical cross-sectional view of a bottom corner of a memory opening fill structure at the processing step of FIG. 24A.

Referring to FIGS. 24A and 24B, the processing steps of FIGS. 15A and 15B can be performed to form semiconductor oxide structures (122, 124), which can include U-shaped semiconductor oxide portions 122 and annular semiconductor oxide material portions 124.

Figure 25:
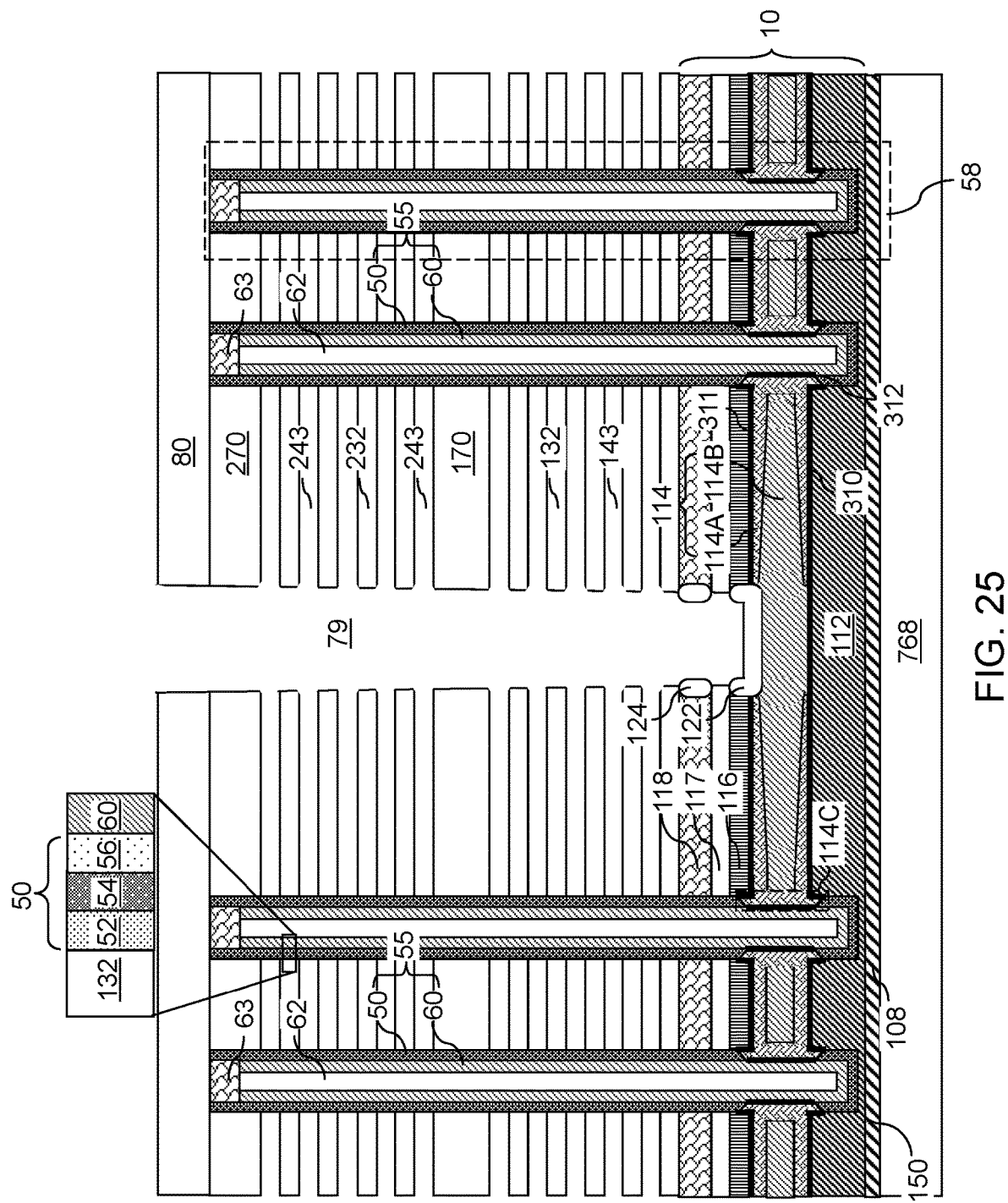
FIG. 25 is a vertical cross-sectional view of the second exemplary structure after formation of backside recesses according to the second embodiment of the present disclosure.

Referring to FIG. 25, the processing steps of FIG. 16 can be performed to form backside recesses (143, 243).

Figure 26:
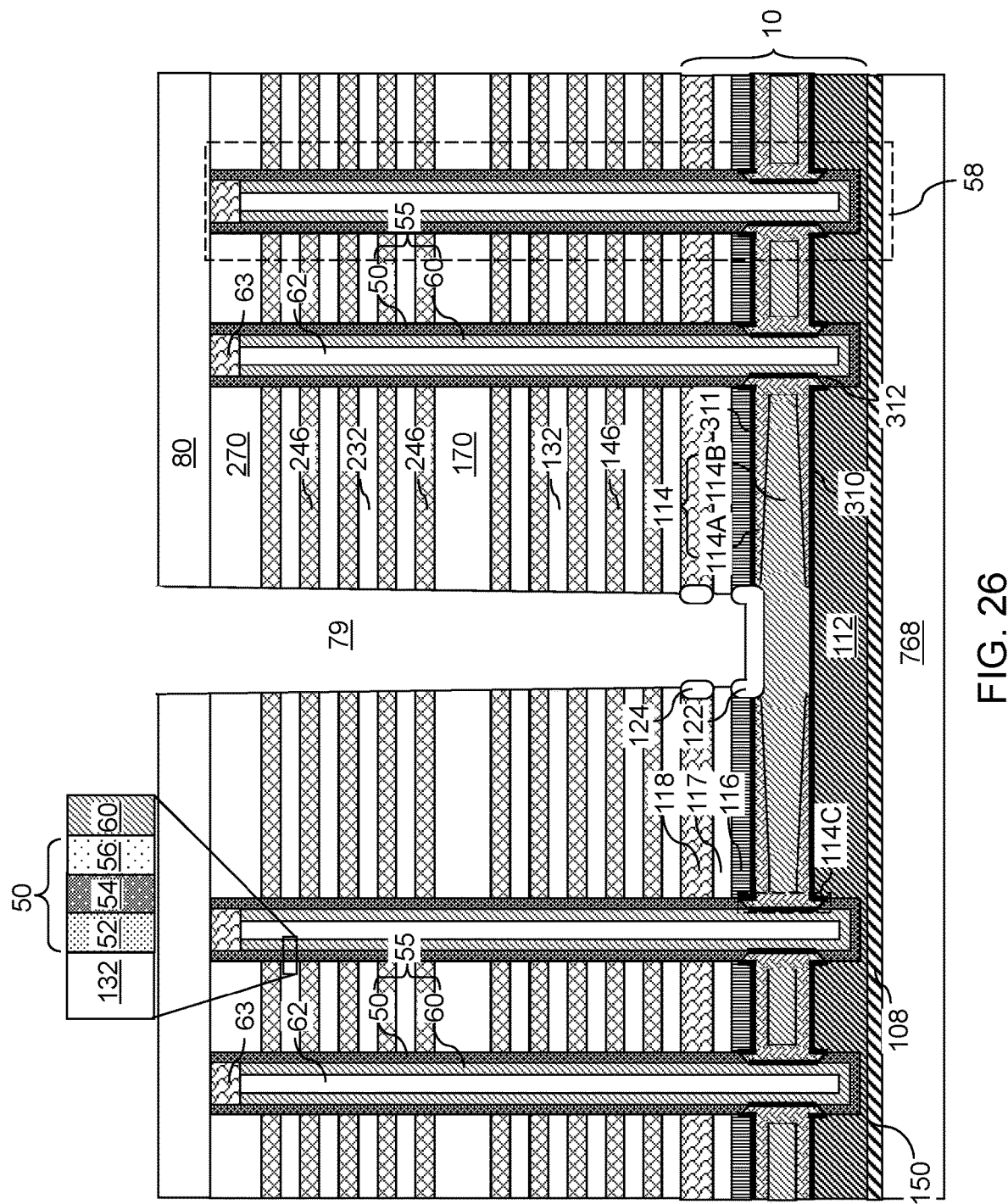
FIG. 26 is a vertical cross-sectional view of the second exemplary structure after formation of electrically conductive layers in the backside recesses according to the second embodiment of the present disclosure.

Referring to FIG. 26, the processing steps of FIG. 17 can be performed to from electrically conductive layers (146, 246).

Figure 27A:
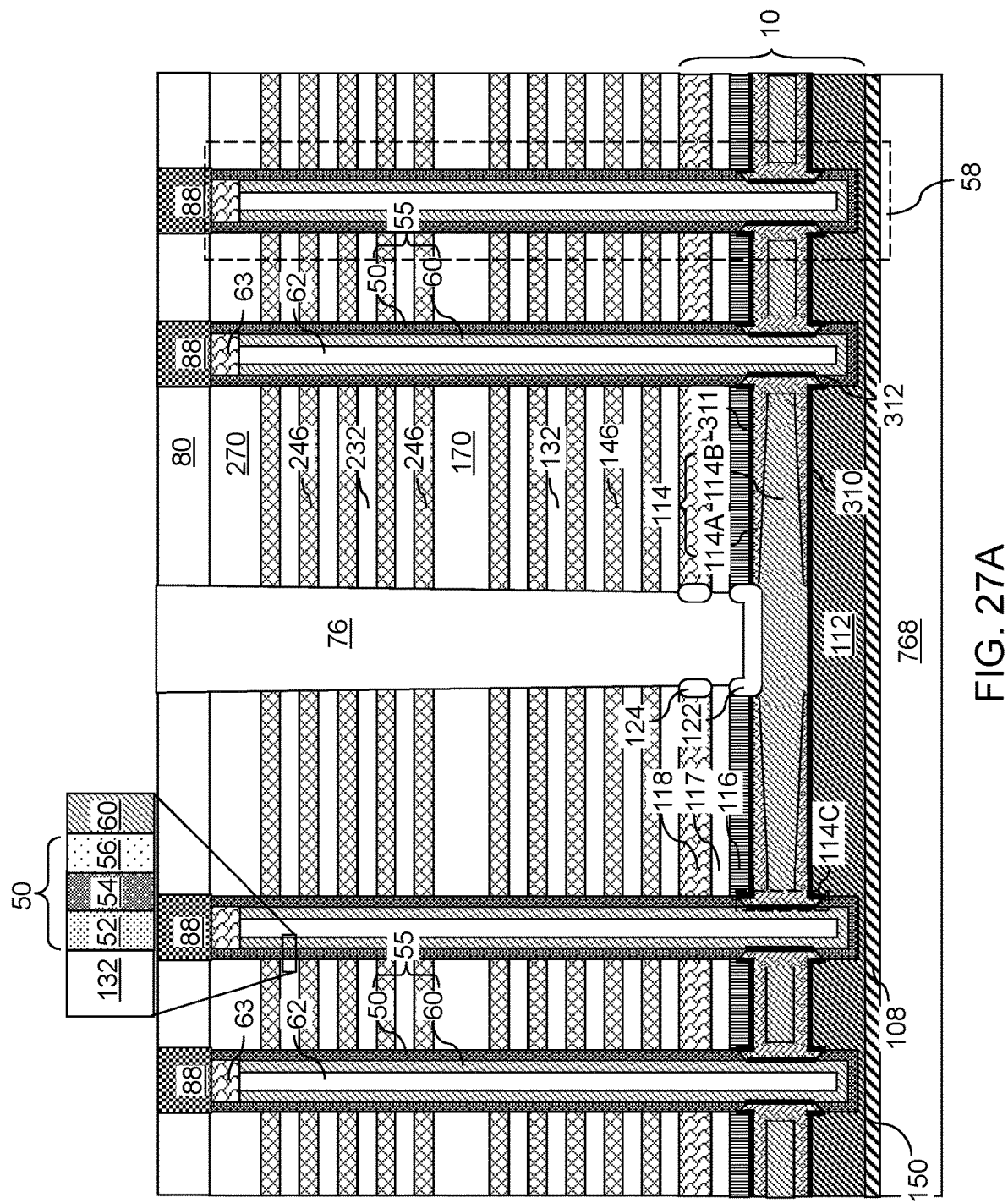
FIG. 27A is a vertical cross-sectional view of the memory region of the second exemplary structure after formation of dielectric trench fill structures and various contact via structures according to the second embodiment of the present disclosure.
Figure 27B:
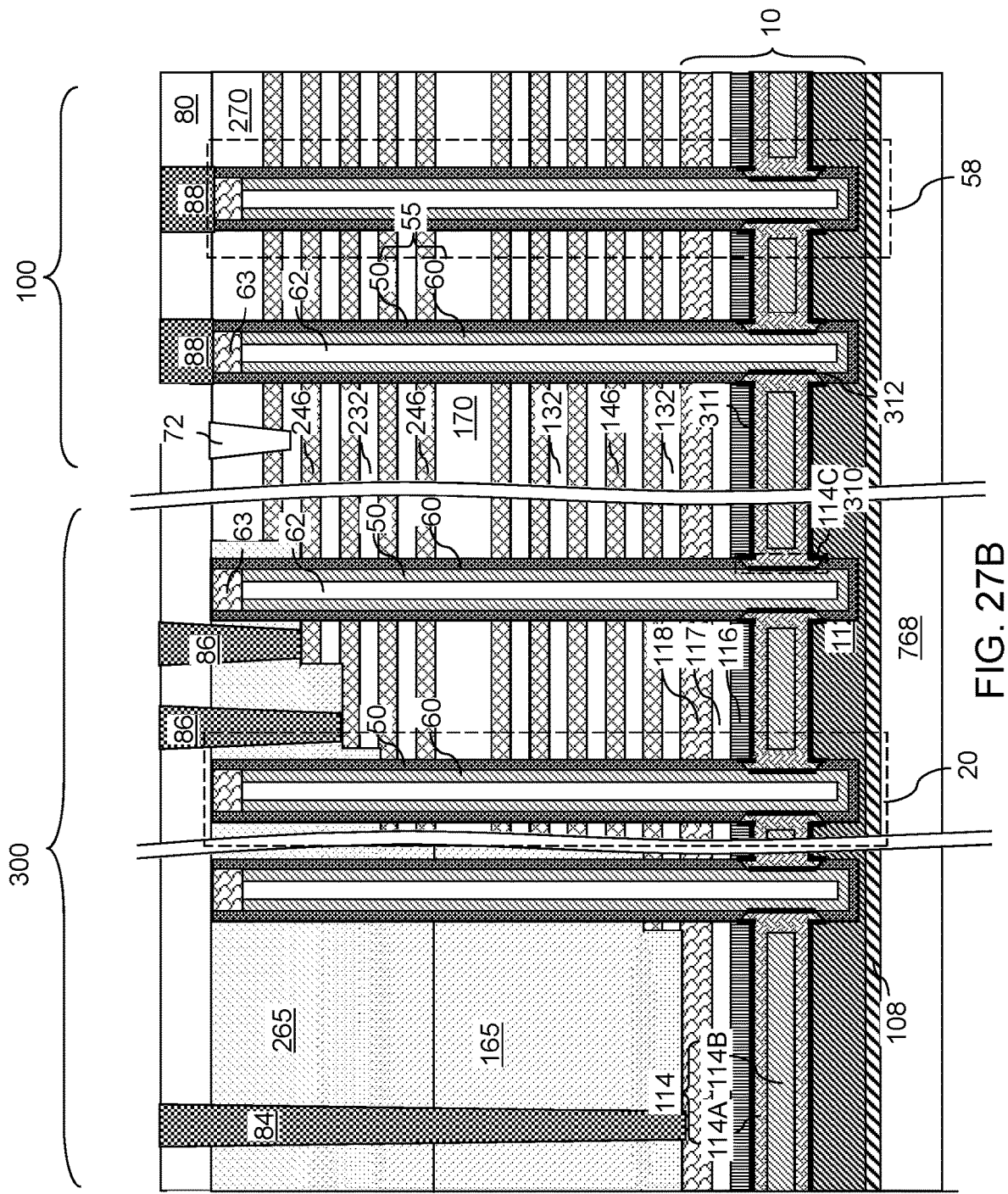
FIG. 27B is a vertical cross-sectional view of another region of the second exemplary structure after the processing step of FIG. 27A.

Referring to FIGS. 27A and 27B, dielectric trench fill structures 76 and various contact via structures (88, 86, 84) can be formed as in the first embodiment.

Figure 28:
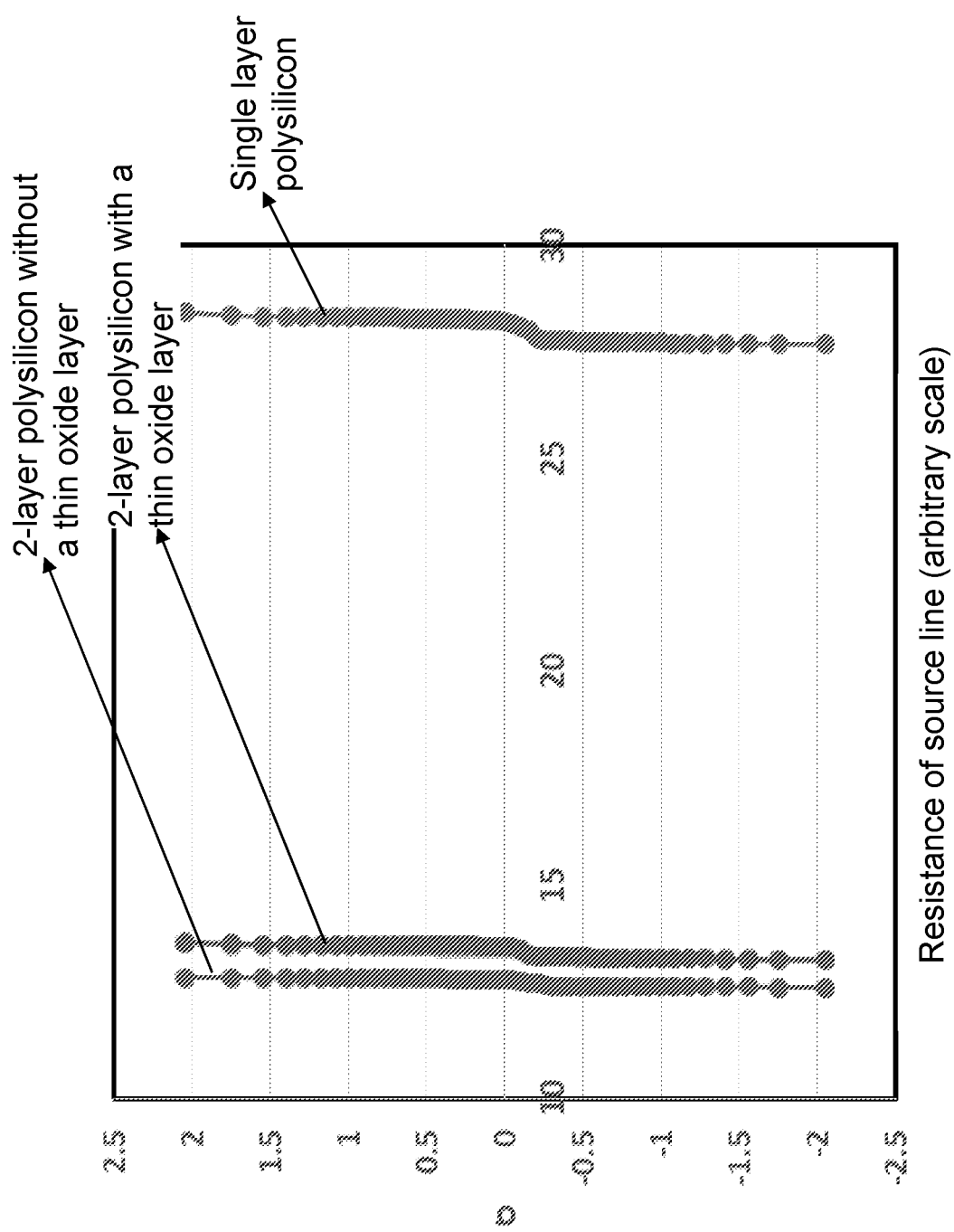
FIG. 28 is a graph illustrating the distribution of source line resistance for three different processes.

FIG. 28 is a graph illustrating the distribution of source line resistance for three different processes. The horizontal axis represents measured resistance of the source line, and the vertical axis represents the standard deviation that corresponds to individual data points for each set of data. If a single n-doped polysilicon layer is used to fill the source cavity, the resistance of the source line may be high as represented by the distribution of the source line resistance using a "single layer polysilicon." The distribution represented by the "2-layer polysilicon with a thin oxide layer" corresponds to the distribution of source line resistance provided by the source-level material layer stack according to the first embodiment of the present disclosure. The distribution represented by the "2-layer polysilicon without a thin oxide layer" corresponds to the distribution of source line resistance provided by the buried source contact including two layers of polysilicon without any semiconductor oxide tunneling layer therebetween, which does not use any etch stop layer and is prone to etching through the entirety of the lower source-level semiconductor layer and physically exposing a metal plate layer, thereby causing metal contamination. The increase in the resistance of the buried source contact due to the semiconductor oxide tunneling layer is minimal, while the semiconductor oxide tunneling layer provides the benefit of preventing metal contamination as an effective etch stop layer. Thus, a multi-layer n-doped semiconductor material fill process is preferred in order to reduce the source resistance while preventing physical exposure of the metal plate layer or metal contamination.

Referring to all drawings and according to all embodiments of the present disclosure, a three-dimensional memory device is provided, which comprises: a source-level material layer stack 10 located over a substrate 8 and comprising, from bottom to top, a lower source-level semiconductor layer (212A or 112), a semiconductor oxide tunneling layer (210 or 310), a source contact layer 114 comprising a doped semiconductor material, and an upper source-level semiconductor layer 116; an alternating stack of electrically conductive layers (146, 246) and insulating layers (132, 232) located over the source-level material layer stack 10; and memory stack structures 55 that extend through the alternating stack {(132, 146), (232, 246)} and into an upper portion of the lower source-level semiconductor layer (212A or 112), wherein: each memory stack structure 55 includes a vertical semiconductor channel 60 and a memory film 50 laterally surrounding the vertical semiconductor channel 60; and each of the vertical semiconductor channels 60 vertically extends through, and is electrically connected to, the source contact layer 114.

In one embodiment, the semiconductor oxide tunneling layer (210, 310) consists of a semiconductor oxide material having a thickness in a range from 0.5 nm and 3 nm. In one embodiment, the source contact layer 114 comprises cylindrical source contact material portions 114C, wherein each of the cylindrical source contact material portions 114C is more proximal to a respective one of the vertical semiconductor channels 60 than an outer sidewall of a memory film 50 that laterally surrounds the respective one of the vertical semiconductor channels 60 is to the respective one of the vertical semiconductor channels 60.

In one embodiment, the source contact layer 114 comprises a first source contact semiconductor layer 114A and a second source contact semiconductor layer 114B; the second source contact semiconductor layer 114B is laterally surrounded by the first source contact semiconductor layer 114A, contacts a bottom surface of an upper portion of the first source contact semiconductor layer 114A, and contacts a top surface of a lower portion of the first source contact semiconductor layer 114A; and the second source contact semiconductor layer 114B is laterally spaced from each of the vertical semiconductor channels 60 by the first source contact semiconductor layer 114A. In one embodiment, the first source contact semiconductor layer 114A comprises regions having a variable thickness VT1 that decreases with a lateral distance from a most proximal one of the vertical semiconductor channels 60; and the second source contact semiconductor layer 114B comprises regions having a variable thickness VT2 that increases with the lateral distance from the most proximal one of the vertical semiconductor channels 60.

In one embodiment, memory material caps 150 are within the lower source-level semiconductor layer 114. Each of the memory material caps 150 includes a planar cap portion 150P underlying a bottommost surface of a respective one of the vertical semiconductor channels 60 and a cylindrical cap portion 150C laterally surrounding a bottom portion of the respective one of the vertical semiconductor channels 60. The semiconductor oxide tunneling layer (210, 310) directly contacts each of the memory material caps 150.

In one embodiment, the semiconductor oxide tunneling layer 210 directly contacts a sidewall of each of the memory material caps and is located below an upper periphery of the sidewall of each of the memory material caps 150. In one embodiment, the source-level material layer stack 10 further comprises an additional source-level semiconductor layer 212B contacting a top surface of the semiconductor oxide tunneling layer 210 and contacting a bottom surface of the source contact layer 114.

In one embodiment, the semiconductor oxide tunneling layer 310 directly contacts an upper periphery of a sidewall of each of the memory material caps 150. In one embodiment, the semiconductor oxide tunneling layer 310 contacts a bottom surface of the source contact layer 114.

In one embodiment, cylindrical semiconductor oxide tunneling layers 312 laterally surround, and contact, a respective one of the vertical semiconductor channels 60, and are laterally surrounded by, and are contacted by, the source contact layer 114. An additional semiconductor oxide tunneling layer 311 can contact a top surface of the source contact layer 114 and a bottom surface of the upper source-level semiconductor layer 116.

In one embodiment, each of the memory films 50 comprises a charge storage layer 54 and a tunneling dielectric 56; and each of the memory material caps 150 comprises a dielectric material layer 54 having a same composition and a same thickness as the charge storage layer 54 and another dielectric material layer 56 having a same composition and a same thickness as the tunneling dielectric 56.

According to another aspect of the present disclosure, a strap semiconductor layer that functions as a buried source line is provided, which employs a thin semiconductor oxide tunneling layer. The thin semiconductor oxide tunneling layer can be used as an etch stop layer to prevent exposure of an underlying metallic conductive layer, and to prevent metal contamination that can be cause by physical exposure of the metallic conductive layer. The thickness of the thin semiconductor oxide tunneling layer is selected such that charge carriers (such as electrons or holes) can tunnel through the thin semiconductor oxide tunneling layer. For example, the thickness of the thin semiconductor oxide tunneling layer can be in a range from 0.5 nm to 3 nm, such as from 0.7 nm to 1.5 nm, although lesser and greater thicknesses can also be used.

While sidewall portions of the doped semiconductor material can be etched at a greater etch rate than portions of the doped semiconductor material that are deposited at a bottom of each backside, the differential between the etch rate of the sidewall portions and the etch rate of the bottom portions of the doped semiconductor material may not be sufficient to ensure that the underlying metallic material layer is not physically exposed by collateral etching of the semiconductor material between the backside trenches and the metallic material layer. Thus, use of etch back processes without using the semiconductor oxide tunneling layers (210, 310, 311, 312) can physically expose the underlying metallic material layer (which can be a tungsten silicide layer) and induce metal contamination.

Reducing dopant concentration in a source contact semiconductor layer without use of a semiconductor oxide layer is not an adequate solution. While use of an n-doped semiconductor material having a lower concentration of n-type dopants can provide higher etch resistance than a highly n-doped semiconductor material that fills the source cavity, the lower concentration of the n-type dopants provide a higher resistance for the source contact semiconductor layer, thereby rendering the source contact semiconductor layer inadequate as a conductive path that augments the conductive paths provided by the metallic material layer and the source contact layer. In other words, in the case of use of inadequately doped or undoped semiconductor material directly on top of a metallic material layer underneath the source cavity, the buried source resistance (which is affected by the resistance of the portion including the inadequately doped or undoped semiconductor material) is excessively high. In addition, it is difficult to increase n-type dopant diffusion (such as diffusion of phosphorous as n-type dopants) into vertical semiconductor channels 60 or to obtain sufficient gate induced drain leakage (GIDL) hole current for a source side select gate in an erase operation under such conditions. Thus, use of undoped silicon or insufficiently doped silicon for a source material layer for the purpose of increasing etch selectively to protect the underlying metallic material layer causes unacceptable side effect of inducing high buried source line resistance and lower GIDL hole current for the source side select gate. As a consequence, use of a highly n-doped semiconductor material for the source contact semiconductor layer is necessary, which causes another problem of lack of etch selectivity during the etch back processes.

According to an aspect of the present disclosure, the above problem is solved through use of a semiconductor oxide tunneling layer (210, 310). The semiconductor oxide tunneling layer 210 can be inserted between the first and second lower source-level semiconductor layers (212A, 212B) in the first embodiment. Alternatively, the first semiconductor oxide tunneling layer 310 can be formed after formation of the source cavity 119 in the second embodiment. Even a thin semiconductor oxide layer (such as a silicon oxide layer) can function as an effective etch stop layer during etch back of a semiconductor material. The thickness of the thin semiconductor oxide layer is selected to enable significant electron tunneling therethrough such that the impact of the thin semiconductor oxide tunneling layer is minimal as far as source resistance is concerned. The semiconductor oxide material of the semiconductor oxide tunneling layers (210, 310, 311, 312) is a chemical oxide, which is thin enough to allow electron tunneling. The thin semiconductor oxide tunneling layer is a tunneling layer through which electrons can tunnel, and is not a barrier layer or an electrical insulation layer that prevents tunneling of electrons or flow of electrical current therethrough. Thus, the n-doped semiconductor layers above and below the semiconductor oxide tunneling layers (210, 310, 311, 312) are electrically connected, and electrically connected, to each other by electron tunneling therethrough, thereby providing low buried source line resistance.

Further, even in the cases in which portions of the semiconductor oxide tunneling layer (210, 310) underlying the backside trenches are etched through during later etch back processing steps, the first lower source-level semiconductor layer 212A or the lower source-level semiconductor layer 112 can protect the underlying metallic material layer and prevent physical exposure of the metallic material layer. Thus, embodiments of the present disclosure prevent metal contamination by preventing physical exposure of the metallic material layer 108 after formation of the backside trenches and during multiple repetitions of a semiconductor deposition process and a semiconductor etch back process that are used to provide a void-free fill of the source cavity. This feature does not rely on the ability to provide etch rate differential between the etch rate of sidewall portions of the semiconductor fill materials and the etch rate of the bottom portions of the semiconductor fill materials, but is enabled through use of the semiconductor oxide tunneling layer (210, 310) as an etch stop layer during the multiple repetitions of the semiconductor deposition process and the semiconductor etch back process.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A three-dimensional memory device, comprising:
a source-level material layer stack located over a substrate and comprising, from bottom to top, a lower source-level semiconductor layer, a semiconductor oxide tunneling layer, a source contact layer comprising a doped semiconductor material, and an upper source-level semiconductor layer;
an alternating stack of electrically conductive layers and insulating layers located over the source-level material layer stack; and
memory stack structures that extend through the alternating stack and into an upper portion of the lower source-level semiconductor layer,
wherein:
each memory stack structure includes a vertical semiconductor channel and a memory film laterally surrounding the vertical semiconductor channel;
each of the vertical semiconductor channels vertically extends through, and is electrically connected to, the source contact layer;
the source contact layer comprises a first source contact semiconductor layer and a second source contact semiconductor layer;
the second source contact semiconductor layer is laterally surrounded by the first source contact semiconductor layer, contacts a bottom surface of an upper portion of the first source contact semiconductor layer, and contacts a top surface of a lower portion of the first source contact semiconductor layer; and
the second source contact semiconductor layer is laterally spaced from each of the vertical semiconductor channels by the first source contact semiconductor layer.

2. The three-dimensional memory device of claim 1, wherein:

the first source contact semiconductor layer comprises regions having a variable thickness that decreases with a lateral distance from a most proximal one of the vertical semiconductor channels; and
the second source contact semiconductor layer comprises regions having a variable thickness that increases with the lateral distance from the most proximal one of the vertical semiconductor channels.

3. A three-dimensional memory device, comprising:
a source-level material layer stack located over a substrate and comprising, from bottom to top, a lower source-level semiconductor layer, a semiconductor oxide tunneling layer, a source contact layer comprising a doped semiconductor material, and an upper source-level semiconductor layer;
an alternating stack of electrically conductive layers and insulating layers located over the source-level material layer stack; and
memory stack structures that extend through the alternating stack and into an upper portion of the lower source-level semiconductor layer,
wherein:
each memory stack structure includes a vertical semiconductor channel and a memory film laterally surrounding the vertical semiconductor channel; and
each of the vertical semiconductor channels vertically extends through, and is electrically connected to, the source contact layer; and
further comprising memory material caps within the lower source-level semiconductor layer, wherein each of the memory material caps includes a planar cap portion underlying a bottommost surface of a respective one of the vertical semiconductor channels, and a cylindrical cap portion laterally surrounding a bottom portion of the respective one of the vertical semiconductor channels, and wherein the semiconductor oxide tunneling layer directly contacts each of the memory material caps.

4. The three-dimensional memory device of claim 3, wherein the semiconductor oxide tunneling layer directly contacts a sidewall of each of the memory material caps and is located below an upper periphery of the sidewall of each of the memory material caps.

5. The three-dimensional memory device of claim 3, wherein the source-level material layer stack further comprises an additional source-level semiconductor layer contacting a top surface of the semiconductor oxide tunneling layer and contacting a bottom surface of the source contact layer.

6. The three-dimensional memory device of claim 3, wherein the semiconductor oxide tunneling layer directly contacts an upper periphery of a sidewall of each of the memory material caps.

7. The three-dimensional memory device of claim 3, wherein the semiconductor oxide tunneling layer contacts a bottom surface of the source contact layer.

8. The three-dimensional memory device of claim 3, further comprising cylindrical semiconductor oxide tunneling layers laterally surrounding, and contacting, a respective one of the vertical semiconductor channels, and are laterally surrounded by, and are contacted by, the source contact layer.

9. The three-dimensional memory device of claim 8, further comprising an additional semiconductor oxide tunneling layer contacting a top surface of the source contact layer and a bottom surface of the upper source-level semiconductor layer.

10. The three-dimensional memory device of claim 3, wherein:
- each of the memory films comprises a charge storage layer and a tunneling dielectric; and
- each of the memory material caps comprises a dielectric material layer having a same composition and a same thickness as the charge storage layer and another dielectric material layer having a same composition and a same thickness as the tunneling dielectric.

* * * * *